US012660146B2

(12) United States Patent
Liaw

(10) Patent No.: US 12,660,146 B2
(45) Date of Patent: \*Jun. 16, 2026

(54) MEMORY DEVICE

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 231 days.

This patent is subject to a terminal disclaimer.

(21) Appl. No.: 18/448,581

(22) Filed: Aug. 11, 2023

(65) Prior Publication Data

US 2025/0056784 A1      Feb. 13, 2025

(51) Int. Cl.
*H10B 10/00* (2023.01)
*G11C 11/412* (2006.01)

(52) U.S. Cl.
CPC ............ *H10B 10/12* (2023.02); *G11C 11/412* (2013.01)

(58) Field of Classification Search
CPC ...... H10B 10/12; H10B 10/125; H10B 10/18; G11C 11/412; H10D 89/10
See application file for complete search history.

(56) References Cited

U.S. PATENT DOCUMENTS

| | | | |
|---|---|---|---|
| 8,693,235 B2 * | 4/2014 | Liaw | G11C 11/413 |
| | | | 365/72 |
| 9,209,247 B2 | 12/2015 | Colinge et al. | |
| 9,218,872 B1 * | 12/2015 | Liaw | G11C 11/419 |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |

(Continued)

OTHER PUBLICATIONS

U.S. Notice of Allowance for U.S. Appl. No. 18/228,970, dated May 19, 2025.

(Continued)

*Primary Examiner* — Amir Zarabian
*Assistant Examiner* — Justin Bryce Heisterkamp
(74) *Attorney, Agent, or Firm* — Birch, Stewart, Kolasch & Birch, LLP

(57) ABSTRACT

A memory device includes a first static random-access memory (SRAM) array having first SRAM cell groups arranged in an X-direction and a second SRAM array having second SRAM cell groups arranged in the X-direction. Each of the first SRAM cell groups includes two adjacent first SRAM cells arranged in the X-direction. Each of the first SRAM cells includes a first bit-line conductor and a first bit-line-bar conductor extending in a Y-direction. Each of the second SRAM cell groups includes two adjacent second SRAM cells arranged in the X-direction and sharing a second bit-line conductor and a second bit-line-bar conductor extending in the Y-direction. A first cell size of the first SRAM cells is larger than a second cell size of the second SRAM cells.

20 Claims, 28 Drawing Sheets

(56)                References Cited

U.S. PATENT DOCUMENTS

| 9,576,814 | B2 | 2/2017 | Wu et al. | |
| 9,608,116 | B2 | 3/2017 | Ching et al. | |
| 9,613,953 | B2 | 4/2017 | Liaw | |
| 9,640,540 | B1 * | 5/2017 | Liaw | G11C 11/419 |
| 9,793,273 | B2 | 10/2017 | Liaw | |
| 9,805,985 | B2 | 10/2017 | Liaw | |
| 10,170,480 | B2 | 1/2019 | Liaw | |
| 11,508,735 | B2 * | 11/2022 | Liaw | H10D 64/667 |
| 11,659,703 | B2 * | 5/2023 | Liaw | H10D 30/6729 |
| | | | | 257/351 |
| 12,082,389 | B2 * | 9/2024 | Liaw | H10D 84/853 |
| 12,089,391 | B2 | 9/2024 | Liaw | |
| 12,419,025 | B2 * | 9/2025 | Liaw | G11C 11/412 |
| 2014/0133218 | A1 | 5/2014 | Liaw | |
| 2014/0369119 | A1 * | 12/2014 | Tailliet | G11C 16/20 |
| | | | | 365/185.08 |
| 2020/0135740 | A1 * | 4/2020 | Liaw | H10D 30/43 |
| 2021/0066310 | A1 * | 3/2021 | Liaw | H10D 89/10 |
| 2021/0098466 | A1 | 4/2021 | Liaw | |
| 2021/0305262 | A1 * | 9/2021 | Wang | H10D 62/121 |
| 2022/0037339 | A1 * | 2/2022 | Lee | H10D 89/10 |
| 2022/0302129 | A1 * | 9/2022 | Lu | G11C 11/412 |
| 2022/0352179 | A1 * | 11/2022 | Yang | H10B 10/12 |
| 2023/0031649 | A1 * | 2/2023 | Peng | G11C 29/04 |
| 2023/0066387 | A1 | 3/2023 | Chen et al. | |
| 2023/0180451 | A1 | 6/2023 | Lin et al. | |
| 2023/0262951 | A1 | 8/2023 | Liaw | |
| 2024/0008238 | A1 | 1/2024 | Liaw | |
| 2024/0087646 | A1 | 3/2024 | Liaw | |
| 2024/0105257 | A1 | 3/2024 | Liaw | |
| 2024/0357790 | A1 | 10/2024 | Liaw | |
| 2024/0381609 | A1 | 11/2024 | Liaw | |
| 2025/0048610 | A1 * | 2/2025 | Liaw | H10B 10/12 |

OTHER PUBLICATIONS

U.S. Office Action for U.S. Appl. No. 18/228,970, dated Mar. 28, 2025.

* cited by examiner

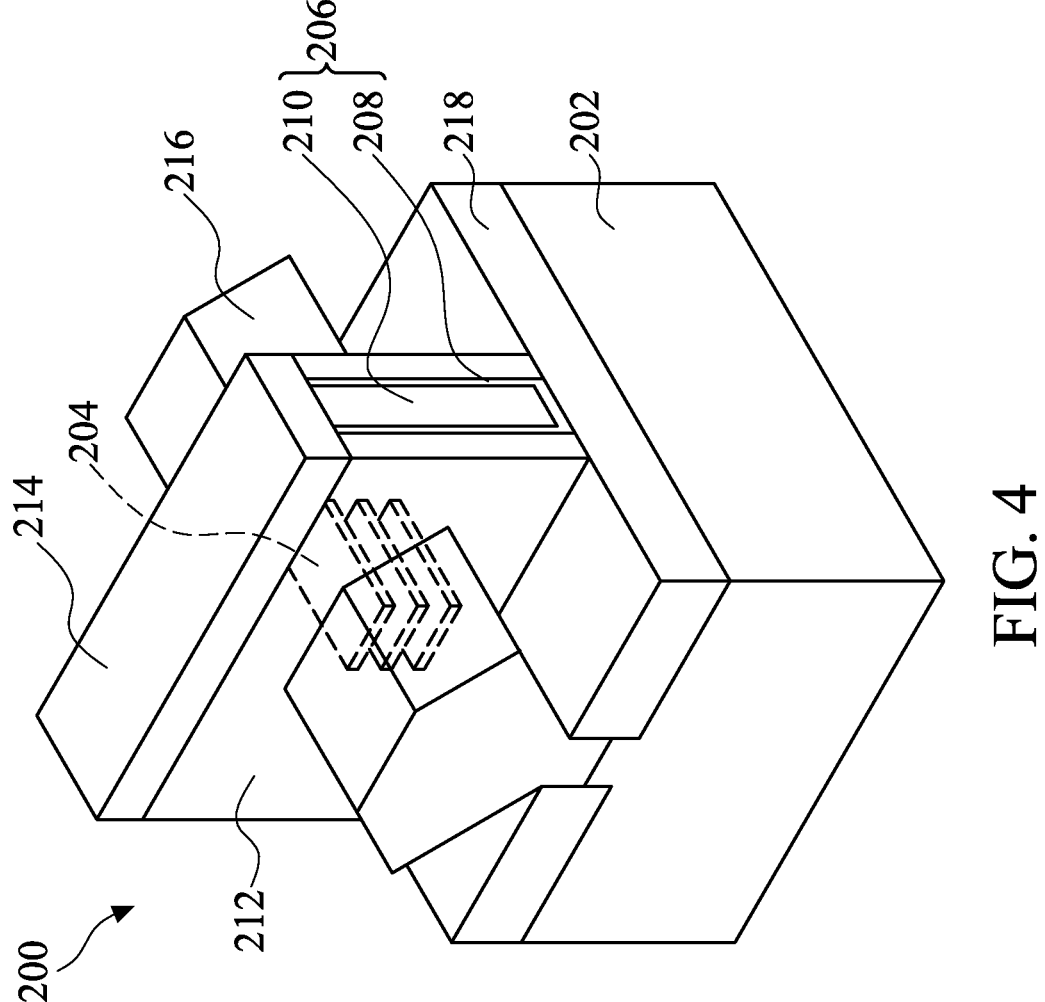
FIG. 4
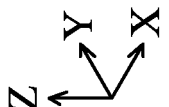

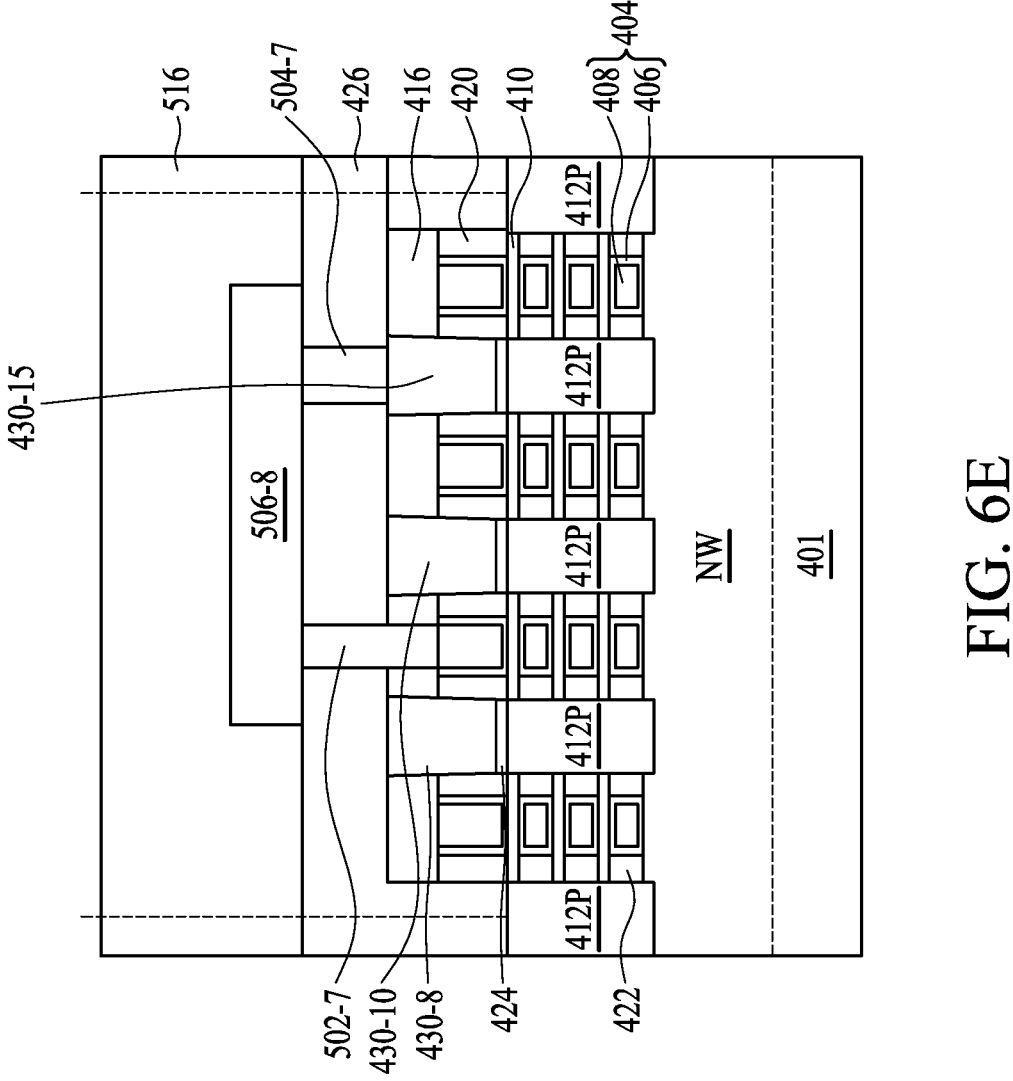
FIG. 6E
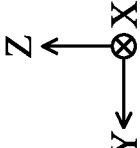

MEMORY DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, fin field-effect transistors (FinFETs) and gate-all-around (GAA) transistors have been incorporated into memory devices (including, for example, static random-access memory, or SRAM, cells) to reduce chip footprint while maintaining reasonable processing margins.

However, designing chips that include memory devices with static random access memory (SRAM) cell for multiple applications has become a popular storage unit of high speed communication, high-density storage, image processing and system-on-chip (SOC) products. Although existing memory devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a perspective view of a GAA transistor in an array of SRAM cells, in accordance with some embodiments of the present disclosure.

FIG. 6E is a cross-sectional view of the SRAM array along a line A-A' in FIG. 6A, in accordance with some embodiments of the present disclosure.

DETAILED DESCRIPTION

Figure 1:
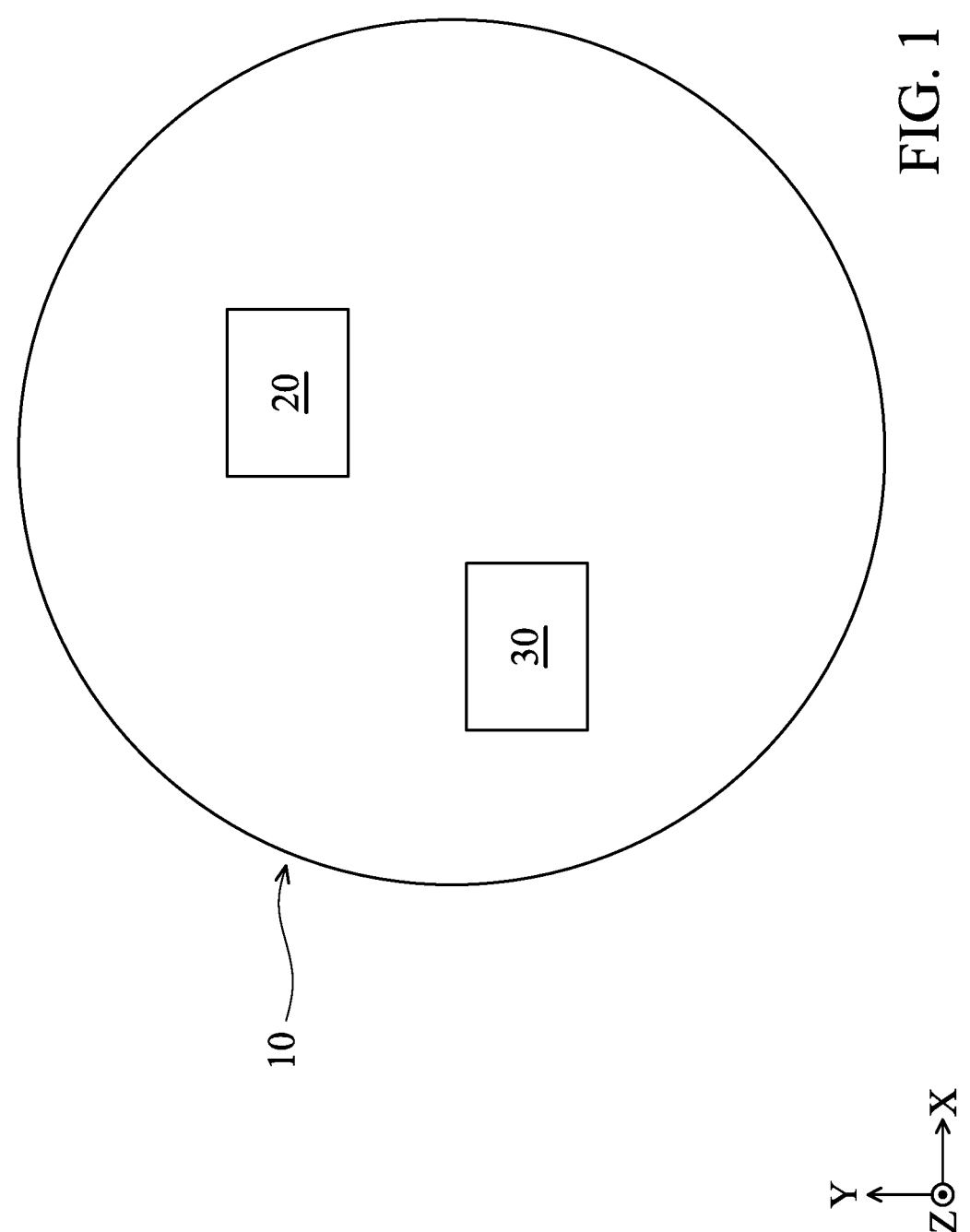
FIG. 1 is a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to memory devices, and more particularly to an array of static random-access memory (SRAM) cells having field-effect transistors (FETs), such as three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it should be understood that other embodiments may offer different advantages, not all advantages are necessarily discussed herein, and no particular advantage is required for all embodiments. For example, embodiments discussed herein include a memory device with SRAM arrays, in which the SRAM arrays have different size and interconnection design for different applications. The present disclosure also relates to layouts and structures thereof of memory devices. More particularly, the present disclosure relates to SRAM cell/array layout designs and structures. The present disclosure provides a compact SRAM cell design having a width of four poly pitches (the so-called four-poly-pitch SRAM cell). The details of the present disclosure are described below in conjunction with the accompanying drawings, which illustrate the layout and structure of circuit cells, according to some embodiments.

The various aspects of the present disclosure will now be described in more detail with reference to the figures. For avoidance of doubts, an X-direction, a Y-direction, and a Z-direction in the figures are perpendicular to one another and are used consistently. Throughout the present disclosure, like reference numerals denote like features unless otherwise noted.

FIG. 1 is a fragmentary diagrammatic top view of an integrated circuit (IC) chip 10, in portion or entirety, in accordance with some embodiments of the present disclosure. IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high-frequency transistors, another suitable component, or a combination thereof. The various microelectronic devices can be configured to provide IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. In some embodiments, IC chip 10 includes a memory region 20 and a logic region 30. Memory region 20 can include arrays of memory cells, each of which includes transistors and interconnection structures (also referred to as routing structures) that combine to provide a storage device and/or a storage function, such as a flip flop, a latch, another suitable memory device, or a combination thereof. In some embodiments, memory region 20 is configured with static random-access memory (SRAM) cells, dynamic random-access memory (DRAM) cells, non-volatile random-access memory (NVRAM) cells, flash memory cells, other suitable memory cells, or a combination thereof. Logic region 30 can include an array of standard cells, each of which includes transistors and interconnection structures that combine to provide a logic device and/or a logic function, such as an inverter, an AND gate, an NAND gate, an OR gate, an NOR gate, a NOT gate, an XOR gate, an XNOR gate, another suitable logic device, or a combination thereof. FIG. 1 has been simplified for the sake of clarity to better understand the inventive concepts of the present disclosure. Additional features can be added in IC chip 10, and some of the features described herein can be replaced, modified, or eliminated in other embodiments of IC chip 10.

Figure 2:
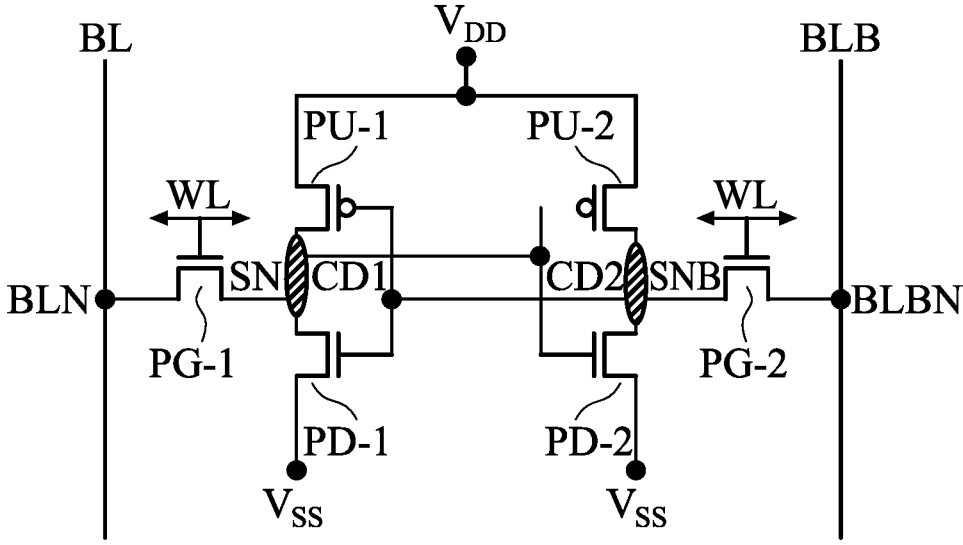
FIGS. 2 and 3 are circuit diagrams of an SRAM circuit that can be implemented in an SRAM cell of an array in the memory region of FIG. 1, in accordance with some alternative embodiments of the present disclosure.
Figure 3:
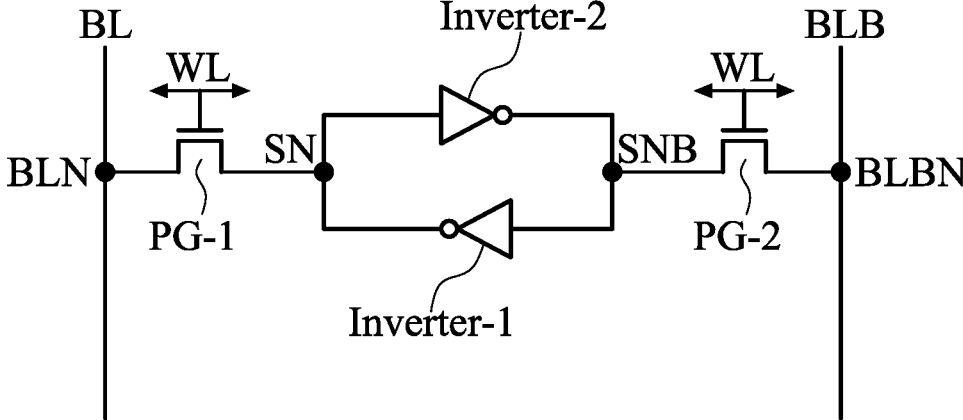

FIGS. 2 and 3 are circuit diagrams of an SRAM circuit that can be implemented in an SRAM cell (e.g., SRAM cells 102A to 102D in FIG. 6A and SRAM cells 102A' to 102D' in FIG. 7A) of an array in the memory region 20 of FIG. 1, in accordance with some alternative embodiments of the present disclosure. The circuit diagram of SRAM cell is merely exemplary, and in some embodiments, each of SRAM cells (e.g., SRAM cells 102A to 102D in FIG. 6A and SRAM cells 102A' to 102D' in FIG. 7A) in the array is configured with an SRAM circuit similar to the SRAM cell shown in FIG. 2 and FIG. 3. For example, each of SRAM cells has a storage portion that includes a cross-coupled pair of inverters (also referred to as a latch), such as an Inverter-1 and an Inverter-2. Inverter-1 includes pull-up transistor PU-1 and pull-down transistor PD-1, and Inverter-2 includes pull-up transistor PU-2 and pull-down transistor PD-2. Pass-gate transistor PG-1 is connected to an output of Inverter-1 and an input of Inverter-2, and pass-gate transistor PG-2 is connected to an output of Inverter-2 and an input of Inverter- 1. In operation, pass-gate transistor PG-1 and pass-gate transistor PG-2 provide access to the storage portion of their respective SRAM cell (i.e., Inverter-1 and Inverter-2) and can also be referred to as access transistors of their respective SRAM cell. Each of SRAM cells (e.g., the SRAM cells 102A to 102D in FIG. 6A and the SRAM cells 102A' to 102D' in FIG. 7A) is connected to and powered through a first power supply voltage, such as a positive power supply voltage, and a second power supply voltage, such as a ground voltage or a reference voltage (which can be an electrical ground). A gate of pull-up transistor PU-1 interposes a source, which is electrically coupled to the first power supply voltage via a voltage node (or voltage source) VDD, and a first common drain (CD1) (i.e., a drain of pull-up transistor PU-1 and a drain of pull-down transistor PD-1). A gate of pull-down transistor PD-1 interposes a source, which is electrically coupled to the second power supply voltage via a voltage node (or voltage source) VSS, and the first common drain. A gate of pull-up transistor PU-2 interposes a source, which is electrically coupled to the first power supply voltage via voltage node VDD, and a second common drain (CD-2) (i.e., a drain of pull-up transistor PU-2 and a drain of pull-down transistor PD-2). A gate of pull-down transistor PD-2 interposes a source, which is electrically coupled to the second power supply voltage via voltage node VSS, and the second common drain. The first common drain provides a storage node SN that stores data in true form, and the second common drain provides a storage node SNB that stores data in complementary form, or vice versa, in some embodiments. The gate of pull-up transistor PU1 and the gate of pull-down transistor PD-1 are coupled together and to the second common drain SD2, and the gate of pull-up transistor PU-2 and the gate of pull-down transistor PD-2 are coupled together and to the first common drain SD1. A gate of pass-gate transistor PG-1 interposes a drain connected to a bit-line node BLN, which is electrically coupled to a bit-line BL, and a source, which is electrically coupled to the first common drain SD1. A gate of pass-gate transistor PG-2 interposes a drain connected to a complementary bit-line node BLBN, which is electrically coupled to a complementary bit-line BLB (which may be referred to as a bit-line-bar BLB), and a source, which is electrically coupled to the second common drain SD2. Gates of pass-gate transistors PG-1, PG-2 are connected to and controlled by a word-line WL, which allows selection of a respective SRAM cell, such as the SRAM cell 100A, for reading and/or writing. In some embodiments, pass-gate transistors PG-1, PG-2 provide access to storage nodes SN, SNB, respectively, each of which can store a bit (e.g., a logical 0 or a logical 1), during read operations and/or write operations. For example, pass-gate transistors PG-1, PG-2 couple storage nodes SN, SNB, respectively, to bit-line BL and bit-line-bar BLB in response to voltage applied to gates of pass-gate transistors PG-1, PG-2 by word-line WL. In some embodiments, SRAM cells are single-port SRAMs. FIG. 2 and FIG. 3 have been simplified for the sake of clarity to better understand the inventive concepts of the present disclosure. Additional features can be added in the SRAM circuits of FIG. 2 and FIG. 3, and some of the features described herein can be replaced, modified, or eliminated in other embodiments of the SRAM circuits of FIG. 2 and FIG. 3.

Each of the SRAM cells discussed above is constructed by transistors. The transistors may be planar transistors, fin field-effect transistor (FinFET) transistors, gate-all-around (GAA) transistors, nano-wire transistors, nano-sheet transistors, or a combination thereof. For the sake of providing an example, an exemplary GAA transistor is illustrated in FIG. 4. However, it should be understood that the application should not be limited to a particular type of device, except as specifically claimed.

Referring to FIG. 4, a perspective view of an exemplary GAA transistor 200 is illustrated. The GAA transistor 200 is formed over a substrate 202. The substrate 202 may contains a semiconductor material, such as bulk silicon (Si). In some embodiments, after the resultant GAA transistor 200 is formed, the substrate 202 may be removed by a suitable process (e.g., a chemical mechanical polishing (CMP) process) for forming back-side interconnection.

The GAA transistor 200 also includes one or more nanostructures 204 (dash lines) extending in the Y-direction and stacked vertically (or arranged) in the Z-direction. More specifically, the nanostructures 204 are spaced from each other in the Z-direction. In some embodiments, the nanostructures 204 may also be referred to as channels, channel layers, nanosheets, or nanowires.

The GAA transistor 200 further includes a gate structure 206 including a gate dielectric layer 208 and a gate electrode 210. The gate dielectric layer 208 wraps around the nanostructures 204 and the gate electrode 210 wraps around the gate dielectric layer 208 (not shown in FIG. 4, may refer to FIGS. 6E to 6G and 7E to 7G). As shown in FIG. 4, gate spacers 212 are on sidewalls of the gate structure 206 and over the nanostructures 204 (not shown in FIG. 4, may refer to FIGS. 6E, 6F, 7E, and 7F), in accordance with some embodiments. A gate top dielectric layer 214 is over the gate dielectric layer 208, the gate electrode 210, and the nanostructures 204. The gate top dielectric layer 214 is used for contact etch protection layer.

The GAA transistor 200 further includes source/drain features 216. As shown in FIG. 4, two source/drain features 216 are on opposite sides of the gate structure 206, in accordance with some embodiments. The nanostructures 204 (dash lines) extends in the Y-direction to connect one source/drain feature 216 to the other source/drain feature 216. The source/drain features 216 may also be referred to as source/drain, or source/drain regions. In some embodiments, source/drain feature(s) may refer to a source or a drain, individually or collectively dependent upon the context.

Isolation feature 218 is over the substrate 202 and under the gate dielectric layer 208, the gate electrode 210, and the gate spacers 212. The isolation feature 218 is used for isolating the GAA transistor 200 from other devices. In some embodiments, the isolation feature 218 may include different structures, such as shallow trench isolation (STI) structure, deep trench isolation (DTI) structure. Therefore, the isolation feature 218 is also referred as to as a STI feature or DTI feature.

Figure 5:
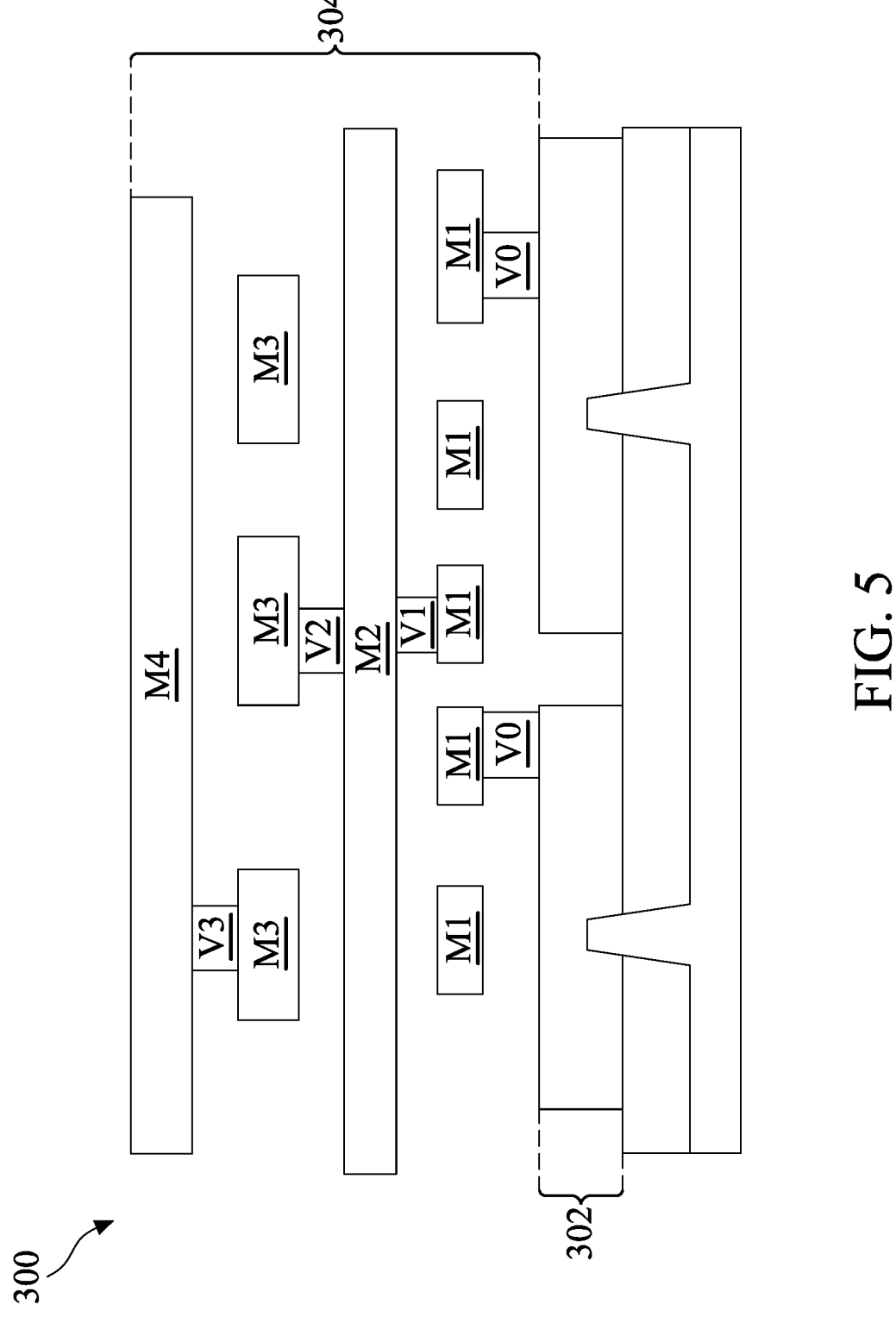
FIG. 5 is a cross-sectional view of a memory device for illustrating an interconnection structure, in accordance with some embodiments of the present disclosure.

FIG. 5 is a cross-sectional view of a memory device 300 for illustrating an interconnection structure, in accordance with some embodiments of the present disclosure. The memory device 300 has device region 302 (also referred to as a device layer) and an interconnection structure 304. The device region 302 is the region where the transistors and main features are located, such as gate, channel, source/drain, contact features, and the transistors (e.g., the SRAM cells 102A to 102D in FIG. 6A and the SRAM cells 102A' to 102D' in FIG. 7A) of the circuit cells discussed above. The interconnection structure 304 is over the device region 302 or at the front-side of the device region 302.

As shown in FIG. 5, the interconnection structure 304 includes metal layer M1, metal layer M2 over the metal layer M1, metal layer M3 over the metal layer M2, and metal layer M4 over the metal layer M3. Each of the metal layers M1, M2, M3, and M4 includes metal conductors The interconnection structure 304 further includes vias V0, V1, V2, and V3 for connecting the metal conductor in the underlying metal layer to the metal conductor in the overlying metal layer. The vias and metal conductors electrically couple various transistors and/or components (for example, gate, source/drain features, resistors, capacitors, and/or inductors) in the device region 302, such that the various devices and/or components can operate as specified by the design requirements of circuit cells (e.g., logic cells and memory cells). It should be noted that there may be more vias and metal conductors for connections. In some embodiments, the vias V1 are connected to the gate structures (gate electrodes) of the transistors. Therefore, the vias V1 connected to the gate structures are also referred to as the gate vias. In some embodiments, the vias and metal conductors are used for the connections of the features of the transistor. In other embodiments, the vias and metal conductors are connected to voltage sources (the supply voltage VDD or the reference voltage VSS discussed above) to provide voltage to the transistors in the device region 302. Therefore, the metal conductors connected to the voltage sources may be also referred to as the voltage metal conductors, the voltage lines, or voltage conductors.

For the operation speed of the SRAM cell, in the present disclosure, the metal conductors for interconnection need to have lower resistance. Therefore, the word-line conductors, bit-line conductors, and the bit-line-bar conductors are designed to be located in different metal layer for having larger width, thereby decreasing resistance. Therefore, in some embodiments, the metal conductors serving as VDD lines are designed to be located in the metal layer M1; the metal conductors serving as word-lines are designed to be located in the metal layer M2; and the metal conductors serving as VSS lines, bit-lines, and bit-line-bars are designed to be located in the metal layer M3.

FIGS. 6A to 6D are top views (or layouts) of four SRAM cells 100A, 100B, 100C, and 100D in adjacent two groups G1 and G2 in a portion of an SRAM array 3000 for high-speed applications that can be one embodiment of SRAM cells implemented in the memory region 20, in accordance with some embodiments of the present disclosure.

Figure 6A:
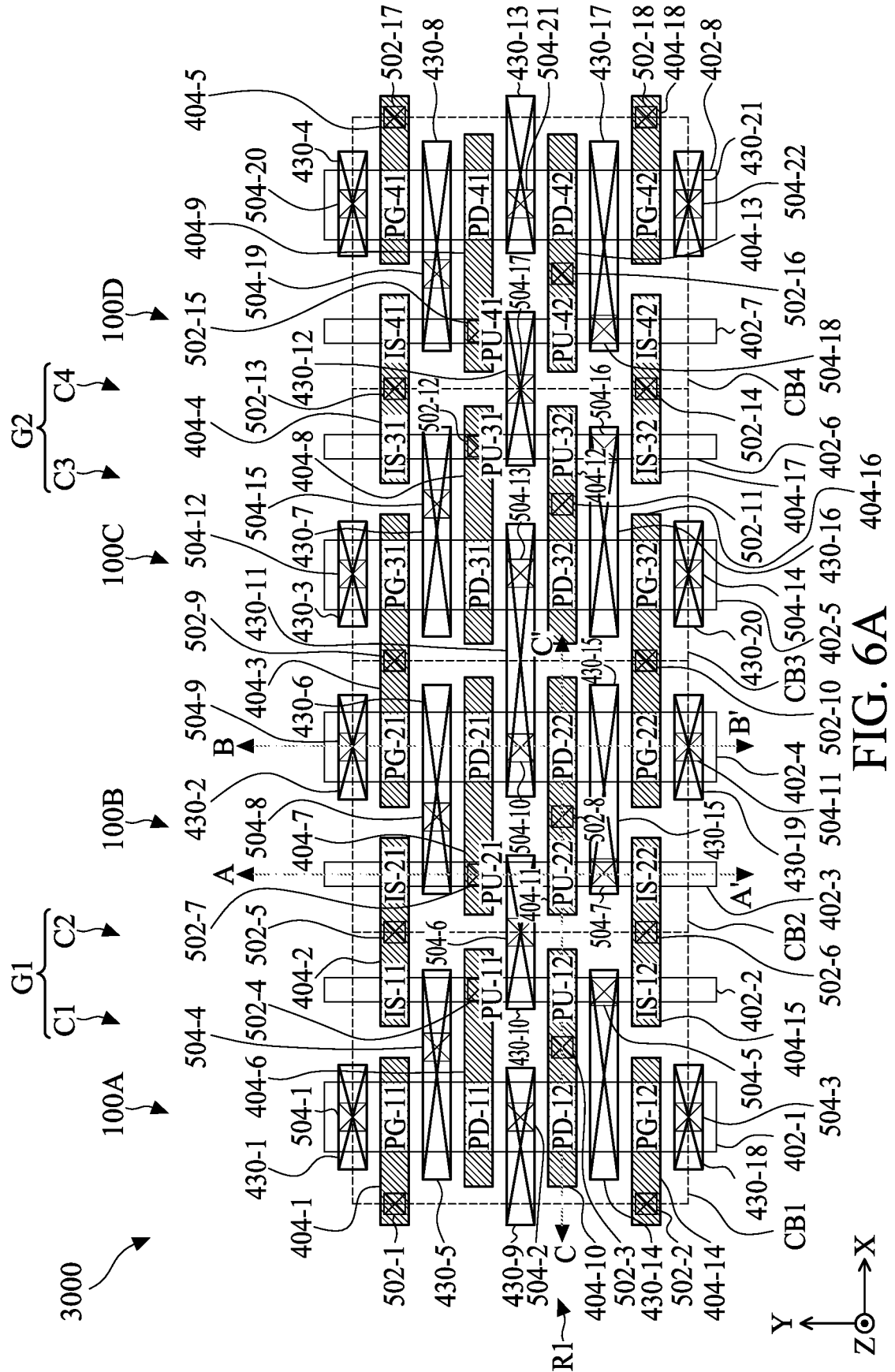
FIGS. 6A, 6B, 6C, and 6D are top views (or layouts) of four SRAM cells in two adjacent groups in a portion of an SRAM array for high-speed applications that can be one embodiment implemented in the memory region, in accordance with some embodiments of the present disclosure.
Figure 6B:
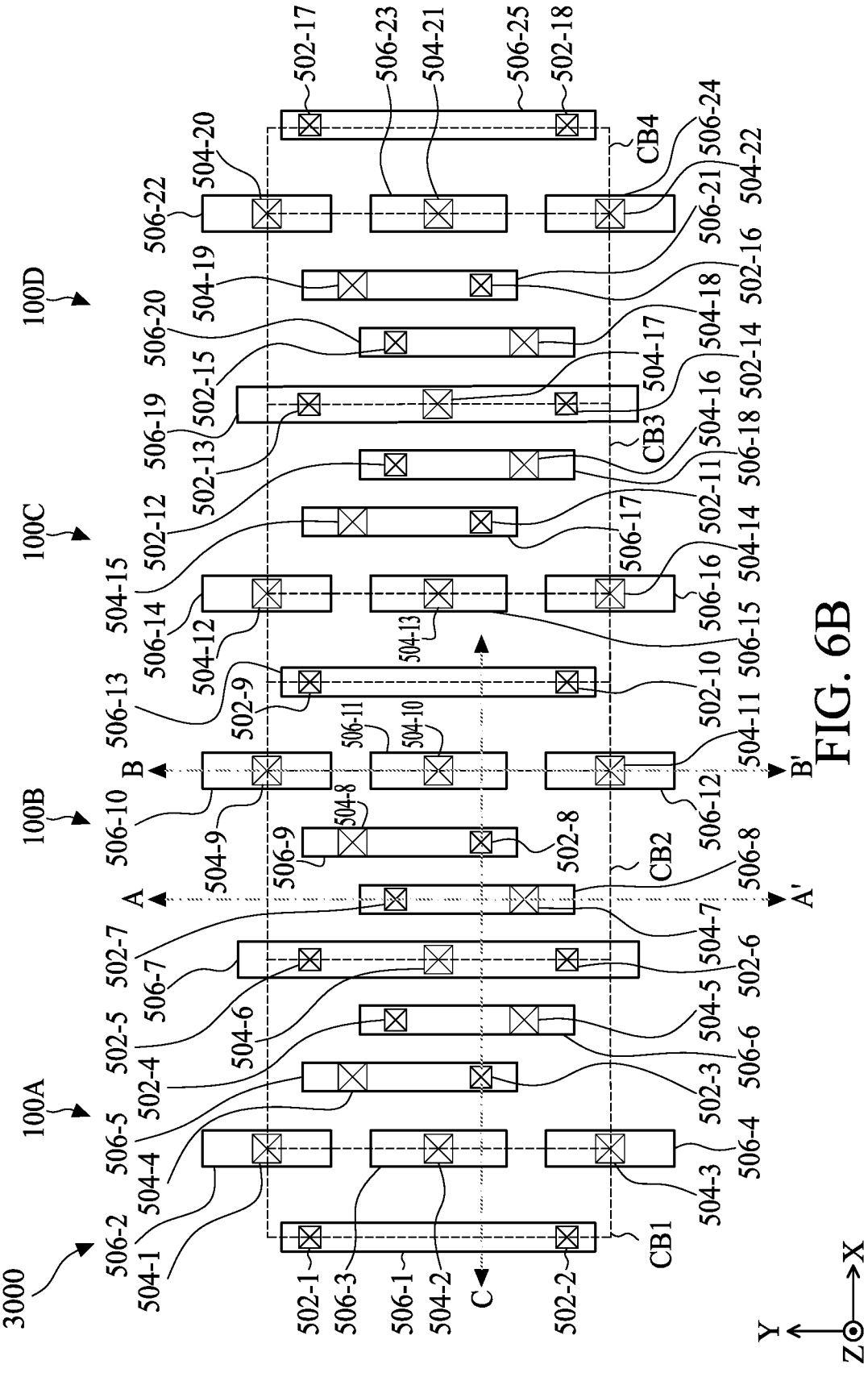
Figure 6C:
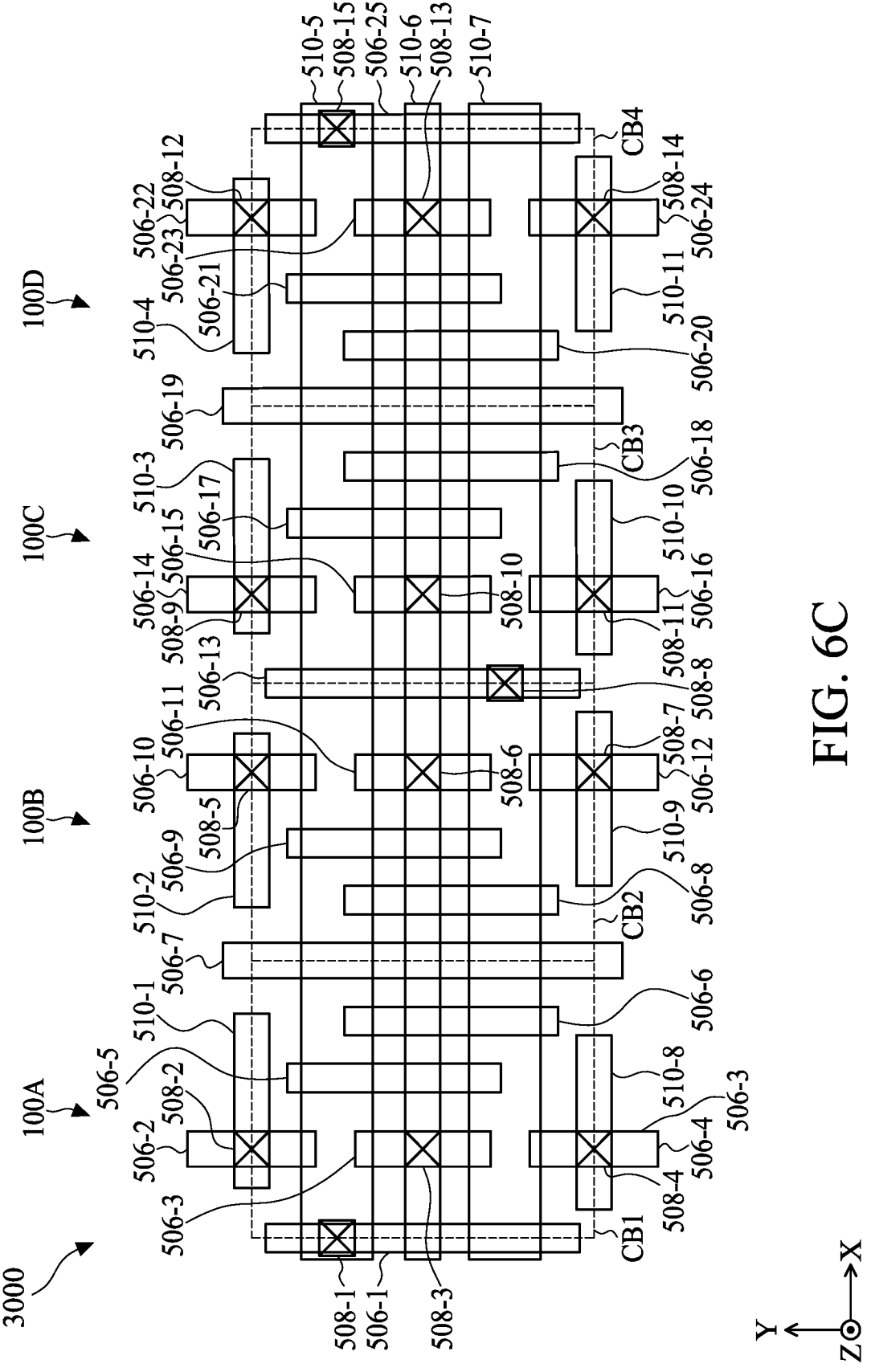
Figure 6D:
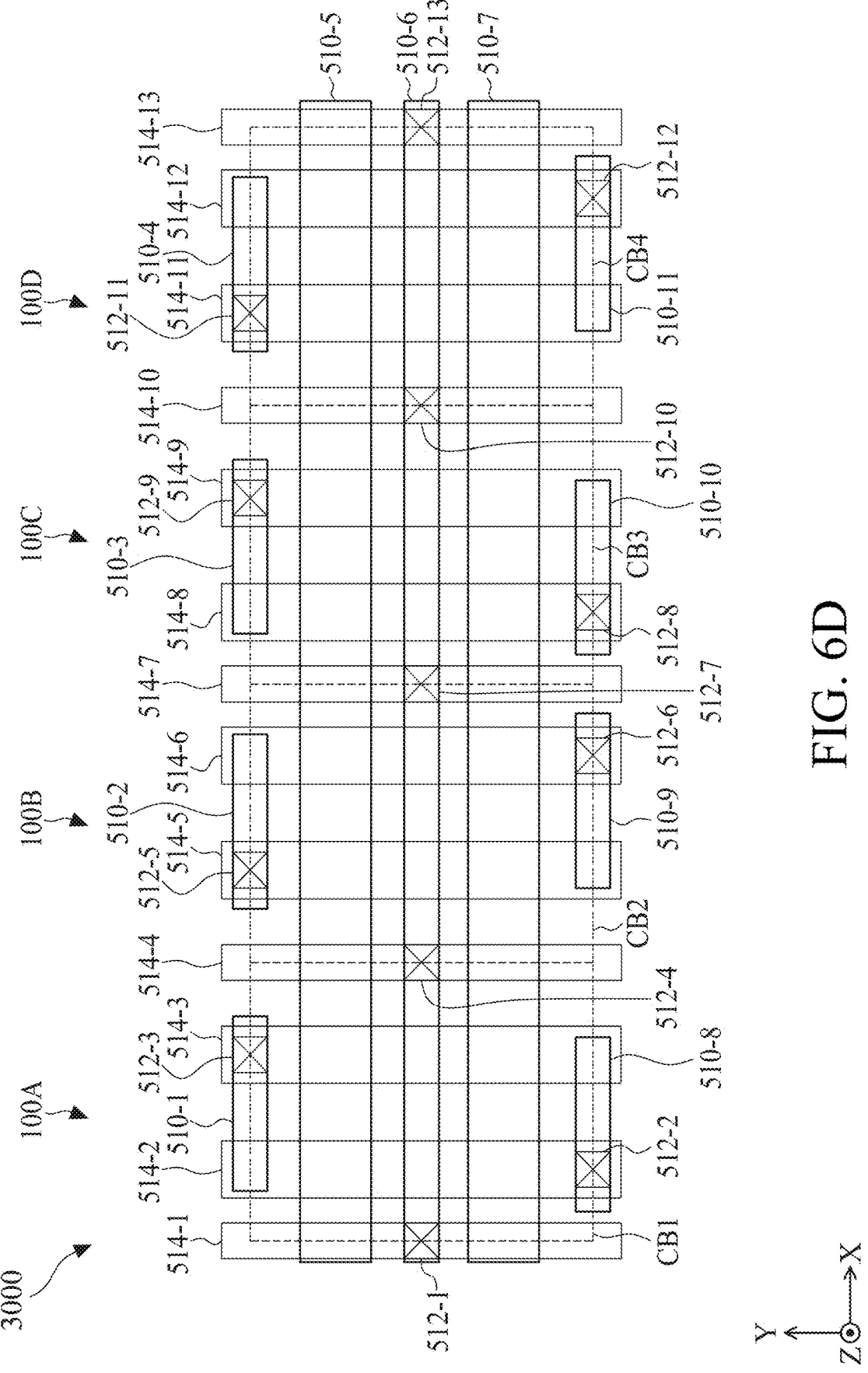

FIG. 6A illustrates the features in the device region (including transistors) and vias vertically between the features and the first metal layer (M1). FIG. 6B illustrates the metal conductors in the first metal layer (M1) and vias vertically between the features and the first metal layer (M1). FIG. 6C illustrates the metal conductors in the first metal layer (M1) and the second metal layer (M2), and vias vertically between the first metal layer (M1) and the second metal layer (M2). FIG. 6D illustrates the metal conductors in the second metal layer (M2) and the third metal layer (M3), and vias vertically between the second metal layer (M2) and the third metal layer (M3).

Figure 6F:
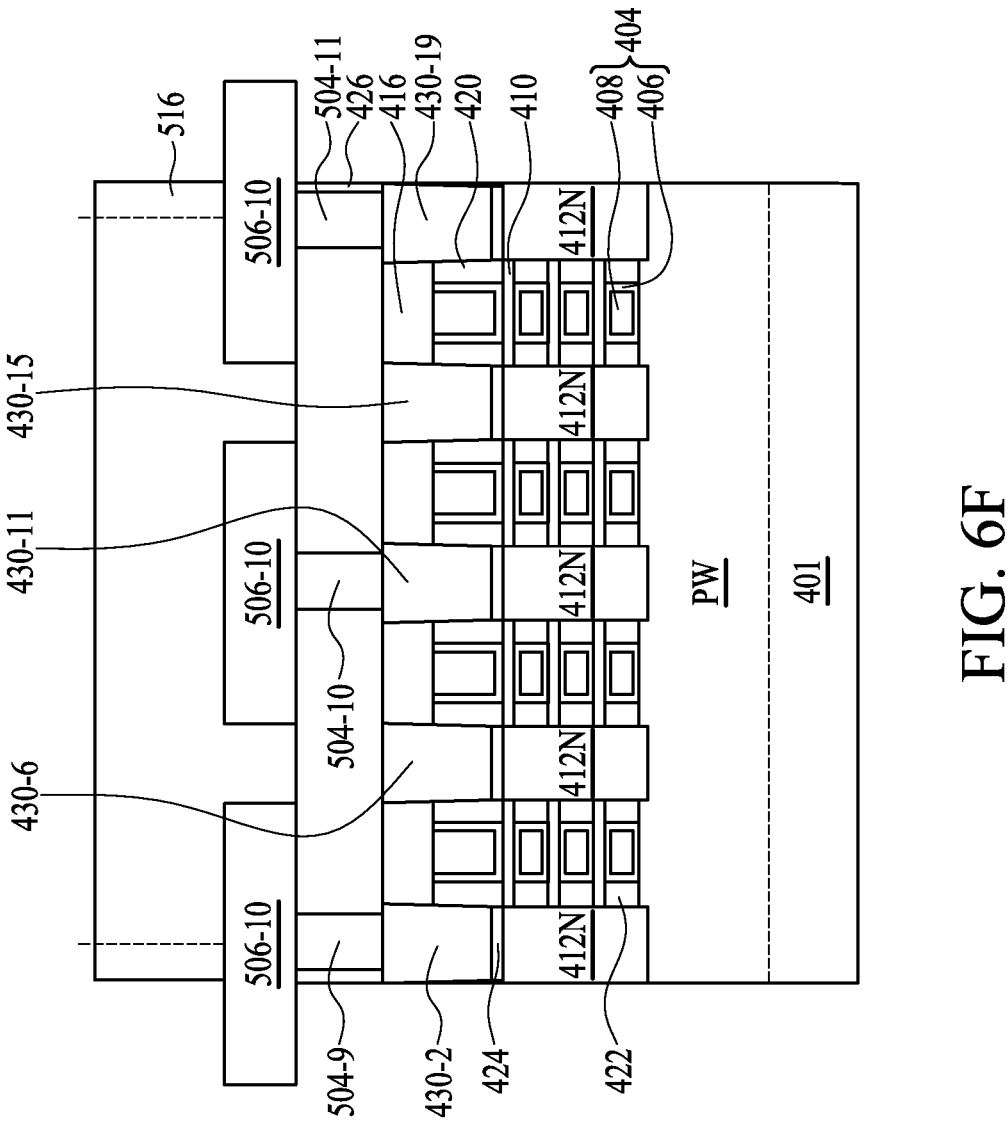
FIG. 6F is a cross-sectional view of the SRAM array along a line B-B' in FIG. 6A, in accordance with some embodiments of the present disclosure.
Figure 6G:
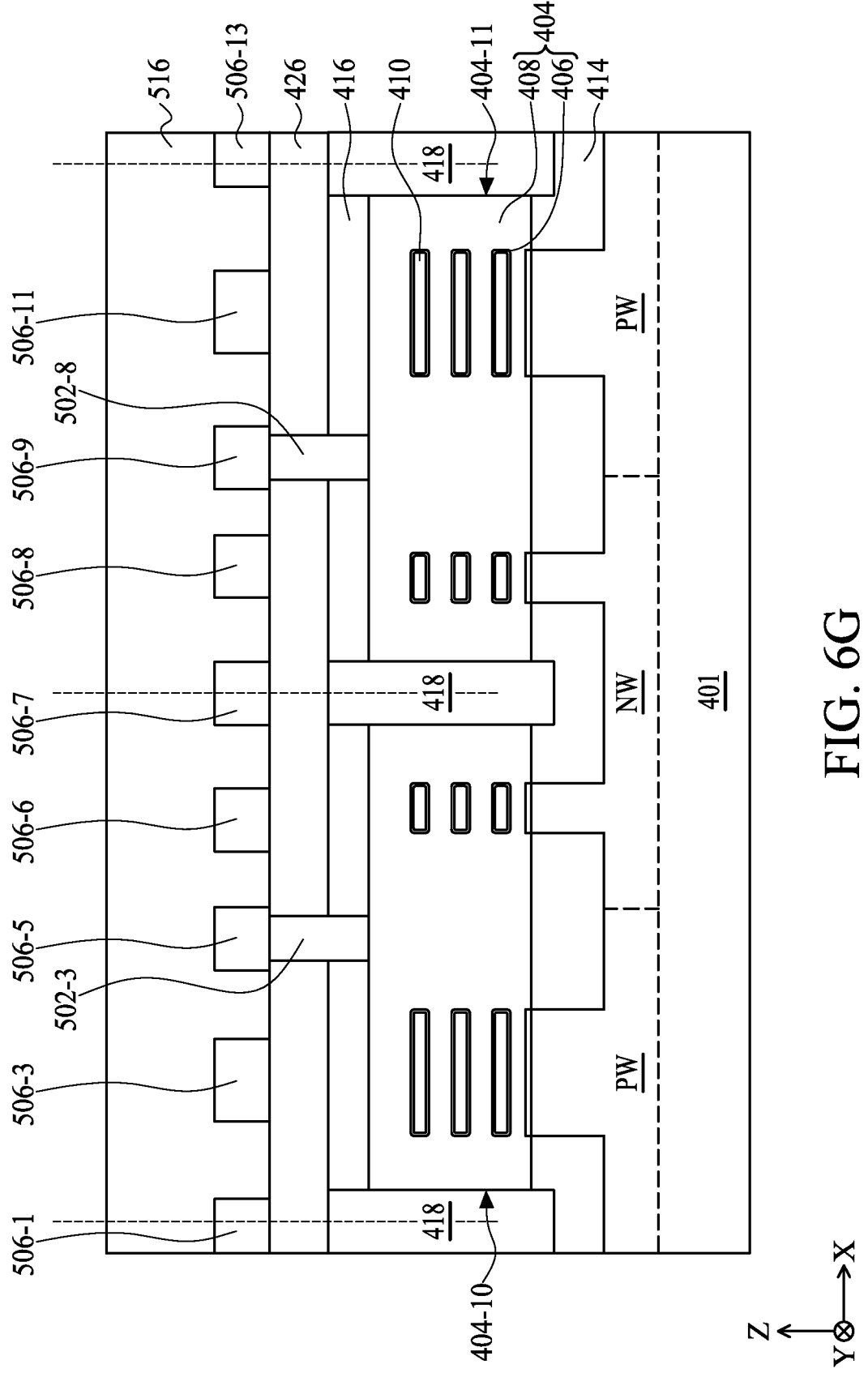
FIG. 6G is a cross-sectional view of the SRAM array along a line C-C' in FIG. 6A, in accordance with some embodiments of the present disclosure.

FIG. 6E is a cross sectional view of the SRAM array 3000 along a line A-A' in FIG. 6A, in accordance with some embodiments of the present disclosure. FIG. 6F is a cross sectional view of the SRAM array 3000 along a line B-B' in FIG. 6A, in accordance with some embodiments of the present disclosure. FIG. 6G is a cross sectional view of the SRAM array 3000 along a line C-C' in FIG. 6A, in accordance with some embodiments of the present disclosure.

FIGS. 7A to 7D are top views (or layouts) of four SRAM cells 100A', 100B', 100C', and 100D' in adjacent two groups G1' and G2' in a portion of an SRAM array 3000' for high density usage that can be one embodiment of SRAM cells implemented in the memory region 20, in accordance with some embodiments of the present disclosure.

Figure 7A:
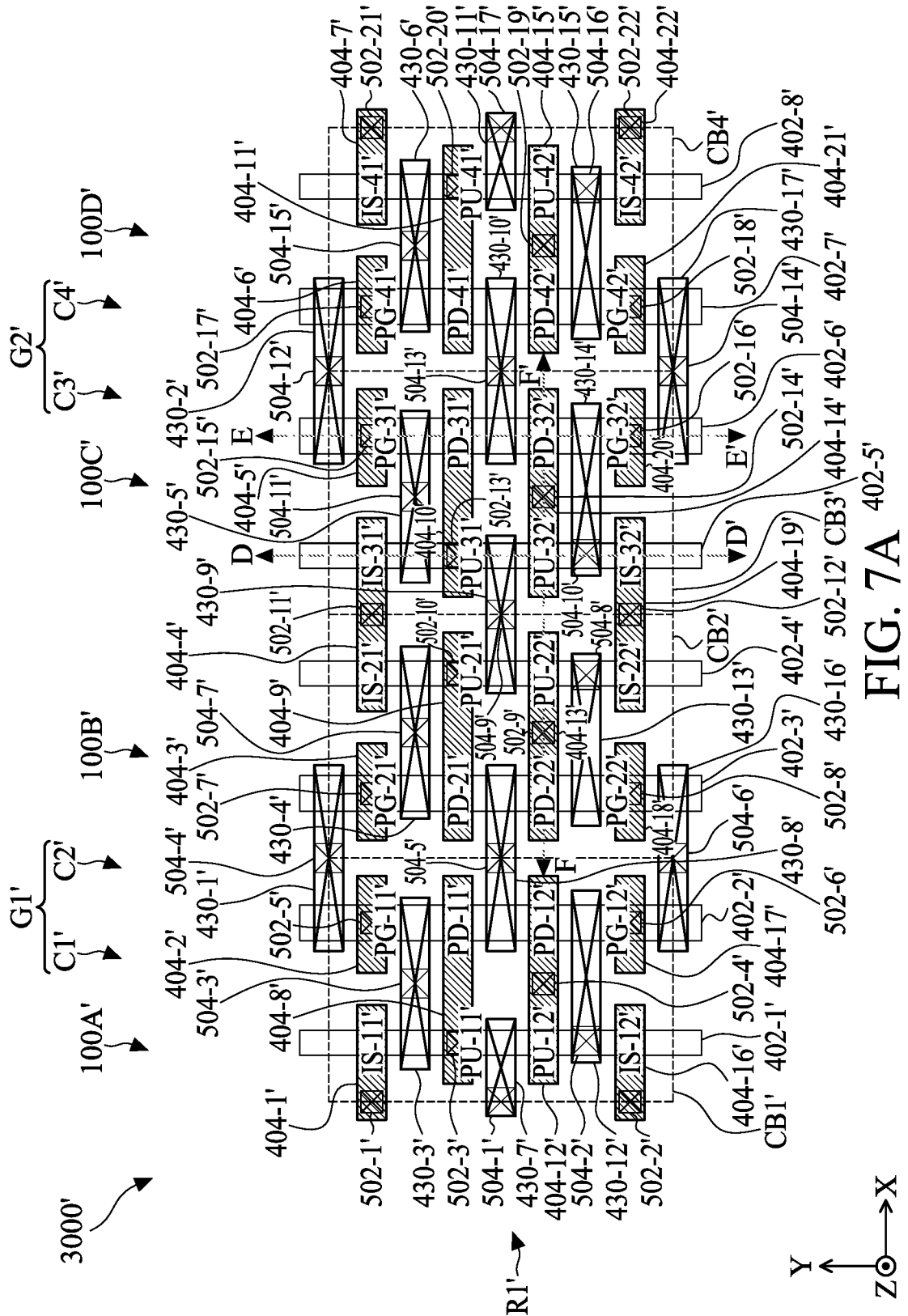
FIGS. 7A, 7B, 7C, and 7D are top views (or layouts) of four SRAM cells in two adjacent groups in a portion of an SRAM array for high density usage that can be one embodiment implemented in the memory region, in accordance with some embodiments of the present disclosure.
Figure 7B:
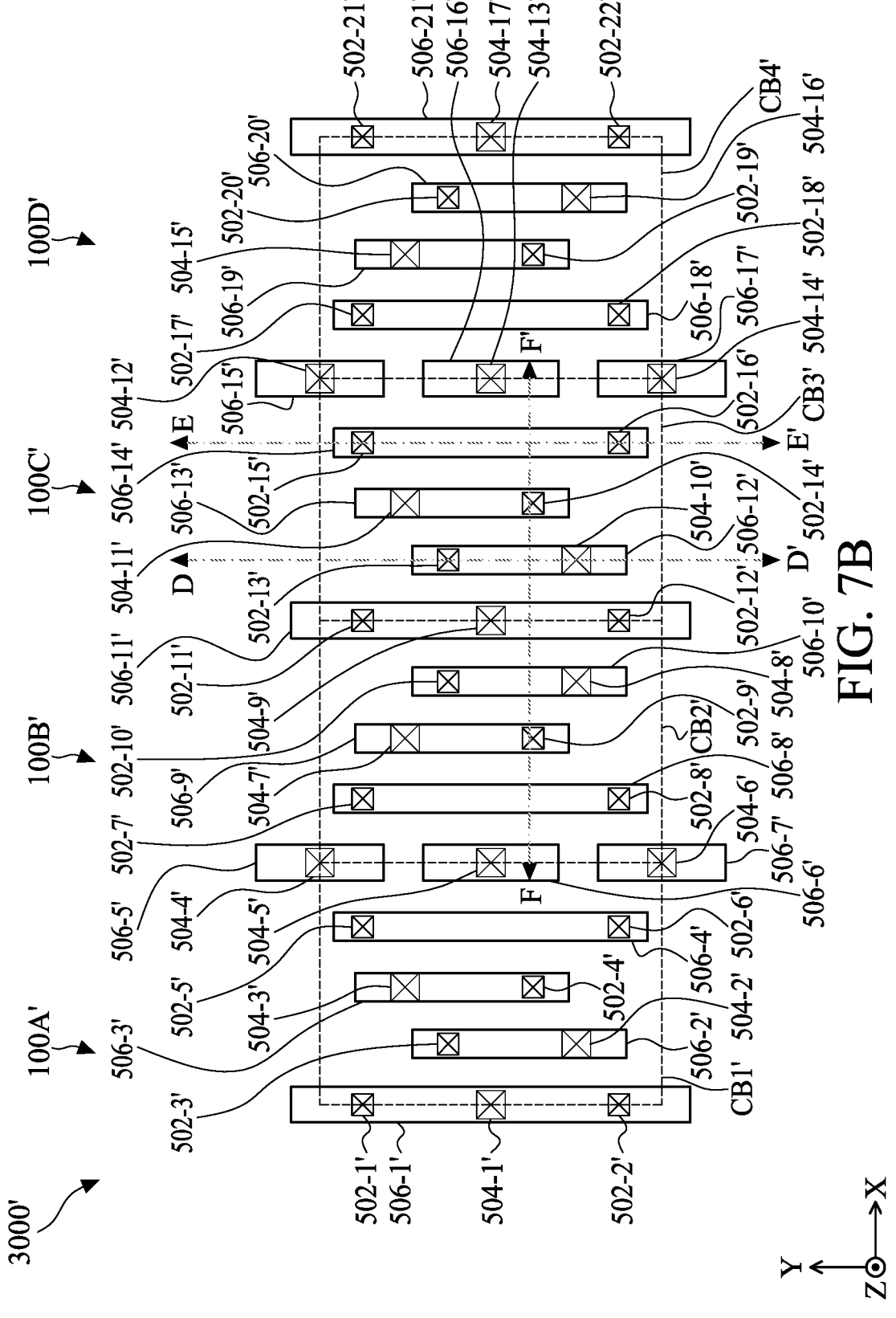
Figure 7C:
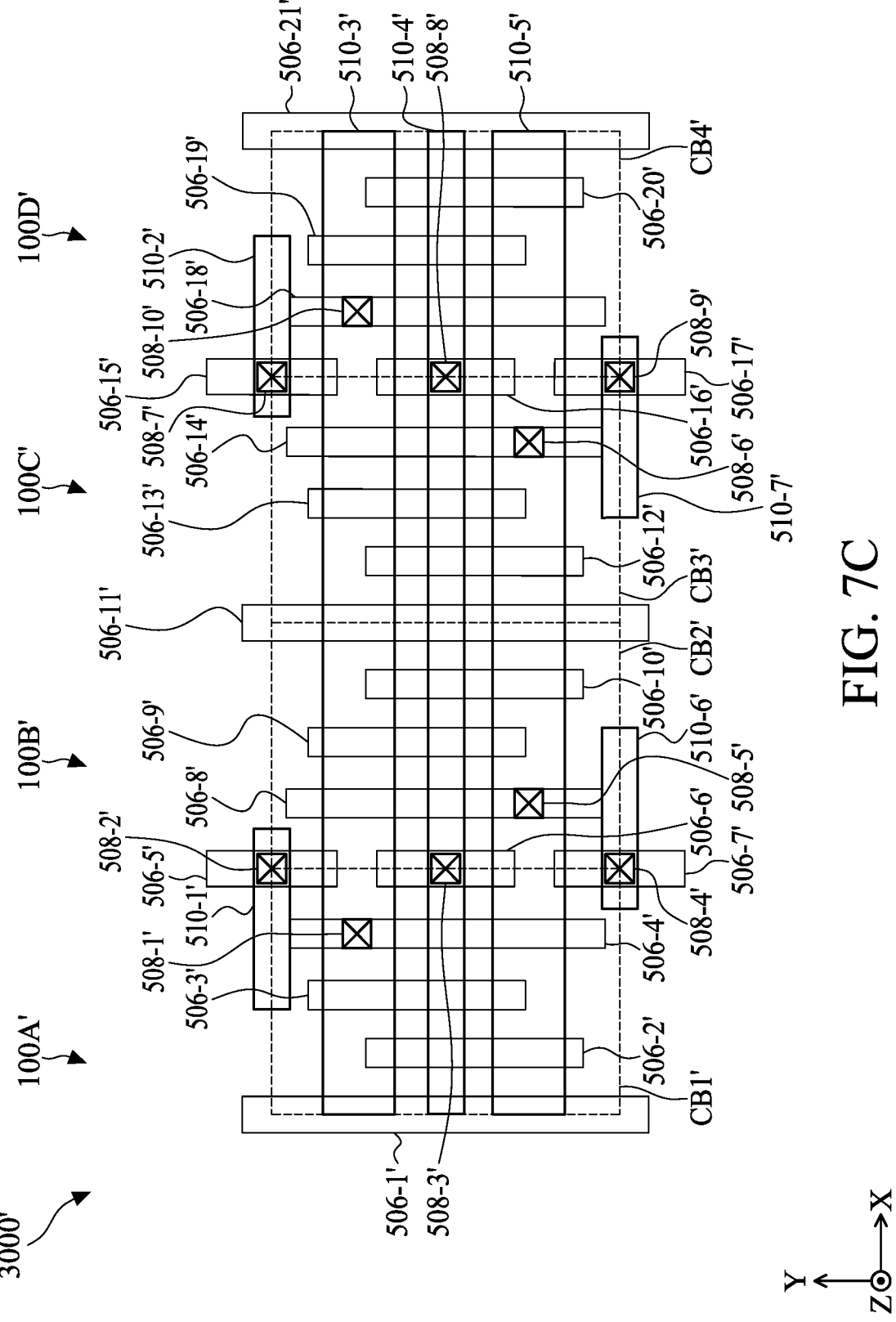
Figure 7D:
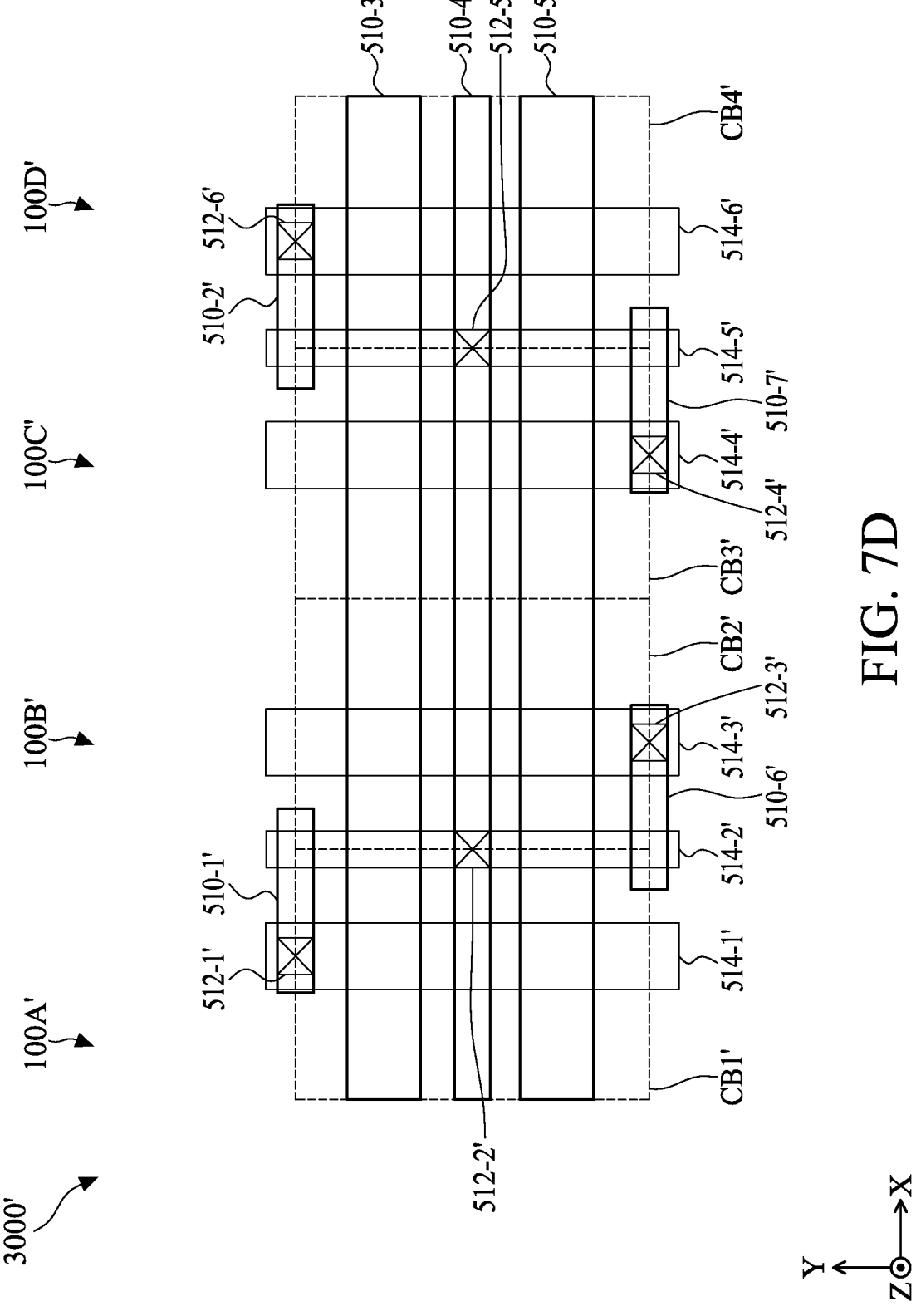

FIG. 7A illustrates the features in the device region (including transistors) and vias vertically between the features and the first metal layer (M1). FIG. 7B illustrates the metal conductors in the first metal layer (M1) and vias vertically between the features and the first metal layer (M1). FIG. 7C illustrates the metal conductors in the first metal layer (M1) and the second metal layer (M2), and vias vertically between the first metal layer (M1) and the second metal layer (M2). FIG. 7D illustrates the metal conductors in the second metal layer (M2) and the third metal layer (M3), and vias vertically between the second metal layer (M2) and the third metal layer (M3). For the sake of simplicity, FIGS. 6E to 6G and 7E to 7G show the features in the device region, the metal conductors in the first metal layer (M1), and vias vertically between the features and the first metal layer (M1), while the vias and the metal conductors in higher metal layers (higher than the first metal layer (M1)) are omitted.

Figure 7E:
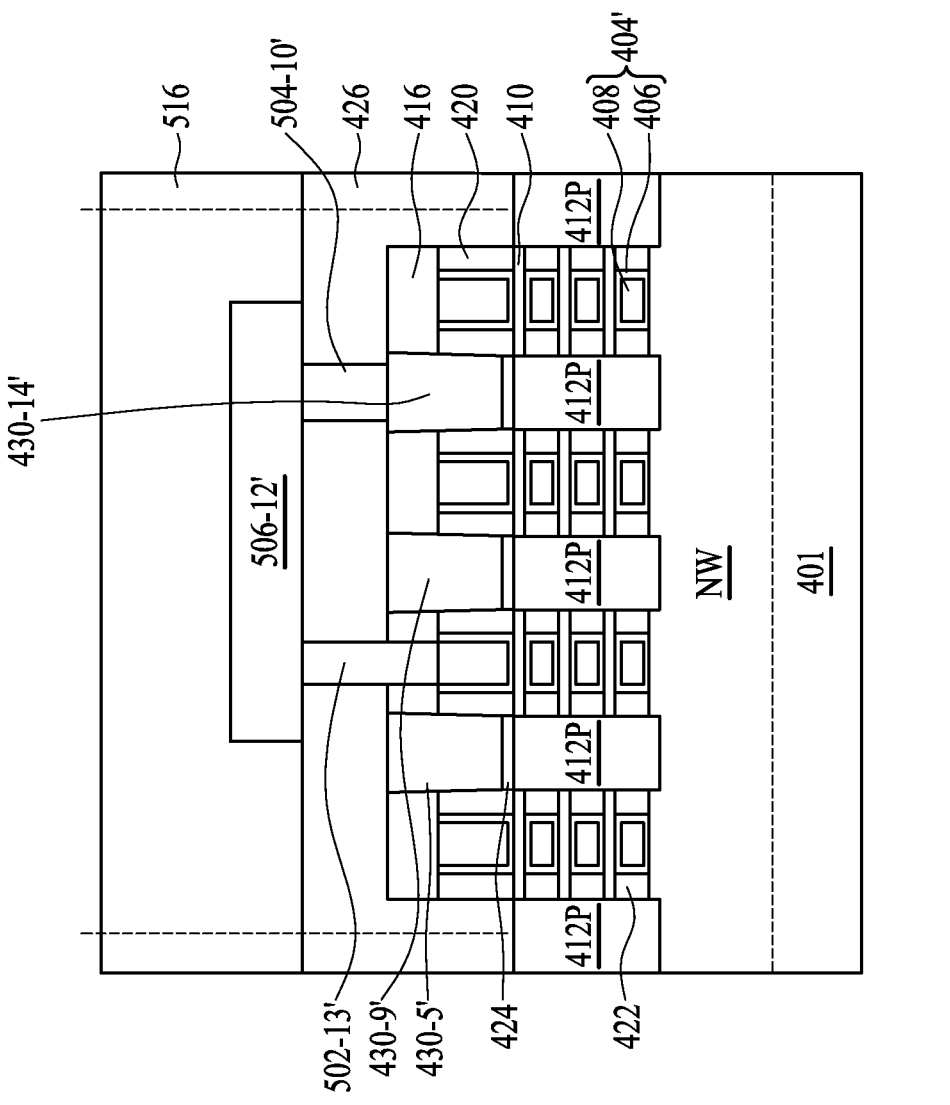
FIG. 7E is a cross-sectional view of the SRAM array along a line D-D' in FIG. 7A, in accordance with some embodiments of the present disclosure.
Figure 7F:
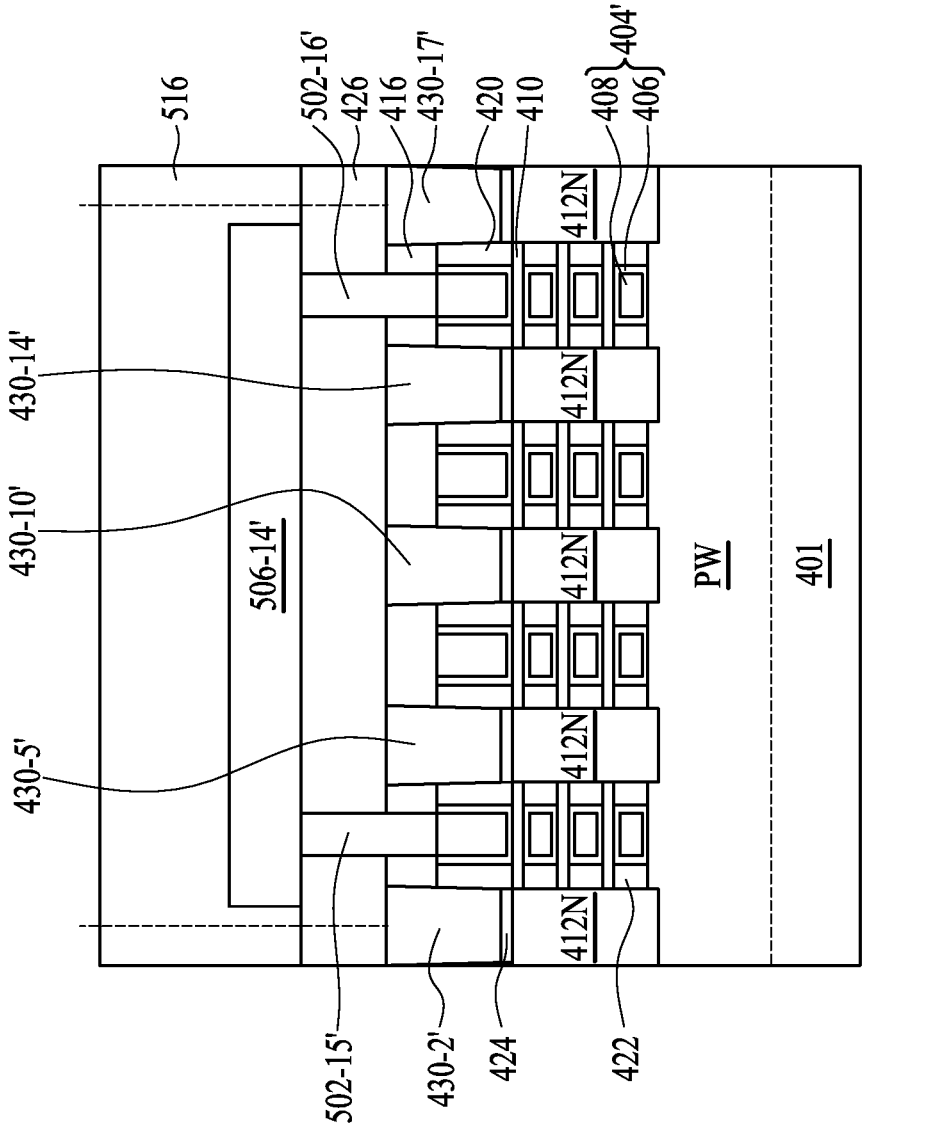
FIG. 7F is a cross-sectional view of the SRAM array along a line E-E' in FIG. 7A, in accordance with some embodiments of the present disclosure.
Figure 7G:
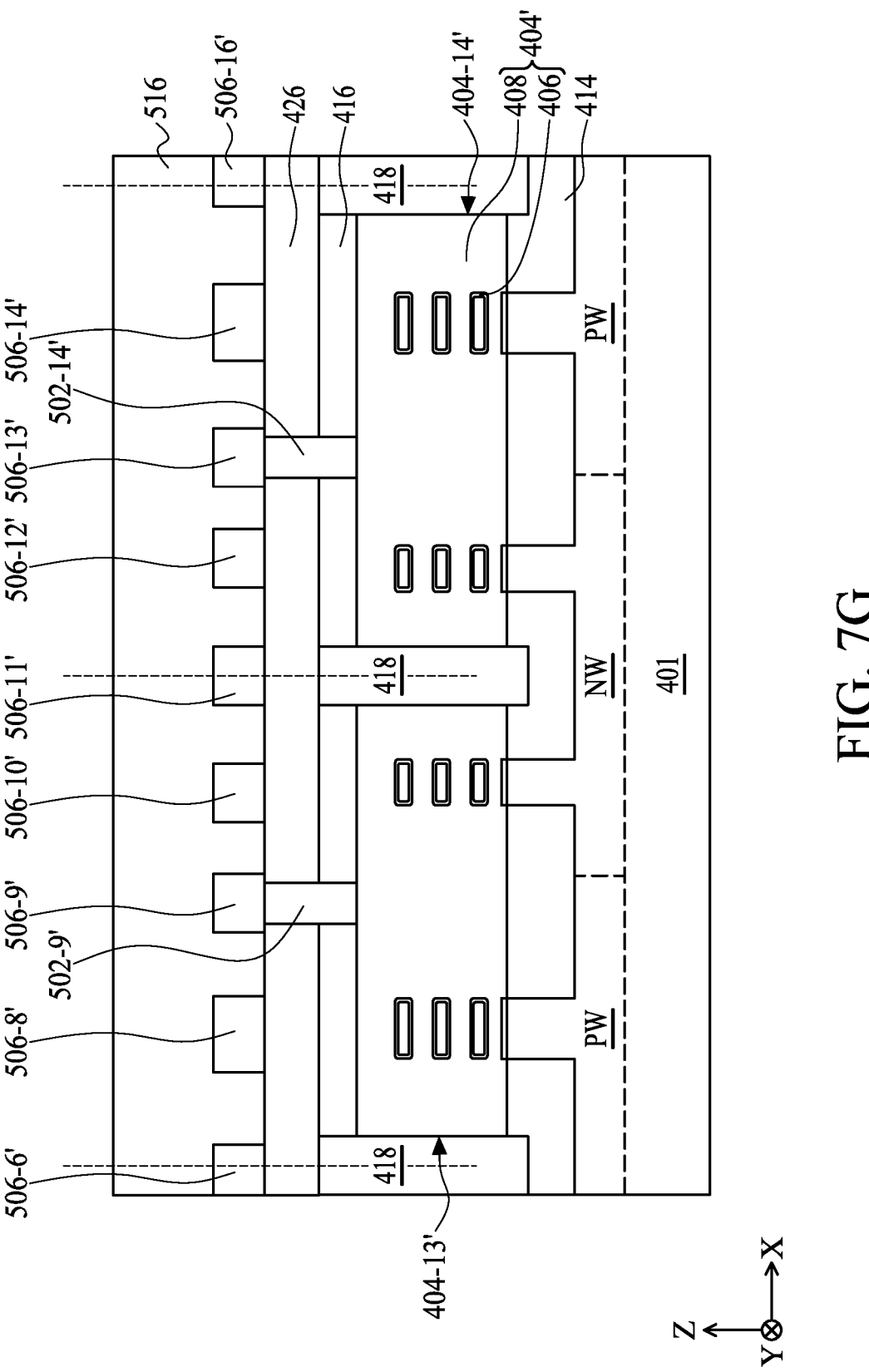
FIG. 7G is a cross-sectional view of the SRAM array along a line F-F' in FIG. 7A, in accordance with some embodiments of the present disclosure.

FIG. 7E is a cross sectional view of the SRAM array 3000' along a line D-D' in FIG. 7A, in accordance with some embodiments of the present disclosure. FIG. 7F is a cross sectional view of the SRAM array 3000' along a line E-E' in FIG. 7A, in accordance with some embodiments of the present disclosure. FIG. 7G is a cross sectional view of the SRAM array 3000' along a line F-F' in FIG. 7A, in accordance with some embodiments of the present disclosure.

As shown in FIG. 6A to 6D, the SRAM array 3000 has two SRAM cell groups G1 and G2 arranged in the X-direction. The SRAM cell group G1 includes two adjacent columns C1 and C2 of the SRAM array 3000 and the SRAM cell group G2 includes two adjacent columns C3 and C4 of the SRAM array 3000. The SRAM array 3000 further includes a row R1 having the SRAM cells 100A to 100D arranged in the X-direction. More specifically, the four SRAM cells 100A to 100D are respectively in the four columns C1 to C4, and are together in the row R1. Therefore, the SRAM cell group G1 includes two adjacent SRAM cells 100A and 100B arranged in the X-direction; and the SRAM cell group G2 includes two adjacent SRAM cells 100C and 100D arranged in the X-direction.

Similarly, as shown in FIG. 7A to 7D, the SRAM array 3000' has two SRAM cell groups G1' and G2' arranged in the X-direction. The SRAM cell group G1' includes two adjacent columns C1' and C2' of the SRAM array 3000' and the SRAM cell group G2' includes two adjacent columns C3' and C4' of the SRAM array 3000'. The SRAM array 3000' further includes a row R1' having the SRAM cells 100A' to 100D' arranged in the X-direction. More specifically, the four SRAM cells 100A' to 100D' are respectively in the four columns C1' to C4', and are together in the row R1'. Therefore, the SRAM cell group G1' includes two adjacent SRAM cells 100A' and 100B' arranged in the X-direction; and the SRAM cell group G2' includes two adjacent SRAM cells 100C' and 100D' arranged in the X-direction.

In some embodiments, the SRAM cells 100A to 100D and 100A' to 100D' each respectively has cell boundaries CB1 to CB4 and CB1' to CB4', as shown in FIGS. 6A and 7A. The cell boundaries CB1 to CB4 and CB1' to CB4' each has a rectangular shape (indicated by the dotted rectangular box) in the top view. Therefore, in some embodiments, the cell boundaries CB1 to CB4 and CB1' to CB4' may be referred to as rectangular cell boundaries.

The cell boundaries CB1 to CB4 and CB1' to CB4' also respectively define the cell sizes of the SRAM cells 100A to 100D and 100A' to 100D'. Due to the SRAM array 3000 is used for high-speed applications and the SRAM array 3000' is used for high density usage, each of the cell sizes of the SRAM cells 100A to 100D is designed to be larger than each of the cell sizes of the SRAM cells 100A' to 100D'. Further, a dimension of the cell boundaries CB1 to CB4 in the Y-direction (i.e., a cell pitch of the SRAM cells 100A to 100D in the Y-direction) the same as a dimension of the cell boundaries CB1' to CB4' in the Y-direction (i.e., a cell pitch of the SRAM cells 100A' to 100D' in the Y-direction). As shown in FIGS. 6A and 7A, a dimension of the cell boundaries CB1 to CB4 in the X-direction (i.e., a cell pitch of the SRAM cells 100A to 100D in the X-direction) is greater than a dimension of the cell boundaries CB1' to CB4' in the X-direction (i.e., a cell pitch of the SRAM cells 100A' to 100D' in the X-direction), in accordance with some embodiments.

In some embodiments, a ratio of the dimension of the cell boundaries CB1 to CB4 in the X-direction to the dimension of the cell boundaries CB1' to CB4' in the X-direction is in a range from about 1.05 to about 1.4. In some embodiments, a ratio of the dimension of the cell boundaries CB1 to CB4 in the Y-direction to the dimension of the cell boundaries CB1 to CB4 in the X-direction is in a range from about 0.45 to about 1. In some embodiments, a ratio of the dimension of the cell boundaries CB1' to CB4' in the Y-direction to the dimension of the cell boundaries CB1' to CB4' in the X-direction is in a range from about 0.4 to about 0.9.

The SRAM arrays 3000 and 3000' include active areas that extend lengthwise in the Y-direction and are arranged in the X-direction. More specifically, as shown in FIGS. 6A and 7A, the SRAM array 3000 includes active areas 402-1 to 402-8 (which may be collectively referred to as the active areas 402) and the SRAM array 3000' includes active areas 402-1' to 402-8' (which may be collectively referred to as the active areas 402'), in accordance with some embodiments.

As shown in FIG. 6A, the active areas 402-1 and 402-2 are used for the SRAM cell 100A; the active areas 402-3 and 402-4 are used for the SRAM cell 100B; the active areas 402-5 and 402-6 are used for the SRAM cell 100C; and the active areas 402-7 and 402-8 are used for the SRAM cell 100D, in accordance with some embodiments. Similarly, as shown in FIG. 7A, the active areas 402-1' and 402-2' are used for the SRAM cell 100A'; the active areas 402-3' and 402-4' are used for the SRAM cell 100B'; the active areas 402-5' and 402-6' are used for the SRAM cell 100C'; and the active areas 402-7' and 402-8' are used for the SRAM cell 100D', in accordance with some embodiments.

As shown in FIGS. 6A and 7A, each of the SRAM cells 100A to 100D and 100A' to 100D' includes two pass-gate transistors, two pull-down transistors, and two pull-up transistors. Further, each of the SRAM cells 100A to 100D and 100A' to 100D' includes two isolation transistors serving as isolation structure. In some embodiments, the two pass-gate transistors and the two pull-down transistors are arranged in the Y-direction and share the same active area, and the two pull-up transistors and the two isolation transistors are arranged in the Y-direction and share the same active area. For example, the SRAM cell 100A includes pass-gate transistors PG-11 and PG-12 and pull-down transistors PD-11 and PD-12 arranged in the Y-direction and sharing the same active area 402-1, and pull-up transistors PU-11 and PU-12 and isolation transistors IS-11 and IS-12 arranged in the Y-direction and sharing the same active area 402-2.

Furthermore, each of active areas 402 and 402' includes channel regions, source regions, and drain regions (where source regions and drain regions are collectively referred to as source/drain regions herein) of transistors. For example, in the SRAM cell 100A, the active area 402-1 includes channel regions, source regions, and drain regions of the pass-gate transistors PG-11 and PG-12 and the pull-down transistors PD-11 and PD-12, and the active area 402-2 includes channel regions, source regions, and drain regions of the pull-up transistors PU-11 and PU-12 and the isolation transistors IS-11 and IS-12.

As shown in FIGS. 6A, a width of the active areas 402-1, 402-4, 402-5, and 402-8 in the X-direction is larger than a width of the active areas 402-2, 402-3, 402-6, and 402-7 in the X-direction, in accordance with some embodiments. In some embodiments, a ratio of the width of the active areas 402-1, 402-4, 402-5, and 402-8 in the X-direction to the width of the active areas 402-2, 402-3, 402-6, and 402-7 in the X-direction is in a range from about 1.3 to about 5.

As shown in FIGS. 7A, a width of the active areas 402-2', 402-3', 402-6', and 402-7' in the X-direction is substantially the same as than a width of the active areas 402-1', 402-4', 402-5', and 402-8' in the X-direction, in accordance with some embodiments. In some embodiments, a ratio of the width of the active areas 402-2', 402-3', 402-6', and 402-7' in the X-direction to the width of the active areas 402-1', 402-4', 402-5', and 402-8' in the X-direction is in a range from about 1 to about 3.

Furthermore, a ratio of the width of the active areas 402-1, 402-4, 402-5, and 402-8 in the X-direction to the width of the active areas 402-2', 402-3', 402-6', and 402-7' is in a range from about 1.3 to about 4, in accordance with some embodiments. The width of the active areas 402-2, 402-3, 402-6, and 402-7 in the X-direction is substantially the same as the width of the active areas 402-1', 402-4', 402-5', and 402-8' in the X-direction. In some embodiments, a ratio of the width of the active areas 402-2, 402-3, 402-6, and 402-7 in the X-direction to the width of the active areas 402-1', 402-4', 402-5', and 402-8' in the X-direction is in a range from about 1.05 to about 1.3.

The SRAM arrays 3000 and 3000' further includes gate structures, such as gate structures 404-1 to 404-18 (which may be collectively referred to as the gate structures 404) in SRAM array 3000 and gate structures 404-1' to 404-22' (which may be collectively referred to as the gate structures 404') in SRAM array 3000' that extend lengthwise in the X-direction. The X-direction and the Y-direction are perpendicular. The gate structures 404 and 404' are disposed over the channel regions of the respective active areas 402-1 to 402-8 and 402-1' to 402-8' (i.e., (vertically stacked) nanostructures 410) and disposed between respective source/drain regions of the active areas 402-1 to 402-8 and 402-1' to 402-8' (i.e., source/drain features 412N and 412P). In some embodiments, the gate structures 404 and 404' wrap and/or surround suspended, vertically stacked nanostructures 410 in the channel regions of the active areas 402 and 402', respectively (as shown in FIGS. 6E to 6G and 7E to 7G).

The gate structures engage the active areas to form the transistors of the three-port SRAM cell discussed above. In the SRAM cell 100A, the gate structure 404-1 extends across the active area 402-1 in the top view and engages the active area 402-1 to form the pass-gate transistor PG-11; the gate structure 404-6 extends across the active areas 402-1 and 402-2 in the top view and engages the active area 402-1 and 402-2 to respectively form the pull-down transistor PD-11 and the pull-up transistor PU-11; the gate structure 404-10 extends across the active areas 402-1 and 402-2 in the top view and engages the active areas 402-1 and 402-2 to respectively form pull-down transistor PD-12 and the pull-up transistor PU-12; the gate structure 404-14 extends across the active area 402-1 in the top view and engages the active area 402-1 to form the pass-gate transistor PG-12; the gate structure 404-2 extends across the active area 402-2 in the top view and engages the active area 402-2 to form the isolation transistor IS-11; and the gate structure 404-15 extends across the active area 402-2 in the top view and engages the active area 402-2 to form the isolation transistor IS-12.

In the SRAM cell 100B, the gate structure 404-3 extends across the active area 402-4 in the top view and engages the active area 402-4 to form the pass-gate transistor PG-21; the gate structure 404-7 extends across the active areas 402-4 and 402-3 in the top view and engages the active area 402-4 and 402-3 to respectively form the pull-down transistor PD-21 and the pull-up transistor PU-21; the gate structure 404-11 extends across the active areas 402-4 and 402-3 in the top view and engages the active areas 402-4 and 402-3 to respectively form pull-down transistor PD-22 and the pull-up transistor PU-22; the gate structure 404-16 extends across the active area 402-4 in the top view and engages the active area 402-4 to form the pass-gate transistor PG-22; the gate structure 404-2 extends across the active area 402-3 in the top view and engages the active area 402-3 to form the isolation transistor IS-21; and the gate structure 404-15 extends across the active area 402-3 in the top view and engages the active area 402-3 to form the isolation transistor IS-22.

In the SRAM cell 100C, the gate structure 404-3 extends across the active area 402-5 in the top view and engages the active area 402-5 to form the pass-gate transistor PG-31; the gate structure 404-8 extends across the active areas 402-5 and 402-6 in the top view and engages the active area 402-5 and 402-6 to respectively form the pull-down transistor PD-31 and the pull-up transistor PU-31; the gate structure 404-12 extends across the active areas 402-5 and 402-6 in the top view and engages the active areas 402-5 and 402-6 to respectively form pull-down transistor PD-32 and the pull-up transistor PU-32; the gate structure 404-16 extends across the active area 402-5 in the top view and engages the active area 402-5 to form the pass-gate transistor PG-32; the gate structure 404-4 extends across the active area 402-6 in the top view and engages the active area 402-6 to form the isolation transistor IS-31; and the gate structure 404-17 extends across the active area 402-6 in the top view and engages the active area 402-6 to form the isolation transistor IS-32.

In the SRAM cell 100D, the gate structure 404-5 extends across the active area 402-8 in the top view and engages the active area 402-8 to form the pass-gate transistor PG-41; the gate structure 404-9 extends across the active areas 402-8 and 402-7 in the top view and engages the active area 402-8 and 402-7 to respectively form the pull-down transistor PD-41 and the pull-up transistor PU-41; the gate structure 404-13 extends across the active areas 402-8 and 402-7 in the top view and engages the active areas 402-8 and 402-7 to respectively form pull-down transistor PD-42 and the pull-up transistor PU-42; the gate structure 404-18 extends across the active area 402-8 in the top view and engages the active area 402-8 to form the pass-gate transistor PG-42; the gate structure 404-4 extends across the active area 402-7 in the top view and engages the active area 402-7 to form the isolation transistor IS-41; and the gate structure 404-17 extends across the active area 402-7 in the top view and engages the active area 402-7 to form the isolation transistor IS-42.

In the SRAM cell 100A', the gate structure 404-2' extends across the active area 402-2' in the top view and engages the active area 402-2' to form the pass-gate transistor PG-11'; the gate structure 404-8' extends across the active areas 402-2' and 402-1' in the top view and engages the active area 402-2' and 402-1' to respectively form the pull-down transistor PD-11' and the pull-up transistor PU-11'; the gate structure 404-12' extends across the active areas 402-2' and 402-1' in the top view and engages the active areas 402-2' and 402-1' to respectively form pull-down transistor PD-12' and the pull-up transistor PU-12'; the gate structure 404-17' extends across the active area 402-2' in the top view and engages the active area 402-2' to form the pass-gate transistor PG-12'; the gate structure 404-1' extends across the active area 402-1' in the top view and engages the active area 402-1' to form the isolation transistor IS-11'; and the gate structure 404-16' extends across the active area 402-1' in the top view and engages the active area 402-1' to form the isolation transistor IS-12'.

In the SRAM cell 100B', the gate structure 404-3' extends across the active area 402-3' in the top view and engages the active area 402-3' to form the pass-gate transistor PG-21'; the gate structure 404-9' extends across the active areas 402-3' and 402-4' in the top view and engages the active area 402-3' and 402-4' to respectively form the pull-down transistor PD-21' and the pull-up transistor PU-21'; the gate structure 404-13' extends across the active areas 402-3' and 402-4' in the top view and engages the active areas 402-3' and 402-4' to respectively form pull-down transistor PD-22' and the pull-up transistor PU-22'; the gate structure 404-18' extends across the active area 402-3' in the top view and engages the active area 402-3' to form the pass-gate transistor PG-22'; the gate structure 404-4' extends across the active area 402-4' in the top view and engages the active area 402-4' to form the isolation transistor IS-21'; and the gate structure 404-19' extends across the active area 402-4' in the top view and engages the active area 402-4' to form the isolation transistor IS-22'.

In the SRAM cell 100C', the gate structure 404-5' extends across the active area 402-6' in the top view and engages the active area 402-6' to form the pass-gate transistor PG-31'; the gate structure 404-10' extends across the active areas 402-6' and 402-5' in the top view and engages the active area 402-6' and 402-5' to respectively form the pull-down transistor PD-31' and the pull-up transistor PU-31'; the gate structure 404-14' extends across the active areas 402-6' and 402-5' in the top view and engages the active areas 402-6' and 402-5' to respectively form pull-down transistor PD-32' and the pull-up transistor PU-32'; the gate structure 404-20' extends across the active area 402-6' in the top view and engages the active area 402-6' to form the pass-gate transistor PG-32'; the gate structure 404-4' extends across the active area 402-5' in the top view and engages the active area 402-5' to form the isolation transistor IS-31'; and the gate structure 404-19' extends across the active area 402-5' in the top view and engages the active area 402-5' to form the isolation transistor IS-32'.

In the SRAM cell 100D', the gate structure 404-6' extends across the active area 402-7' in the top view and engages the active area 402-7' to form the pass-gate transistor PG-41'; the gate structure 404-11' extends across the active areas 402-7' and 402-8' in the top view and engages the active area 402-7' and 402-8' to respectively form the pull-down transistor PD-41' and the pull-up transistor PU-41'; the gate structure 404-15' extends across the active areas 402-7' and 402-8' in the top view and engages the active areas 402-7' and 402-8' to respectively form pull-down transistor PD-42' and the pull-up transistor PU-42'; the gate structure 404-21' extends across the active area 402-7' in the top view and engages the active area 402-7' to form the pass-gate transistor PG-42'; the gate structure 404-7' extends across the active area 402-8' in the top view and engages the active area 402-8' to form the isolation transistor IS-41'; and the gate structure 404-22' extends across the active area 402-8' in the top view and engages the active area 402-8' to form the isolation transistor IS-42'.

Similar to the substrate 202 discussed above, the SRAM arrays 3000 and 3000' further include substrate 401, over which the various features are formed, such as the gate structures 404 and 404'. The substrate 401 may contains a semiconductor material, such as bulk silicon (Si). In some other embodiments, the substrate 401 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). Alternatively, the substrate 401 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods.

In some embodiments, the n-type well NW and p-type wells PW are formed in or on the substrate 401, as shown in FIGS. 6E to 6G and 7E to 7G. In the present embodiment, the p-type wells PW are p-type doped regions configured for n-type transistors (e.g., the pass-gate transistors PG-11, PG-12, PG-21, PG-22, PG-31, PG-32, PG-41, PG-42, PG-11', PG-12', PG-21', PG-22', PG-31', PG-32', PG-41', and PG-42' and the pull-down transistors PD-11, PD-12, PD-21, PD-22, PD-31, PD-32, PD-41, PD-42, PD-11', PD-12', PD-21', PD-22', PD-31', PD-32', PD-41', and PD-42'), and the n-type well NW are n-type doped regions configured for p-type transistors (e.g., the pull-up transistors PU-11, PU-12, PU-21, PU-22, PU-31, PU-32, PU-41, PU-42, PU-11', PU-12', PU-21', PU-22', PU-31', PU-32', PU-41', and PU-42' and isolation transistors IS-11, IS-12, IS-21, IS-22, IS-31, IS-32, IS-41, IS-42, IS-11', IS-12', IS-21', IS-22', IS-31', IS-32', IS-41', and IS-42'). The n-type well NW is doped with n-type dopants, such as phosphorus, arsenic, other n-type dopant, or a combination thereof. The p-type wells PW are doped with p-type dopants, such as boron, indium, other p-type dopant, or a combination thereof. In some implementations, the substrate 401 includes doped regions formed with a combination of p-type dopants and n-type dopants. The various n-type wells and/or p-type wells can be formed directly on and/or in the substrate 401, for example, providing a p-well structure, an n-well structure, a dual-well structure, a raised structure, or a combination thereof. An ion implantation process, a diffusion process, and/or other suitable doping process can be performed to form the various wells.

Similar to the isolation feature 218 discussed above, the SRAM arrays 3000 and 3000' further includes an isolation feature (or isolation structure) 414. The isolation feature 414 may include silicon oxide, silicon nitride, silicon oxynitride, other suitable isolation material (for example, including silicon, oxygen, nitrogen, carbon, or other suitable isolation constituent), or combinations thereof. The isolation feature 414 may include different structures, such as shallow trench isolation (STI) structures, deep trench isolation (DTI) structures, and/or local oxidation of silicon (LOCOS) structures. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Each of the transistors in the SRAM cell 100A to 100D and 100A' to 100D' (e.g., the pass-gate transistors PG-11, PG-12, PG-21, PG-22, PG-31, PG-32, PG-41, PG-42, PG-11', PG-12', PG-21', PG-22', PG-31', PG-32', PG-41', and PG-42', the pull-down transistors PD-11, PD-12, PD-21, PD-22, PD-31, PD-32, PD-41, PD-42, PD-11', PD-12', PD-21', PD-22', PD-31', PD-32', PD-41', and PD-42', the pull-up transistors PU-11, PU-12, PU-21, PU-22, PU-31, PU-32, PU-41, PU-42, PU-11', PU-12', PU-21', PU-22', PU-31', PU-32', PU-41', and PU-42', and isolation transistors IS-11, IS-12, IS-21, IS-22, IS-31, IS-32, IS-41, IS-42, IS-11', IS-12', IS-21', IS-22', IS-31', IS-32', IS-41', and IS-42') includes nanostructures 410 similar to the nanostructures 204 discussed above. As shown in FIGS. 6E to 6G and 7E to 7G, the nanostructures 410 are suspended. In some embodiments, three nanostructures 410 are vertically stacked (or vertically arranged) from each other in the Z-direction for one transistor. However, there may be another appropriate number of nanostructures in one transistor. For example, there may be from 2 to 6 nanostructures 410 in one transistor. The nanostructures 410 further extend lengthwise in the Y-direction (FIGS. 6E, 6F, 7E, and 7F) and widthwise in the X-direction (FIGS. 6G and 7G). As shown in FIGS. 6G and 7G, in each of the transistors in the SRAM cell 100A to 100F and 100A' to 100D', three nanostructures 410 are spaced apart from each other in the Z-direction.

In some embodiments, the widths of the active areas 402 and 402' in the X-direction shown in FIGS. 6A and 7A may also represent widths of the nanostructures 410 in the X-direction. In other words, as shown in FIGS. 6A, a width of the nanostructures 410 in the channel regions of the active areas 402-1, 402-4, 402-5, and 402-8 in the X-direction is larger than a width of the nanostructures 410 in the channel regions of the active areas 402-2, 402-3, 402-6, and 402-7 in the X-direction, in accordance with some embodiments. In some embodiments, a ratio of the width of the nanostructures 410 in the channel regions of the active areas 402-1, 402-4, 402-5, and 402-8 in the X-direction to the width of the nanostructures 410 in the channel regions of the active areas 402-2, 402-3, 402-6, and 402-7 in the X-direction is in a range from about 1.3 to about 5.

Similarly, as shown in FIGS. 7A, a width of the nanostructures 410 in the channel regions of the active areas 402-2', 402-3', 402-6', and 402-7' in the X-direction is substantially the same as than a width of the nanostructures 410 in the channel regions of the active areas 402-1', 402-4', 402-5', and 402-8' in the X-direction, in accordance with some embodiments. In some embodiments, a ratio of the width of the nanostructures 410 in the channel regions of the active areas 402-2', 402-3', 402-6', and 402-7' in the X-direction to the width of the nanostructures 410 in the channel regions of the active areas 402-1', 402-4', 402-5', and 402-8' in the X-direction is in a range from about 1 to about 3.

Furthermore, a ratio of the width of the nanostructures 410 in the channel regions of the active areas 402-1, 402-4, 402-5, and 402-8 in the X-direction to the width of the nanostructures 410 in the channel regions of the active areas 402-2', 402-3', 402-6', and 402-7' is in a range from about 1.3 to about 4, in accordance with some embodiments. The width of the nanostructures 410 in the channel regions of the active areas 402-2, 402-3, 402-6, and 402-7 in the X-direction is substantially the same as the width of the nanostructures 410 in the channel regions of the active areas 402-1', 402-4', 402-5', and 402-8' in the X-direction. In some embodiments, a ratio of the width of the nanostructures 410 in the channel regions of the active areas 402-2, 402-3, 402-6, and 402-7 in the X-direction to the width of the nanostructures 410 in the channel regions of the active areas 402-1', 402-4', 402-5', and 402-8' in the X-direction is in a range from about 1.05 to about 1.3.

The nanostructures 410 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 410 include silicon for n-type transistors, such as the pass-gate transistors PG-11, PG-12, PG-21, PG-22, PG-31, PG-32, PG-41, PG-42, PG-11', PG-12', PG-21', PG-22', PG-31', PG-32', PG-41', and PG-42' and the pull-down transistors PD-11, PD-12, PD-21, PD-22, PD-31, PD-32, PD-41, PD-42, PD-11', PD-12', PD-21', PD-22', PD-31', PD-32', PD-41', and PD-42'. In other embodiments, the nanostructures 410 include silicon germanium for p-type transistors, such as the pull-up transistors PU-11, PU-12, PU-21, PU-22, PU-31, PU-32, PU-41, PU-42, PU-11', PU-12', PU-21', PU-22', PU-31', PU-32', PU-41', and PU-42' and isolation transistors IS-11, IS-12, IS-21, IS-22, IS-31, IS-32, IS-41, IS-42, IS-11', IS-12', IS-21', IS-22', IS-31', IS-32', IS-41', and IS-42'. In some embodiments, the nanostructures 410 are all made of silicon, and the type of the transistors depend on work function metal layer wrapping around the nanostructures 410. In some embodiments, the nanostructures 410 are epitaxially grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized.

Each of the gate structures 404 and 404' has a gate dielectric layer 406 and a gate electrode layer 408. The gate dielectric layers 406 wrap around each of the nanostructures 410 and the gate electrodes layer 408 wrap around the gate dielectric layer 406. In some embodiments, the gate structures 404 each further includes an interfacial layer (such as having silicon dioxide, silicon oxynitride, or other suitable materials) between the gate dielectric layer 406 and the nanostructures 410. The gate dielectric layers 406 may include oxide with nitrogen doped dielectric material (initial layer) combined with metal content high-K dielectric material (K value (dielectric constant)>13). For example, gate dielectric layers 406 may include hafnium oxide ($HfO_2$), which has a dielectric constant in a range from about 18 to about 40. Alternatively, the gate dielectric layers 406 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, (Ba,Sr) $TiO_3$ (BST), $Al_2O_3$, $Si_3N_4$, oxynitrides (SiON), combinations thereof, or other suitable material. The gate dielectric layers 406 may be formed by chemical oxidation, thermal oxidation, ALD, CVD, and/or other suitable methods.

The gate electrode layer 408 is formed to wrap around the gate dielectric layer 406 and the center portions of the nanostructures 410, as shown in FIGS. 6E, 6F, 7E, and 7F. In some embodiments, the gate electrode layer 408 may include an n-type work function metal layer for n-type transistor (such as the pass-gate transistors PG-11, PG-12, PG-21, PG-22, PG-31, PG-32, PG-41, PG-42, PG-11', PG-12', PG-21', PG-22', PG-31', PG-32', PG-41', and PG-42' and the pull-down transistors PD-11, PD-12, PD-21, PD-22, PD-31, PD-32, PD-41, PD-42, PD-11', PD-12', PD-21', PD-22', PD-31', PD-32', PD-41', and PD-42') or a p-type work function metal layer for p-type transistor (such as the pull-up transistors PU-11, PU-12, PU-21, PU-22, PU-31, PU-32, PU-41, PU-42, PU-11', PU-12', PU-21', PU-22', PU-31', PU-32', PU-41', and PU-42' and isolation transistors IS-11, IS-12, IS-21, IS-22, IS-31, IS-32, IS-41, IS-42, IS-11', IS-12', IS-21', IS-22', IS-31', IS-32', IS-41', and IS-42'). In an embodiment, the n-type work function metal layer is a material such as Ti, Al, Ag, Mn, Zr, TiAl, TiAlC, TaC, TaCN, TaSiN, TaAl, TaAlC, TiAlN, other suitable n-type work function materials, or combinations thereof. For example, the n-type work function metal layer may be deposited utilizing ALD, CVD, or the like. However, any suitable materials and processes may be utilized to form the n-type work function metal layer. In an embodiment, the p-type work function metal layer is a material such as TiN, TaN, Ru, Mo, Al, WN, ZrSi2, MoSi2, TaSi2, NiSi2, WN, other metal oxides, metal nitrides, metal silicates, transition metal-oxides, transition metal-nitrides, transition metal-silicates, oxynitrides of metals, metal aluminates, zirconium silicate, zirconium aluminate, other suitable p-type work function materials, combinations of these, or the like. Additionally, the p-type work function metal layer may be deposited using a deposition process such as ALD, CVD, or the like, although any suitable deposition process may be used.

In some embodiments, the gate electrode layer 408 may include a single layer or alternatively a multi-layer structure. In some embodiments, the gate electrode layer 408 may further include a capping layer, a barrier layer, and a fill material (not shown). The capping layer may be formed adjacent to the gate dielectric layers 406 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used. The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The SRAM cells 100A to 100D and 100A' to 100D' further include gate top dielectric layers 416 are over the gate dielectric layers 406, the gate electrodes 408, and the nanostructures 410. The gate top dielectric layers 416 are similar to the gate top dielectric layer 214 discussed above. The gate top dielectric layer 416 is used for contact etch protection layer. The material of gate top dielectric layer 416 is selected from a group consisting of oxide, SiOC, SiON, SiOCN, nitride base dielectric, metal oxide dielectric, Hf oxide (HfO$_2$), Ta oxide (Ta$_2$O$_5$), Ti oxide (TiO$_2$), Zr oxide (ZrO$_2$), Al oxide (Al$_2$O$_3$), Y oxide (Y$_2$O$_3$), combinations thereof, or other suitable material.

As shown in FIGS. 6G and 7G, gate end dielectrics 418 are at ends of the gate structures 404 and 404'. The gate end dielectrics 418 are used for separating the gate structures 404 and 404' aligned in the X-direction. For example, the gate end dielectrics 418 separate the gate structures 404-10 and 404-11, as shown in FIG. 6G, and the gate end dielectrics 418 separate the gate structures 404-13' and 404-14', as shown in FIG. 7G. The material of the gate end dielectrics 418 is selected from a group consisting of Si$_3$N$_4$, nitride-base dielectric, carbon-base dielectric, high K material (K>=9), or a combination thereof.

The SRAM cells 100A to 100D and 100A' to 100D' further include gate spacers 420 on sidewalls of the gate structures 404 and over the nanostructures 410, as shown in FIGS. 6E, 6F, 7E, and 7F. More specifically, the gate spacers 420 are over the nanostructures 410 and on top sidewalls of the gate structures 404, and thus are also referred to as gate top spacers or top spacers. The gate spacers 420 may include multiple dielectric materials and be selected from a group consisting of silicon nitride (Si$_3$N$_4$), silicon oxide (SiO$_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 420 may include a single layer or a multi-layer structure.

As shown in FIGS. 6E, 6F, 7E, and 7F, the SRAM cells 100A to 100D and 100A' to 100D' further include inner spacers 422 on the sidewalls of the gate structures 404 and below the topmost nanostructures 410. Furthermore, the inner spacers 422 are laterally between the source/drain features 412N (or 412P) and the gate structures 404. The inner spacers 422 are also vertically between adjacent nanostructures 410. The inner spacers 422 may include a dielectric material having higher K value (dielectric constant) than the gate spacers 420 and be selected from a group consisting of silicon nitride (Si$_3$N$_4$), silicon oxide (SiO$_2$), silicon carbide (SiC), silicon oxycarbide (SiOC), silicon oxynitride (SiON), silicon oxycarbon nitride (SiOCN), air gap, or a combination thereof. In some embodiments, the thickness of the gate spacers 420 in the Y-direction and the thickness of the inner spacers 422 in the Y-direction are the same. In other embodiments, the thickness of the gate spacers 420 in the Y-direction is less than the thickness of the inner spacers 422 in the Y-direction due to the gate spacers 420 are trimmed during processes for forming source/drain contacts.

Referring to FIGS. 6G and 6H, the SRAM cells 100A to 100D and 100A' to 100D' further include source/drain features 412N and source/drain features 412P in the source/drain regions of the active areas 402 and 402'. The source/drain features 412N are disposed over both sides of the respective gate structure 404 or 404' and connected by the nanostructures 410 to form n-type transistor (e.g., the pass-gate transistors PG-11, PG-12, PG-21, PG-22, PG-31, PG-32, PG-41, PG-42, PG-11', PG-12', PG-21', PG-22', PG-31', PG-32', PG-41', and PG-42' and the pull-down transistors PD-11, PD-12, PD-21, PD-22, PD-31, PD-32, PD-41, PD-42, PD-11', PD-12', PD-21', PD-22', PD-31', PD-32', PD-41', and PD-42'). Similarly, the source/drain features 412P are disposed over both sides of the respective gate structure 404 and connected by the nanostructures 410 to form p-type transistor (e.g., the pull-up transistors PU-11, PU-12, PU-21, PU-22, PU-31, PU-32, PU-41, PU-42, PU-11', PU-12', PU-21', PU-22', PU-31', PU-32', PU-41', and PU-42' and isolation transistors IS-11, IS-12, IS-21, IS-22, IS-31, IS-32, IS-41, IS-42, IS-11', IS-12', IS-21', IS-22', IS-31', IS-32', IS-41', and IS-42'). Further, every two adjacent transistors in the Y-direction share one source/drain feature 412N/412P, as shown in FIGS. 6A, 6E, 6F, 7A, 7E, and 7F.

The source/drain features 412N and 412P may be formed by using epitaxial growth. In some embodiments, the source/drain features 412N may include epitaxially-grown material selected from a group consisting of SiP, SiC, SiPC, SiAs, Si, or a combination thereof. In some embodiments, the epitaxially-grown material of the source/drain features 412N may be doped with n-type dopants (such as phosphorus, arsenic, other n-type dopant, or combinations thereof) having a doping concentration in a range from about $2\times10^{19}$/cm$^3$ to $3\times10^{21}$/cm$^3$. In some embodiments, the source/drain features 412N for n-type transistors may be respectively referred to as n-type features and n-type source/drain features.

In some embodiments, the source/drain features 412P may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 412P may be doped with p-type dopants (such as boron, indium, other p-type dopant, or combinations thereof) having a doping concentration in a range from about $1\times10^{19}$/cm$^3$ to $6\times10^{20}$/cm$^3$. In some embodiments, the source/drain features 412P for p-type transistors may be respectively referred to as p-type source/drain features.

As shown in FIGS. 6E, 6F, 7E, and 7F, the SRAM cells 100A to 100D and 100A' to 100D' further include silicide features 424 over the source/drain features 412N and 412P. The silicide features 424 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Referring to FIGS. 6A, 6E, 6F, 7A, 7E, and 7F, the SRAM arrays 3000 and 3000' further include source/drain contacts 430-1 to 430-21 (which may be collectively referred to as the source/drain contacts 430) in SRAM array 3000 and source/drain contacts 430-1' to 430-17' (which may be collectively referred to as the source/drain contacts 430') in SRAM array 3000' in an inter-layer dielectric (ILD) layer 426. As shown in FIGS. 6A, 6E, 6F, 7A, 7E, and 7F, the source/drain contacts 430 and 430' extend lengthwise in the X-direction. The source/drain contacts 430 and 430' are self-aligned source/drain contacts. This means that the source/drain contacts 430 and 430' are formed by using the gate spacers 420 as mask. Therefore, the source/drain contacts 430 and 430' are in direct contact with the gate spacers 420, as shown in FIGS. 6E, 6F, 7E, and 7F. In some embodiments, the gate spacers 420 are trimmed due to the gate spacers 420 serving as the mask for forming the source/drain contacts 430 and 430'. Therefore, the thickness of the gate spacers 420 in the Y-direction is less than the thickness of the inner spacers 422 in the Y-direction, as discussed above.

In the top view, as shown in FIG. 6A, the source/drain contacts 430-1 and 430-18 lengthwise overlap the cell boundary CB1, the source/drain contacts 430-2 and 430-19 lengthwise overlap the cell boundary CB2, the source/drain contacts 430-3 and 430-20 lengthwise overlap the cell boundary CB3, and the source/drain contacts 430-4 and 430-21 lengthwise overlap the cell boundary CB4, in accordance with some embodiments. In the top view, as shown in FIG. 7A, the source/drain contacts 430-1' and 430-16' lengthwise overlap the cell boundaries CB1' and CB2', and the source/drain contacts 430-2' and 430-17' lengthwise overlap the cell boundaries CB3' and CB4', in accordance with some embodiments.

In the top view, as shown in FIG. 6A, the source/drain contact 430-1 is adjacent to the gate structure 404-1 (or is adjacent to the pass-gate transistor PG-11) in the Y-direction; the source/drain contact 430-2 is adjacent to the gate structure 404-3 (or is adjacent to the pass-gate transistor PG-21) in the Y-direction; the source/drain contact 430-3 is adjacent to the gate structure 404-3 (or is adjacent to the pass-gate transistor PG-31) in the Y-direction; the source/drain contact 430-4 is adjacent to the gate structure 404-5 (or is adjacent to the pass-gate transistor PG-41) in the Y-direction; the source/drain contact 430-5 is between the gate structures 404-1 and 404-6 as well as between the gate structures 404-2 and 404-6 (or between the pass-gate transistor PG-11 and the pull-down transistor PD-11 as well as between the isolation transistor IS-11 and the pull-up transistor PU-11) in the Y-direction; the source/drain contact 430-6 is between the gate structures 404-2 and 404-7 as well as between the gate structures 404-3 and 404-7 (or between the isolation transistor IS-21 and the pull-up transistor PU-21 as well as between the pass-gate transistor PG-21 and the pull-down transistor PD-21) in the Y-direction; the source/drain contact 430-7 is between the gate structures 404-3 and 404-8 as well as between the gate structures 404-4 and 404-8 (or between the pass-gate transistor PG-31 and the pull-down transistor PD-31 as well as between the isolation transistor IS-31 and the pull-up transistor PU-31) in the Y-direction; the source/drain contact 430-8 is between the gate structures 404-4 and 404-9 as well as between the gate structures 404-5 and 404-9 (or between the isolation transistor IS-41 and the pull-up transistor PU-41 as well as between the pass-gate transistor PG-41 and the pull-down transistor PD-41) in the Y-direction; the source/drain contact 430-9 is between the gate structures 404-6 and 404-10 (or between the pull-down transistor PD-11 and PD-12) in the Y-direction; the source/drain contact 430-10 is between the gate structures 404-6 and 404-10 as well as between the gate structures 404-7 and 404-11 (or between the pull-up transistors PU-11 and PU-12 as well as between the pull-up transistors PU-21 and PU-22) in the Y-direction; the source/drain contact 430-11 is between the gate structures 404-7 and 404-11 as well as between the gate structures 404-8 and 404-12 (or between the pull-down transistors PD-21 and PD-22 as well as between the pull-down transistors PD-31 and PD-32) in the Y-direction; the source/drain contact 430-12 is between the gate structures 404-8 and 404-12 as well as between the gate structures 404-9 and 404-13 (or between the pull-up transistors PU-31 and PU-32 as well as between the pull-up transistors PU-41 and PU-42) in the Y-direction; the source/drain contact 430-13 is between the gate structures 404-9 and 404-13 (or between the pull-down transistor PD-41 and PD-42) in the Y-direction; the source/drain contact 430-14 is between the gate structures 404-10 and 404-14 as well as between the gate structures 404-10 and 404-15 (or between the pull-down transistor PD-12 and the pass-gate transistor PG-12 as well as between the pull-up transistor PU-12 and the isolation transistor IS-12) in the Y-direction; the source/drain contact 430-15 is between the gate structures 404-11 and 404-15 as well as between the gate structures 404-11 and 404-15 (or between the pull-up transistor PU-22 and the isolation transistor IS-22 as well as between the pull-down transistor PD-22 and the pass-gate transistor PG-22) in the Y-direction; the source/drain contact 430-16 is between the gate structures 404-12 and 404-16 as well as between the gate structures 404-12 and 404-17 (or between the pull-down transistor PD-32 and the pass-gate transistor PG-32 as well as between the pull-up transistor PU-32 and the isolation transistor IS-32) in the Y-direction; the source/drain contact 430-17 is between the gate structures 404-13 and 404-17 as well as between the gate structures 404-13 and 404-18 (or between the pull-up transistor PU-42 and the isolation transistor IS-42 as well as between the pull-down transistor PD-42 and the pass-gate transistor PG-42) in the Y-direction; the source/drain contact 430-18 is adjacent to the gate structure 404-14 (or is adjacent to the pass-gate transistor PG-12) in the Y-direction; the source/drain contact 430-19 is adjacent to the gate structure 404-16 (or is adjacent to the pass-gate transistor PG-22) in the Y-direction; the source/drain contact 430-20 is adjacent to the gate structure 404-16 (or is adjacent to the pass-gate transistor PG-32) in the Y-direction; and the source/drain contact 430-21 is adjacent to the gate structure 404-18 (or is adjacent to the pass-gate transistor PG-42) in the Y-direction.

In the top view, as shown in FIG. 7A, the source/drain contact 430-1' is adjacent to the gate structures 404-2' and 404-3' (or is adjacent to the pass-gate transistors PG-11' and PG-21') in the Y-direction; the source/drain contact 430-2' is adjacent to the gate structures 404-5' and 404-6' (or is adjacent to the pass-gate transistors PG-31' and PG-41') in the Y-direction; the source/drain contact 430-3' is between the gate structures 404-1' and 404-8' as well as between the gate structures 404-2' and 404-8' (or between the isolation transistor IS-11' and the pull-up transistor PU-11' as well as between the pass-gate transistor PG-11' and the pull-down transistor PD-11') in the Y-direction; the source/drain contact 430-4' is between the gate structures 404-3' and 404-9' as well as between the gate structures 404-4' and 404-9' (or between the pass-gate transistor PG-21' and the pull-down transistor PD-21' as well as between the isolation transistor IS-21' and the pull-up transistor PU-21') in the Y-direction; the source/drain contact 430-5' is between the gate structures 404-4' and 404-10' as well as between the gate structures 404-5' and 404-10' (or between the isolation transistor IS-31' and the pull-up transistor PU-31' as well as between the pass-gate transistor PG-31' and the pull-down transistor PD-31') in the Y-direction; the source/drain contact 430-6' is between the gate structures 404-6' and 404-11' as well as between the gate structures 404-7' and 404-11' (or between the pass-gate transistor PG-41' and the pull-down transistor PD-41' as well as between the isolation transistor IS-41' and the pull-up transistor PU-41') in the Y-direction; the source/drain contact 430-7' is between the gate structures 404-8' and 404-12' (or between the pull-up transistor PU-11' and PU-12') in the Y-direction; the source/drain contact 430-8' is between the gate structures 404-8' and 404-12' as well as between the gate structures 404-9' and 404-13' (or between the pull-down transistors PD-11' and PD-12' as well as between the pull-down transistors PD-21' and PD-22') in the Y-direction; the source/drain contact 430-9' is between the gate structures 404-9' and 404-13' as well as between the gate structures 404-10' and 404-14' (or between the pull-up transistors PU-21' and PU-22' as well as between the pull-up transistors PU-31' and PU-32') in the Y-direction; the source/drain contact 430-10' is between the gate structures 404-10' and 404-14' as well as between the gate structures 404-11' and 404-15' (or between the pull-down transistors PD-31' and PD-32' as well as between the pull-down transistors PD-41' and PD-42') in the Y-direction; the source/drain contact 430-11' is between the gate structures 404-11' and 404-15' (or between the pull-up transistor PU-41' and PU-42') in the Y-direction; the source/drain contact 430-12' is between the gate structures 404-12' and 404-16' as well as between the gate structures 404-12' and 404-17' (or between the pull-up transistor PU-12' and the isolation transistor IS-12' as well as between the pull-down transistor PD-12' and the pass-gate transistor PG-12') in the Y-direction; the source/drain contact 430-13' is between the gate structures 404-13' and 404-18' as well as between the gate structures 404-13' and 404-19' (or between the pull-down transistor PD-22' and the pass-gate transistor PG-22' as well as between the pull-up transistor PU-22' and the isolation transistor IS-22') in the Y-direction; the source/drain contact 430-14' is between the gate structures 404-14' and 404-19' as well as between the gate structures 404-14' and 404-20' (or between the pull-up transistor PU-32' and the isolation transistor IS-32' as well as between the pull-down transistor PD-32' and the pass-gate transistor PG-32') in the Y-direction; the source/drain contact 430-15' is between the gate structures 404-15' and 404-21' as well as between the gate structures 404-15' and 404-22' (or between the pull-down transistor PD-42' and the pass-gate transistor PG-42' as well as between the pull-up transistor PU-42' and the isolation transistor IS-42') in the Y-direction; the source/drain contact 430-16' is adjacent to the gate structures 404-17' and 404-18' (or is adjacent to the pass-gate transistors PG-12' and PG-22') in the Y-direction; and the source/drain contact 430-17' is adjacent to the gate structures 404-20' and 404-21' (or is adjacent to the pass-gate transistors PG-32' and PG-42') in the Y-direction.

Furthermore, each of the source/drain contacts 430 and 430' is over and electrically connected to the respective source/drain features 412N/412P. Specifically, as shown in FIGS. 6A, 6E, and 6F, the source/drain contact 430-1 is over and electrically connected to the source/drain feature 412N of the pass-gate transistor PG-11; the source/drain contact 430-2 is over and electrically connected to the source/drain feature 412N of the pass-gate transistor PG-21; the source/drain contact 430-3 is over and electrically connected to the source/drain feature 412N of the pass-gate transistor PG-31; the source/drain contact 430-4 is over and electrically connected to the source/drain feature 412N of the pass-gate transistor PG-41; the source/drain contact 430-5 is over and electrically connected to the source/drain feature 412N shared by the pass-gate transistor PG-11 and the pull-down transistor PD-11 (also referred to as common source/drain or common drain) and the source/drain feature 412P shared by the isolation transistor IS-11 and the pull-up transistor PU-11, which corresponds to the storage node SN shown in FIG. 2; the source/drain contact 430-6 is over and electrically connected to the source/drain feature 412P shared by the isolation transistor IS-21 and the pull-up transistor PU-21 and the source/drain feature 412N shared by the pass-gate transistor PG-21 and the pull-down transistor PD-21 (also referred to as common source/drain or common drain), which corresponds to the storage node SN; the source/drain contact 430-7 is over and electrically connected to the source/drain feature 412N shared by the pass-gate transistor PG-31 and the pull-down transistor PD-31 (also referred to as common source/drain or common drain) and the source/drain feature 412P shared by the isolation transistor IS-31 and the pull-up transistor PU-31, which corresponds to the storage node SN; the source/drain contact 430-8 is over and electrically connected to the source/drain feature 412P shared by the isolation transistor IS-41 and the pull-up transistor PU-41 and the source/drain feature 412N shared by the pass-gate transistor PG-41 and the pull-down transistor PD-41 (also referred to as common source/drain or common drain), which corresponds to the storage node SN; the source/drain contact 430-9 is over and electrically connected to the source/drain feature 412N shared by the pull-down transistors PD-11 and PD-12; the source/drain contact 430-10 is over and electrically connected to the source/drain feature 412P shared by the pull-up transistors PU-11 and PU-12 and the source/drain feature 412P shared by the pull-up transistors PU-21 and PU-22; the source/drain contact 430-11 is over and electrically connected to the source/drain feature 412N shared by the pull-down transistors PD-21 and PD-22 and the source/drain feature 412N shared by the pull-down transistors PD-31 and PD-32; the source/drain contact 430-12 is over and electrically connected to the source/drain feature 412P shared by the pull-up transistors PU-31 and PU-32 and the source/drain feature 412P shared by the pull-up transistors PU-41 and PU-42; the source/drain contact 430-13 is over and electrically connected to the source/drain feature 412N shared by the pull-down transistors PD-41 and PD-42; the source/drain contact 430-14 is over and electrically connected to the source/drain feature 412N shared by the pull-down transistor PD-12 and the pass-gate transistor PG-12 (also referred to as common source/drain or common drain) and the source/drain feature 412P shared by the pull-up transistor PU-12 and the isolation transistor IS-12, which corresponds to the storage node SNB shown in FIG. 2; the source/drain contact 430-15 is over and electrically connected to the source/drain feature 412P shared by the pull-up transistor PU-22 and the isolation transistor IS-22 and the source/drain feature 412N shared by the pull-down transistor PD-22 and the pass-gate transistor PG-22 (also referred to as common source/drain or common drain), which corresponds to the storage node SNB; the source/drain contact 430-16 is over and electrically connected to the source/drain feature 412N shared by the pull-down transistor PD-32 and the pass-gate transistor PG-32 (also referred to as common source/drain or common drain) and the source/drain feature 412P shared by the pull-up transistor PU-32 and the isolation transistor IS-32, which corresponds to the storage node SNB; the source/drain contact 430-17 is over and electrically connected to the source/drain feature 412P shared by the pull-up transistor PU-42 and the isolation transistor IS-42 and the source/drain feature 412N shared by the pull-down transistor PD-42 and the pass-gate transistor PG-42 (also referred to as common source/drain or common drain), which corresponds to the storage node SNB; the source/drain contact 430-18 is over and electrically connected to the source/drain feature 412N of the pass-gate transistor PG-12; the source/drain contact 430-19 is over and electrically connected to the source/drain feature 412N of the pass-gate transistor PG-22; the source/drain contact 430-20 is over and electrically connected to the source/drain feature 412N of the pass-gate transistor PG-32; and the source/drain contact 430-21 is over and electrically connected to the source/drain feature 412N of the pass-gate transistor PG-42.

As shown in FIGS. 7A, 7E, and 7F, the source/drain contact 430-1' is over and electrically connected to the source/drain feature 412N of the pass-gate transistor PG-11' and the source/drain feature 412N of the pass-gate transistor PG-21'; the source/drain contact 430-2' is over and electrically connected to the source/drain feature 412N of the pass-gate transistor PG-31' and the source/drain feature 412N of the pass-gate transistor PG-41'; the source/drain contact 430-3' is over and electrically connected to the source/drain feature 412P shared by the isolation transistor IS-11' and the pull-up transistor PU-11' and the source/drain feature 412N shared by the pass-gate transistor PG-11' and the pull-down transistor PD-11' (also referred to as common source/drain or common drain), which corresponds to the storage node SN; the source/drain contact 430-4' is over and electrically connected to the source/drain feature 412N shared by the pass-gate transistor PG-21' and the pull-down transistor PD-21' (also referred to as common source/drain or common drain) and the source/drain feature 412P shared by the isolation transistor IS-21' and the pull-up transistor PU-21', which corresponds to the storage node SN; the source/drain contact 430-5' is over and electrically connected to the source/drain feature 412P shared by the isolation transistor IS-31' and the pull-up transistor PU-31' and the source/drain feature 412N shared by the pass-gate transistor PG-31' and the pull-down transistor PD-31' (also referred to as common source/drain or common drain), which corresponds to the storage node SN; the source/drain contact 430-6' is over and electrically connected to the source/drain feature 412N shared by the pass-gate transistor PG-41' and the pull-down transistor PD-41' (also referred to as common source/drain or common drain) and the source/drain feature 412P shared by the isolation transistor IS-41' and the pull-up transistor PU-41', which corresponds to the storage node SN; the source/drain contact 430-7' is over and electrically connected to the source/drain feature 412P shared by the pull-up transistors PU-11' and PU-12'; the source/drain contact 430-8' is over and electrically connected to the source/drain feature 412N shared by the pull-down transistors PD-11' and PD-12' and the source/drain feature 412N shared by the pull-down transistors PD-21' and PD-22'; the source/drain contact 430-9' is over and electrically connected to the source/drain feature 412P shared by the pull-up transistors PU-21' and PU-22' and the source/drain feature 412P shared by the pull-up transistors PU-31' and PU-32'; the source/drain contact 430-10' is over and electrically connected to the source/drain feature 412N shared by the pull-down transistors PD-31' and PD-32' and the source/drain feature 412N shared by the pull-down transistors PD-41' and PD-42'; the source/drain contact 430-11' is over and electrically connected to the source/drain feature 412P shared by the pull-up transistors PU-41' and PU-42'; the source/drain contact 430-12' is over and electrically connected to the source/drain feature 412P shared by the pull-up transistor PU-12' and the isolation transistor IS-12' and the source/drain feature 412N shared by the pull-down transistor PD-12' and the pass-gate transistor PG-12' (also referred to as common source/drain or common drain), which corresponds to the storage node SNB; the source/drain contact 430-13' is over and electrically connected to the source/drain feature 412N shared by the pull-down transistor PD-22' and the pass-gate transistor PG-22' (also referred to as common source/drain or common drain) and the source/drain feature 412P shared by the pull-up transistor PU-22' and the isolation transistor IS-22', which corresponds to the storage node SNB; the source/drain contact 430-14' is over and electrically connected to the source/drain feature 412P shared by the pull-up transistor PU-32' and the isolation transistor IS-32' and the source/drain feature 412N shared by the pull-down transistor PD-32' and the pass-gate transistor PG-32' (also referred to as common source/drain or common drain), which corresponds to the storage node SNB; the source/drain contact 430-15' is over and electrically connected to the source/drain feature 412N shared by the pull-down transistor PD-42' and the pass-gate transistor PG-42' (also referred to as common source/drain or common drain) and the source/drain feature 412P shared by the pull-up transistor PU-42' and the isolation transistor IS-42', which corresponds to the storage node SNB; the source/drain contact 430-16' is over and electrically connected to the source/drain feature 412N of the pass-gate transistor PG-12' and the source/drain feature 412N of the pass-gate transistor PG-22'; and the source/drain contact 430-17' is over and electrically connected to the source/drain feature 412N of the pass-gate transistor PG-32' and the source/drain feature 412N of the pass-gate transistor PG-42'.

The source/drain contacts 430 and 430' may each include a conductive material such as Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 430 and 430' may each include a single conductive material layer or multiple conductive layers.

The SRAM arrays 3000 and 3000' further include (front-side) interconnection structures including gate vias, vias, and metal conductors. More specifically, the SRAM array 3000 includes gate vias 502 (including gate vias 502-1 to 502-18), vias 504 (including vias 504-1 to 504-22), metal conductors 506 (including metal conductors 506-1 to 506-25), vias 508 (including vias 508-1 to 508-15), metal conductors 510 (including metal conductors 510-1 to 510-11), vias 512 (including vias 512-1 to 512-13), metal conductors 514 (including metal conductors 514-1 to 514-13), and an inter-metal dielectric (IMD) layer 516. The SRAM array 3000' includes gate vias 502' (including gate vias 502-1' to 502-22'), vias 504' (including vias 504-1' to 504-17'), metal conductors 506' (including metal conductors 506-1' to 506-21'), vias 508' (including vias 508-1' to 508-10'), metal conductors 510' (including metal conductors 510-1' to 510-7'), vias 512' (including vias 512-1' to 512-6'), metal conductors 514' (including metal conductors 514-1' to 514-6'), and the IMD layer 516.

The gate vias 502 and 502', vias 504 and 504', the metal conductors 506 and 506', the vias 508 and 508', the metal conductors 510 and 510', the vias 512 and 512', and the metal conductors 514 and 514' are over the transistors in the SRAM cells 100A to 100D and 100A' to 100D' (e.g., the pass-gate transistors PG-11, PG-12, PG-21, PG-22, PG-31, PG-32, PG-41, PG-42, PG-11', PG-12', PG-21', PG-22', PG-31', PG-32', PG-41', and PG-42', the pull-down transistors PD-11, PD-12, PD-21, PD-22, PD-31, PD-32, PD-41, PD-42, PD-11', PD-12', PD-21', PD-22', PD-31', PD-32', PD-41', and PD-42', the pull-up transistors PU-11, PU-12, PU-21, PU-22, PU-31, PU-32, PU-41, PU-42, PU-11', PU-12', PU-21', PU-22', PU-31', PU-32', PU-41', and PU-42', and isolation transistors IS-11, IS-12, IS-21, IS-22, IS-31, IS-32, IS-41, IS-42, IS-11', IS-12', IS-21', IS-22', IS-31', IS-32', IS-41', and IS-42').

The gate vias 502, and 502', the vias 504, 504', 508, 508', 512, and 512', and the metal conductors 506, 506', 510, 510', 514, and 514' are in the IMD layer 516. The metal conductors 506, 506', 510, 510', 514, and 514' are respectively in the metal layers M1, M2, and M3, as discussed above. Therefore, the metal conductors 510 and 510' are over the metal conductors 506 and 506', and the metal conductors 514 and 514' are over the metal conductors 510 and 510'. As show in FIGS. 6A to 6D and 7A to 7D, the metal conductors 506, 506', 514, and 514' extend lengthwise in the Y-direction, and the metal conductors 510 and 510' extend lengthwise in the X-direction.

Each of the gate vias 502/502' is vertically between and electrically connected to the respective gate structure 404/404' and the respective metal conductor 506/506'. Each of the vias 504/504' is vertically between and electrically connected to the respective source/drain contact 430/430' and the respective metal conductor 506/506'. Each of the vias 508/508' is vertically between and electrically connected to the respective metal conductor 506/506' and the respective metal conductor 510/150'. Each of the vias 512/512' is vertically between and electrically connected to the respective metal conductor 510/510' and the respective metal conductor 514/514'. In some embodiments, the gate vias 502, 502', the vias 504, 504', 508, 508', 512, and 512' may have a square shape in the top view. In other embodiments, the gate vias 502, 502', the vias 504, 504', 508, 508', 512, and 512' may have a circular shape in the top view.

As discussed above, connections of the SRAM cells 100A to 100D and 100A' to 100D' correspond to the circuit shown in FIG. 2. In some embodiments, the metal conductors 506-7 and 506-19 for the SRAM array 3000 and the metal conductors 506-1', 506-11', and 506-21' for the SRAM array 3000' serve as VDD lines that are electrically coupled to a voltage source (not shown) (e.g., the supply voltage VDD discussed above) and electrically connected to the source/drain features 412P of the pull-up transistors PU-11, PU-12, PU-21, PU-22, PU-31, PU-32, PU-41, PU-42, PU-11', PU-12', PU-21', PU-22', PU-31', PU-32', PU-41', and PU-42' and the gate structures 404/404' of the isolation transistors IS-11, IS-12, IS-21, IS-22, IS-31, IS-32, IS-41, IS-42, IS-11', IS-12', IS-21', IS-22', IS-31', IS-32', IS-41', and IS-42'.

As shown in FIG. 6A, the metal conductor 506-7 is electrically connected to the source/drain feature 412P shared by the pull-up transistors PU-11 and PU-12 and the source/drain feature 412P shared by the pull-up transistors PU-21 and PU-22 through the via 504-6 and the source/drain contact 430-10; and the metal conductor 506-19 is electrically connected to the source/drain feature 412P shared by the pull-up transistors PU-31 and PU-32 and the source/drain feature 412P shared by the pull-up transistors PU-41 and PU-42 through the via 504-17 and the source/drain contact 430-12.

As shown in FIG. 7A, the metal conductor 506-1' is electrically connected to the source/drain feature 412P shared by the pull-up transistors PU-11' and PU-12' through the via 504-1' and the source/drain contact 430-7'; the metal conductor 506-11' is electrically connected to the source/drain feature 412P shared by the pull-up transistors PU-21' and PU-22' and the source/drain feature 412P shared by the pull-up transistors PU-31' and PU-32' through the via 504-9' and the source/drain contact 430-9'; and the metal conductor 506-21' is electrically connected to the source/drain feature 412P shared by the pull-up transistors PU-41' and PU-42' through the via 504-17' and the source/drain contact 430-11'.

Further, as shown in FIG. 6A, the metal conductor 506-7 is electrically connected to the gate structure 404-2 shared by the isolation transistors IS-11 and IS-21 through the gate via 502-5 and the gate structure 404-15 shared by the isolation transistors IS-12 and IS-22 through the gate via

502-6; and the metal conductor 506-19 is electrically connected to the gate structure 404-4 shared by the isolation transistors IS-31 and IS-41 through the gate via 502-13 and the gate structure 404-17 shared by the isolation transistors IS-32 and IS-42 through the gate via 502-14.

As shown in FIG. 7A, the metal conductor 506-1' is electrically connected to the gate structure 404-1' of the isolation transistor IS-11' through the gate via 502-1' and the gate structure 404-16' of the isolation transistors IS-12' through the gate via 502-2'; the metal conductor 506-11' is electrically connected to the gate structure 404-4' shared by the isolation transistors IS-21' and IS-31' through the gate via 502-11' and the gate structure 404-19' shared by the isolation transistors IS-22' and IS-32' through the gate via 502-142' and the metal conductor 506-21' is electrically connected to the gate structure 404-7' of the isolation transistor IS-41' through the gate via 502-21' and the gate structure 404-22' of the isolation transistors IS-42' through the gate via 502-22'.

As discussed above, the isolation transistors IS-11, IS-12, IS-21, IS-22, IS-31, IS-32, IS-41, IS-42, IS-11', IS-12', IS-21', IS-22', IS-31', IS-32', IS-41', and IS-42' are p-type transistors. As such, the isolation transistors IS-11, IS-12, IS-21, IS-22, IS-31, IS-32, IS-41, IS-42, IS-11', IS-12', IS-21', IS-22', IS-31', IS-32', IS-41', and IS-42' are electrically connected to the metal conductors serving as VDD lines and are turned off for isolation. In some embodiments, the isolation transistors IS-11, IS-12, IS-21, IS-22, IS-31, IS-32, IS-41, IS-42, IS-11', IS-12', IS-21', IS-22', IS-31', IS-32', IS-41', and IS-42' may be referred to as turned-off transistors. In some embodiments, the metal conductors 506-7, 506-19, 506-1', 506-11', and 506-21' may be referred to as VDD conductors or VDD lines.

In some embodiments, the metal conductors 506-5, 506-6, 506-8, 506-9, 506-17, 506-18, 506-20, and 506-21 for the SRAM array 3000 and the metal conductors 506-2', 506-3', 506-9', 506-10', 506-12', 506-13', 506-19', and 506-20' for the SRAM array 3000' also respectively serve as storage node SN and SNB as discussed above.

As shown in FIG. 6A, for the SRAM cell 100A, the metal conductor 506-5 is electrically connected to the source/drain contact 430-5 through the via 504-4 and the gate structure 404-10 through the gate via 502-3; the metal conductor 506-6 is electrically connected to the source/drain contact 430-14 through the via 504-5 and the gate structure 404-6 through the gate via 502-4. For the SRAM cell 100B, the metal conductor 506-8 is electrically connected to the source/drain contact 430-15 through the via 504-7 and the gate structure 404-7 through the gate via 502-7; the metal conductor 506-9 is electrically connected to the source/drain contact 430-6 through the via 504-8 and the gate structure 404-11 through the gate via 502-8. For the SRAM cell 100C, the metal conductor 506-17 is electrically connected to the source/drain contact 430-7 through the via 504-15 and the gate structure 404-12 through the gate via 502-11; the metal conductor 506-18 is electrically connected to the source/drain contact 430-16 through the via 504-16 and the gate structure 404-8 through the gate via 502-12. For the SRAM cell 100D, the metal conductor 506-20 is electrically connected to the source/drain contact 430-17 through the via 504-18 and the gate structure 404-9 through the gate via 502-15; the metal conductor 506-21 is electrically connected to the source/drain contact 430-8 through the via 504-19 and the gate structure 404-13 through the gate via 502-16.

As shown in FIG. 7A, for the SRAM cell 100A', the metal conductor 506-2' is electrically connected to the source/drain contact 430-12' through the via 504-2' and the gate structure 404-8' through the gate via 502-3'; the metal conductor 506-3' is electrically connected to the source/drain contact 430-3' through the via 504-3' and the gate structure 404-12' through the gate via 502-4'. For the SRAM cell 100B', the metal conductor 506-9' is electrically connected to the source/drain contact 430-4' through the via 504-7' and the gate structure 404-13' through the gate via 502-9'; the metal conductor 506-10' is electrically connected to the source/drain contact 430-13' through the via 504-8' and the gate structure 404-9' through the gate via 502-10'. For the SRAM cell 100C', the metal conductor 506-12' is electrically connected to the source/drain contact 430-14' through the via 504-10' and the gate structure 404-10' through the gate via 502-13'; the metal conductor 506-13' is electrically connected to the source/drain contact 430-5' through the via 504-11' and the gate structure 404-14' through the gate via 502-14'. For the SRAM cell 100D', the metal conductor 506-19' is electrically connected to the source/drain contact 430-6' through the via 504-15' and the gate structure 404-15' through the gate via 502-19'; the metal conductor 506-20' is electrically connected to the source/drain contact 430-15' through the via 504-16' and the gate structure 404-11' through the gate via 502-20'.

Since the metal conductors 506-5, 506-9, 506-17, 506-21, 506-3', 506-9', 506-13', and 506-19' are respectively connected to the source/drain contacts 430-5, 430-6, 430-7, 430-8, 430-3', 430-4', 430-5', and 430-6' that correspond to the storage node SN, the metal conductors 506-6, 506-8, 506-18, 506-20, 506-2', 506-10', 506-12' and 506-20' are respectively connected to the source/drain contacts 430-14, 430-15, 430-16, 430-17, 430-12', 430-13', 430-14', and 430-15' that corresponds to the storage node SNB, the metal conductors 506-5, 506-9, 506-17, 506-21, 506-3', 506-9', 506-13', 506-19', 506-6, 506-8, 506-18, 506-20, 506-2', 506-10', 506-12' and 506-20' may also be referred to as storage node lines or storage node conductors.

In some embodiments, the metal conductors 510-5 and 510-7 for the SRAM array 3000 and the metal conductors 510-3' and 510-5' for the SRAM array 3000' respectively serve as the word-lines WL discussed above that controls and electrically connected to the gate structures (more specifically, the gate electrodes) of the pass-gate transistors PG-11, PG-12, PG-21, PG-22, PG-31, PG-32, PG-41, PG-42, PG-11', PG-12', PG-21', PG-22', PG-31', PG-32', PG-41', and PG-42'.

As shown in FIGS. 6A to 6D, for the SRAM cell 100A, the metal conductor 510-5 is electrically connected to the gate structure 404-1 of the pass-gate transistor PG-11 through the via 508-1, the metal conductor 506-1, and the gate via 502-1, and is electrically connected to the gate structure 404-14 of the pass-gate transistor PG-12 through the via 508-1, the metal conductor 506-1, and the gate via 502-2. For the SRAM cells 100B and 100C, the metal conductor 510-7 is electrically connected to the gate structure 404-3 shared by the pass-gate transistor PG-21 of the SRAM cell 100B and the pass-gate transistor PG-31 of the SRAM cell 100C through the via 508-8, the metal conductor 506-13, and the gate via 502-9, and is electrically connected to the gate structure 404-16 shared by the pass-gate transistor PG-22 of the SRAM cell 100B and the pass-gate transistor PG-32 of the SRAM cell 100C through the via 508-8, the metal conductor 506-13, and the gate via 502-10. For the SRAM cell 100D, the metal conductor 510-5 is electrically connected to the gate structure 404-5 of the pass-gate transistor PG-41 through the via 508-15, the metal conductor 506-25, and the gate via 502-17, and is electrically connected to the gate structure 404-18 of the pass-gate transistor PG-42 through the via 508-15, the metal conductor 506-25, and the gate via 502-18.

As shown in FIGS. 7A to 7D, for the SRAM cell 100A', the metal conductor 510-3' is electrically connected to the gate structure 404-2' of the pass-gate transistor PG-11' through the via 508-1', the metal conductor 506-4', and the gate via 502-5', and is electrically connected to the gate structure 404-17' of the pass-gate transistor PG-12' through the via 508-1', the metal conductor 506-4', and the gate via 502-6'. For the SRAM cell 100B', the metal conductor 510-5' is electrically connected to the gate structure 404-3' of the pass-gate transistor PG-21' through the via 508-5', the metal conductor 506-8', and the gate via 502-7', and is electrically connected to the gate structure 404-18' of the pass-gate transistor PG-22' through the via 508-5', the metal conductor 506-8', and the gate via 502-8'. For the SRAM cell 100C', the metal conductor 510-5' is electrically connected to the gate structure 404-5' of the pass-gate transistor PG-31' through the via 508-6', the metal conductor 506-14', and the gate via 502-15', and is electrically connected to the gate structure 404-20' of the pass-gate transistor PG-32' through the via 508-6', the metal conductor 506-14', and the gate via 502-16'. For the SRAM cell 100D', the metal conductor 510-3' is electrically connected to the gate structure 404-6' of the pass-gate transistor PG-41' through the via 508-10', the metal conductor 506-18', and the gate via 502-17', and is electrically connected to the gate structure 404-21' of the pass-gate transistor PG-42' through the via 508-10', the metal conductor 506-18', and the gate via 502-18'.

In some embodiments, the metal conductors 510-5, 510-7, 510-3', and 510-5' may be referred to as word-line conductors. In some embodiments, the metal conductors 506-1, 506-13, 506-25, 506-4', 506-8', 506-14', and 506-18' may be referred to as write word-line landing pads.

In some embodiments, the metal conductors 514-2, 514-3, 514-5, 514-6, 514-8, 514-9, 514-11, and 514-12 for the SRAM array 3000 and the metal conductors 514-1', 514-3', 514-4', and 514-6' for the SRAM array 3000' respectively serve as the bit-line BL and the bit-line-bar BLB discussed above that electrically connected to the source/drain features 412N of the pass-gate transistors PG-11, PG-12, PG-21, PG-22, PG-31, PG-32, PG-41, PG-42, PG-11', PG-12', PG-21', PG-22', PG-31', PG-32', PG-41', and PG-42'.

As shown in FIGS. 6A to 6D, for the SRAM cell 100A, the metal conductor 514-2 is electrically connected to the source/drain feature 412N of the pass-gate transistor PG-12 through the via 512-2, the metal conductor 510-8, the via 508-4, the metal conductor 506-4, the via 504-3, and the source/drain contact 430-18; and the metal conductor 514-3 is electrically connected to the source/drain feature 412N of the pass-gate transistor PG-11 through the via 512-3, the metal conductor 510-1, the via 508-2, the metal conductor 506-2, the via 504-1, and the source/drain contact 430-1. For the SRAM cell 100B, the metal conductor 514-5 is electrically connected to the source/drain feature 412N of the pass-gate transistor PG-21 through the via 512-5, the metal conductor 510-2, the via 508-5, the metal conductor 506-10, the via 504-9, and the source/drain contact 430-2; and the metal conductor 514-6 is electrically connected to the source/drain feature 412N of the pass-gate transistor PG-22 through the via 512-6, the metal conductor 510-9, the via 508-7, the metal conductor 506-12, the via 504-11, and the source/drain contact 430-19. For the SRAM cell 100C, the metal conductor 514-8 is electrically connected to the source/drain feature 412N of the pass-gate transistor PG-32 through the via 512-8, the metal conductor 510-10, the via 508-11, the metal conductor 506-16, the via 504-14, and the source/drain contact 430-20; and the metal conductor 514-9 is electrically connected to the source/drain feature 412N of the pass-gate transistor PG-31 through the via 512-9, the metal conductor 510-3, the via 508-9, the metal conductor 506-14, the via 504-12, and the source/drain contact 430-3. For the SRAM cell 100D, the metal conductor 514-11 is electrically connected to the source/drain feature 412N of the pass-gate transistor PG-41 through the via 512-11, the metal conductor 510-4, the via 508-12, the metal conductor 506-22, the via 504-20, and the source/drain contact 430-4; and the metal conductor 514-12 is electrically connected to the source/drain feature 412N of the pass-gate transistor PG-42 through the via 512-12, the metal conductor 510-11, the via 508-14, the metal conductor 506-24, the via 504-22, and the source/drain contact 430-21.

As shown in FIGS. 7A to 7D, for the SRAM cells 100A' and 100B', the metal conductor 514-1' is electrically connected to the source/drain features 412N of the pass-gate transistors PG-11' and PG-21' through the via 512-1', the metal conductor 510-1', the via 508-2', the metal conductor 506-5', the via 504-4', and the source/drain contact 430-1'; and the metal conductor 514-3' is electrically connected to the source/drain features 412N of the pass-gate transistors PG-12' and PG-22' through the via 512-3', the metal conductor 510-6', the via 508-4', the metal conductor 506-7', the via 504-6', and the source/drain contact 430-16'. For the SRAM cells 100C' and 100D', the metal conductor 514-4' is electrically connected to the source/drain features 412N of the pass-gate transistors PG-32' and PG-42' through the via 512-4', the metal conductor 510-7', the via 508-9', the metal conductor 506-17', the via 504-14', and the source/drain contact 430-17'; and the metal conductor 514-6' is electrically connected to the source/drain features 412N of the pass-gate transistors PG-31' and PG-41' through the via 512-6', the metal conductor 510-2', the via 508-7', the metal conductor 506-15', the via 504-12', and the source/drain contact 430-2'.

In some embodiments, the metal conductors 514-3, 514-5, 514-9, 514-11, 514-1', and 514-6' may be referred to as bit-line conductors, and the metal conductors 514-2, 514-6, 514-8, 514-12, 514-3', and 514-4' may be referred to as bit-line-bar conductors. In some embodiments, the metal conductors 510-1, 510-2, 510-3, 510-4, 506-2, 506-10, 506-14, 506-22, 510-1', 510-2', 506-5', and 506-15' may be referred to as bit-line landing pads, and the metal conductors 510-8, 510-9, 510-10, 510-11, 506-4, 506-12, 506-16, 506-24, 510-6', 510-7', 506-7, and 506-17' may be referred to as bit-line-bar landing pads.

In some embodiments, the metal conductors 514-1, 514-4, 514-7, 514-10, and 514-13 for the SRAM array 3000 and the metal conductors 514-2' and 514-5' for the SRAM array 3000' serve as VSS lines that are coupled together, electrically coupled to a voltage source (not shown) (e.g., the reference voltage VSS discussed above), and electrically connected to the source/drain features 412N of the pull-down transistors PD-11, PD-12, PD-21, PD-22, PD-31, PD-32, PD-41, PD-42, PD-11', PD-12', PD-21', PD-22', PD-31', PD-32', PD-41', and PD-42'.

As shown in FIGS. 6A and 6B, the metal conductor 506-3 is electrically connected to the source/drain feature 412N shared by the pull-down transistors PD-11 and PD-12 through the via 504-2 and the source/drain contact 430-9; the metal conductors 506-11 and 506-15 are electrically connected to the source/drain feature 412N shared by the pull-down transistors PD-21 and PD-22 and the source/drain feature 412N shared by the pull-down transistors PD-31 and PD-32 through the vias 504-20 and 504-13 and the source/ drain contact 430-11; the metal conductor 506-23 is electrically connected to the source/drain feature 412N shared by the pull-down transistors PD-41 and PD-42 through the via 504-21 and the source/drain contact 430-13. As shown in FIG. 6C, the metal conductor 510-6 is electrically connected to the metal conductor 506-3 through the via 508-3, the metal conductor 506-11 through the via 508-6, the metal conductor 506-15 through the via 508-10, and the metal conductor 506-23 through the via 508-13. As shown in FIG. 6D, the metal conductors 514-1, 514-4, 514-7, 514-10, and 514-13 are electrically connected to the metal conductor 510-6 through the vias 512-1, 512-4, 512-7, 512-10, and 512-13, respectively.

As shown in FIGS. 7A and 7B, the metal conductor 506-6' is electrically connected to the source/drain feature 412N shared by the pull-down transistors PD-11' and PD-12' and the source/drain feature 412N shared by the pull-down transistors PD-21' and PD-22' through the via 504-5' and the source/drain contact 430-8'; and the metal conductor 506-16' is electrically connected to the source/drain feature 412N shared by the pull-down transistors PD-31' and PD-32' and the source/drain feature 412N shared by the pull-down transistors PD-41' and PD-42' through the via 504-13' and the source/drain contact 430-10'. As shown in FIG. 7C, the metal conductor 510-4' is electrically connected to the metal conductor 506-6' through the via 508-3' and the metal conductor 506-16' through the via 508-8'. As shown in FIG. 7D, the metal conductors 514-2' and 514-5' are electrically connected to the metal conductor 510-4' through the vias 512-2' and 512-5', respectively.

As such, the metal conductors 506-3, 506-11, 506-15, 506-23, 510-6, 514-1, 514-4, 514-7, 514-10, and 514-13 and vias 504-2, 504-10, 504-13, 504-21, 508-3, 508-6, 508-10, 508-13, 512-1, 512-4, 512-7, 512-10, and 512-13 may construct a power mesh for SRAM array 3000, and the metal conductors 506-6', 506-16', 510-4', 514-2', and 514-5' and vias 504-5', 504-13', 508-3, 508-8, 512-2', and 512-5' may construct a power mesh for SRAM array 3000', to supply the reference voltage VSS to the pull-down transistors. In some embodiments, the metal conductors 506-3, 506-11, 506-15, 506-23, 506-6', and 506-16' serve as and are referred to as VSS local connections. In some embodiments, the metal conductors 510-6, 514-1, 514-4, 514-7, 514-10, 514-13, 510-4', 514-2', and 514-5' may be referred to as VSS conductors or VSS lines.

The ILD layer 426 and the IMD 516 each may include one or more dielectric layers including dielectric materials, such as tetraethylorthosilicate (TEOS) oxide, un-doped silicate glass, or doped silicon oxide such as borophosphosilicate glass (BPSG), fluoride-doped silica glass (FSG), phospho-silicate glass (PSG), boron doped silicon glass (BSG), a low-k dielectric material, other suitable dielectric material, or a combination thereof.

The materials of the gate vias 502 and 502', vias 504 and 504', the metal conductors 506 and 506', the vias 508 and 508', the metal conductors 510 and 510', the vias 512 and 512', and the metal conductors 514 and 514' are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

Figures 8A, 8B:
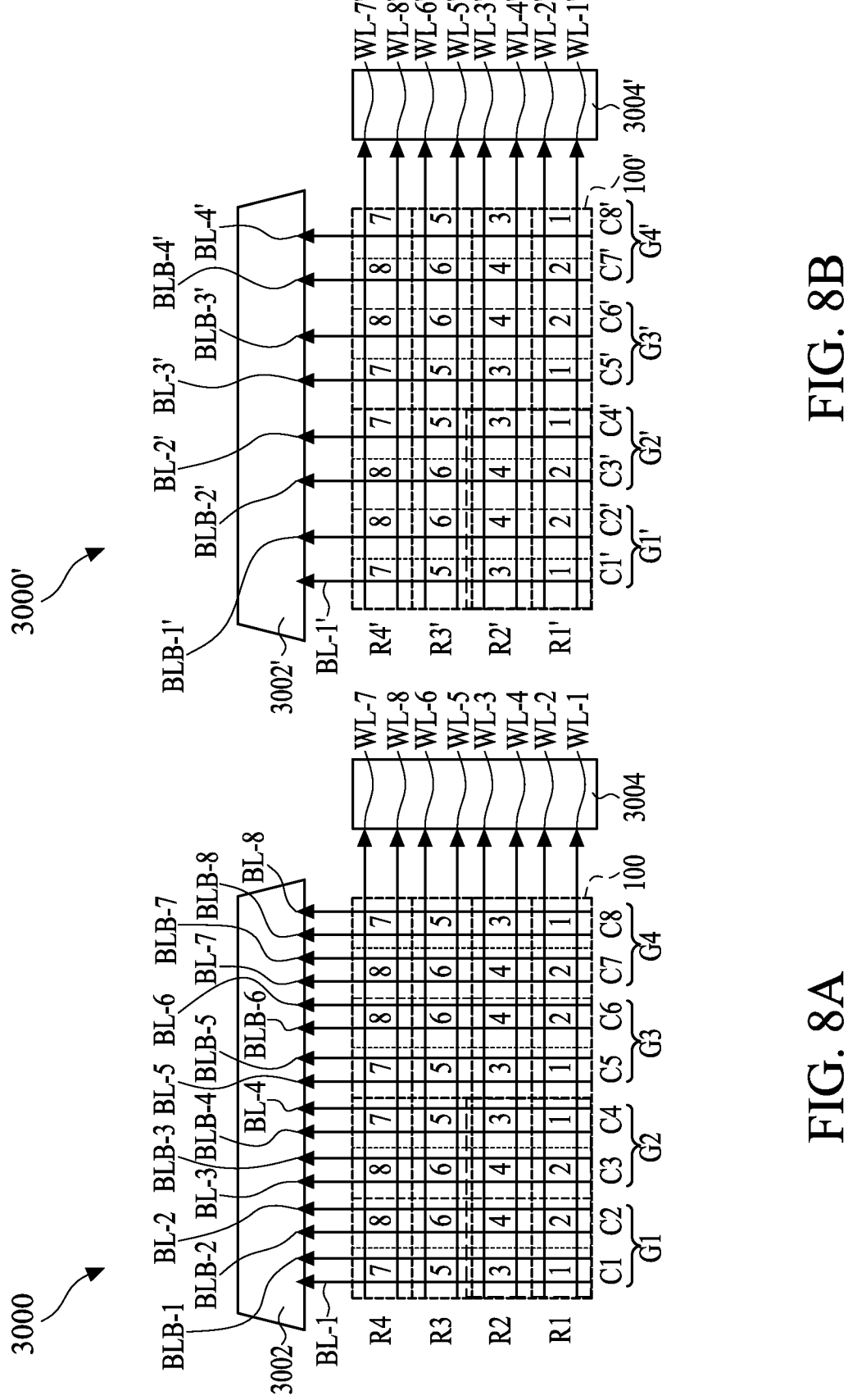
FIG. 8A is a schematic illustration of an SRAM array for high-speed applications, in accordance with some alternative embodiments of the present disclosure.
FIG. 8B is a schematic illustration of an SRAM array for high density usage, in accordance with some alternative embodiments of the present disclosure.

FIG. 8A is a schematic illustration of the above SRAM array 3000 for high-speed applications, in accordance with some alternative embodiments of the present disclosure. FIG. 8B is a schematic illustration of the above SRAM array 3000' for high density usage, in accordance with some alternative embodiments of the present disclosure. As shown in FIGS. 8A and 8B, the SRAM arrays 3000 and 3000' further include column multiplexers 3002 and 3002' and word-line (WL) decoder/drivers 3004 and 3004'. The SRAM arrays 3000 includes rows R1 to R4 and columns C1 to C8 and the SRAM arrays 3000' includes rows R1' to R4' and columns C1' to C8'. The SRAM arrays 3000 further includes SRAM cell groups G1 to G4 and the SRAM arrays 3000' further includes SRAM cell groups G1' to G4'. As discussed above, each of the SRAM cell groups includes and is constructed two adjacent columns. The word-lines WL-1 to WL-8 and WL-1' to WL-8' extend in the X-direction to couple to the WL decoder/driver 3004 and 3004', which decodes or drive the cells. The bit-lines BL-1 to BL-8 and BL-1' to BL-4' and bit-line-bars BLB-1 to BLB-8 and BLB-1' to BLB-4', are coupled to the column multiplexer (MUX) 3002 and 3002'. The column MUX 350 also includes or is connected to a sense amplifier to sense and amplify data stored in the cells. The column MUX 350 may also include or is coupled to a write driver to write data into the cells.

As shown in FIGS. 8A, each of the SRAM cells 100 (including the SRAM cells 100A to 100D discussed above) in the SRAM array 3000 includes a bit-line and a bit-line-bar. More specifically, the SRAM cells 100 in the same column have one bit-line and one bit-line-bar. For example, the SRAM cell 100A in the column C1 discussed in above has the metal conductor 514-3 serving as bit-line and the metal conductor 514-2 serving as bit-line-bar. Further, as shown in FIGS. 8B, the two adjacent SRAM cells 100' (including the SRAM cells 100A' to 100D' discussed above) in the same SRAM cell groups in the SRAM array 3000' arranged in the X-direction share one bit-line and one bit-line-bar. For example, the SRAM cell 100A' and 100B' in the same column C1' discussed in above share the metal conductor 514-1' serving as bit-line and the metal conductor 514-3' serving as bit-line-bar.

As such, although the SRAM array 3000' has a smaller size for high density usage, the metal conductors serving as bit-lines and bit-line-bars in the SRAM array 3000' can be designed with a wider width in enough space, thereby having lower circuit resistance. In some embodiments, a width of the metal conductors 514-1', 514-6', 514-3', and 514-4' serving as bit-lines and bit-line-bars in the X-direction is greater than a width of the metal conductors 514-3, 514-5, 514-9, 514-11, 514-2, 514-6, 514-8, and 514-12 serving as bit-lines and bit-line-bars in the X-direction, as shown in FIGS. 6D and 7D. In some embodiments, a ratio of the width of the metal conductors 514-1', 514-6', 514-3', and 514-4' to the width of the metal conductors 514-3, 514-5, 514-9, 514-11, 514-2, 514-6, 514-8, and 514-12 is in a range from about 1.05 to about 2.

Figure 9A:
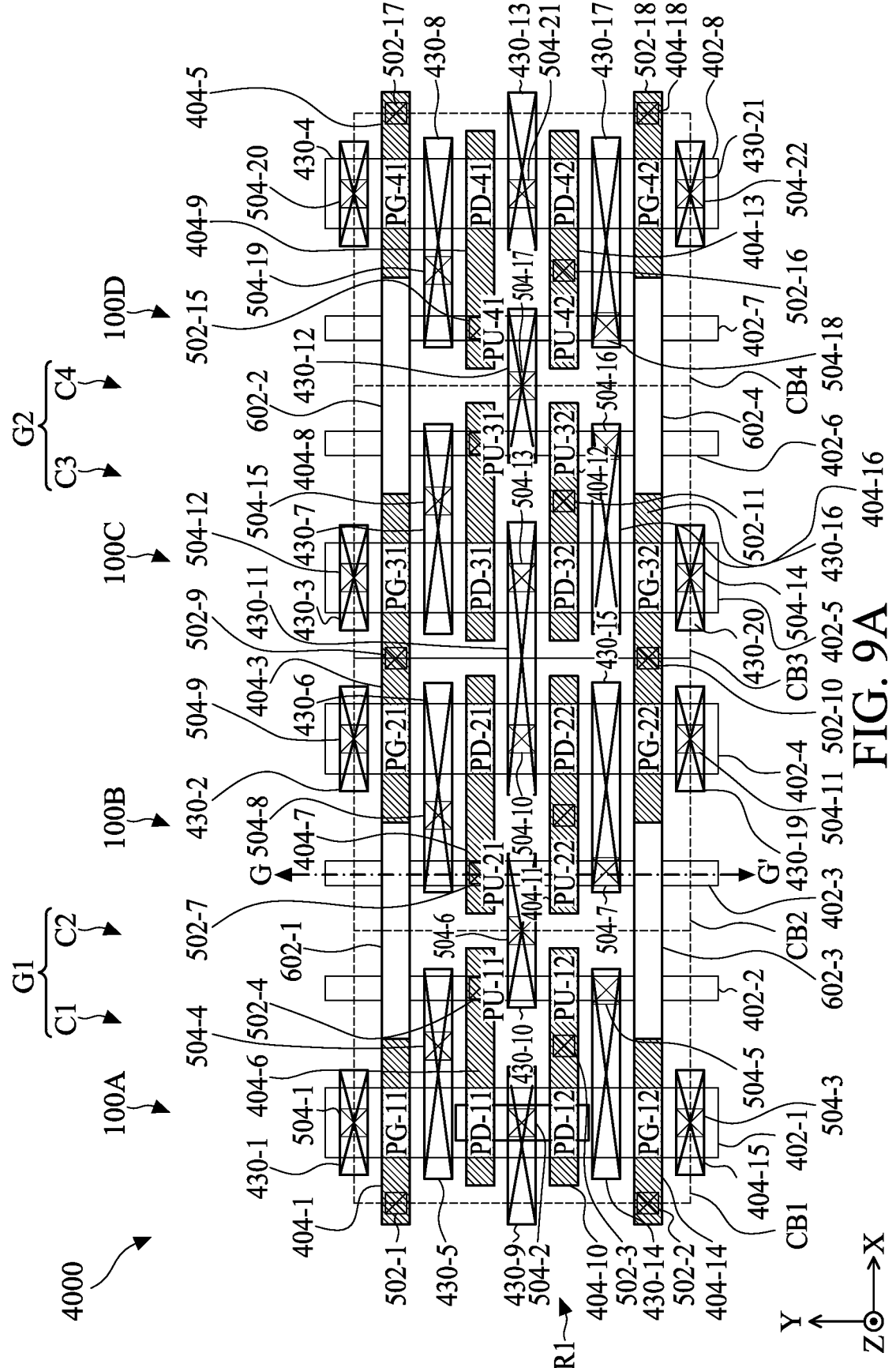
FIG. 9A is a top view (or layouts) of four SRAM cells in two adjacent groups in a portion of an alternative SRAM array for high-speed applications, in accordance with some embodiments of the present disclosure.
Figure 9B:
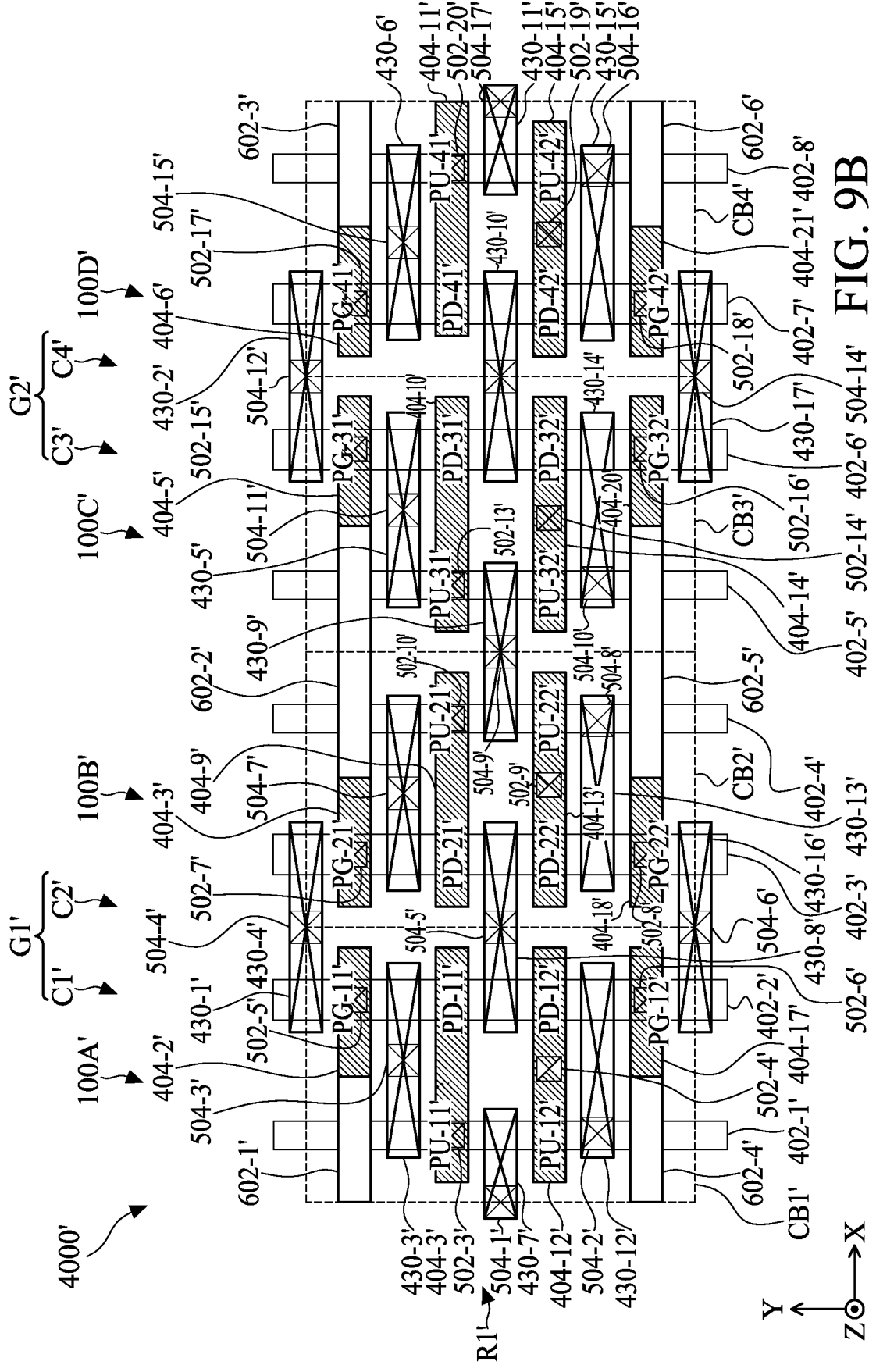
FIG. 9B is a top view (or layouts) of four SRAM cells in two adjacent groups in a portion of an alternative SRAM array for high density usage, in accordance with some embodiments of the present disclosure.
Figure 9C:
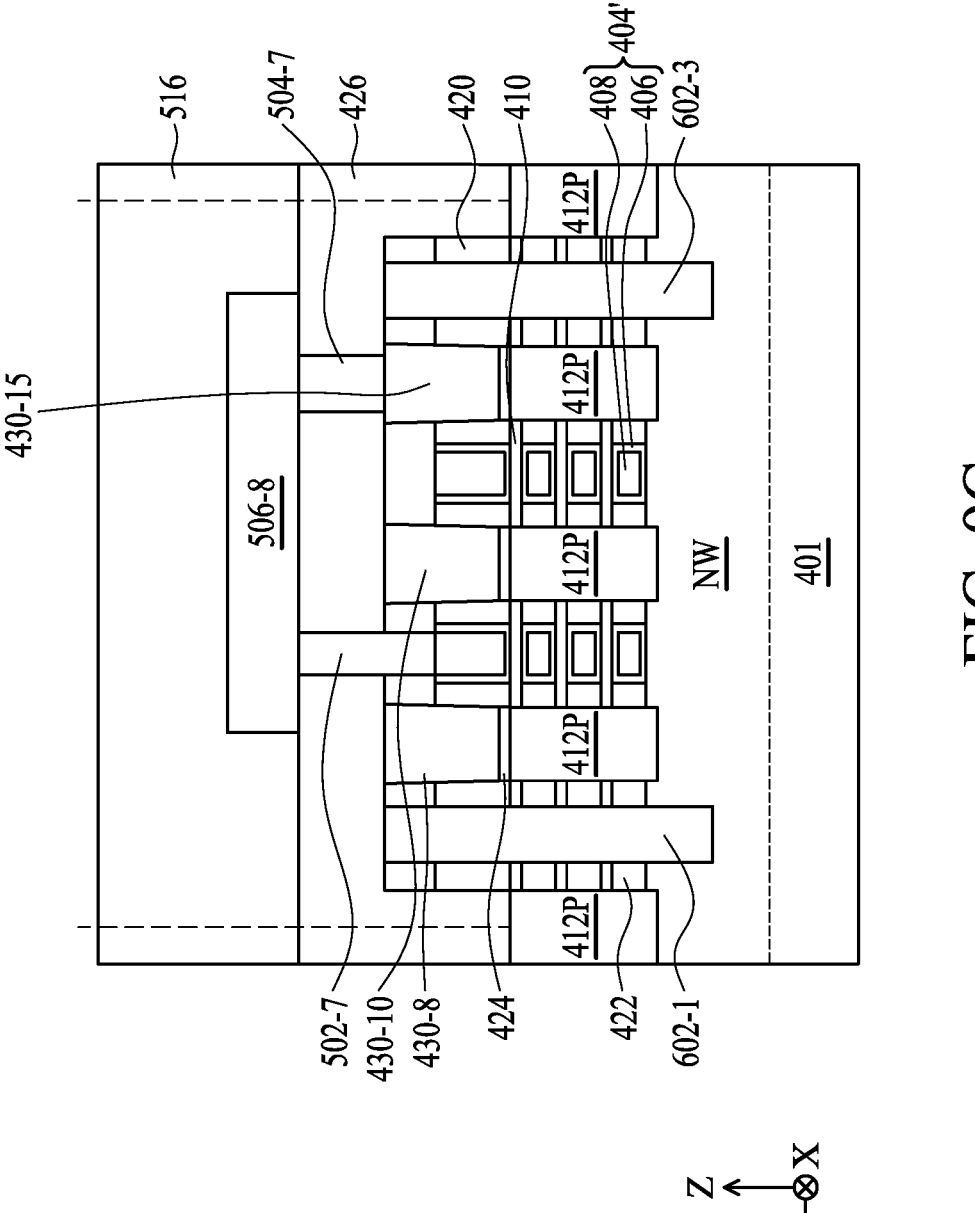
FIG. 9C is a cross-sectional view of the SRAM array along a line G-G' in FIG. 9A, in accordance with some embodiments of the present disclosure.

FIG. 9A is a top view (or layouts) of four SRAM cells 100A to 100D in two adjacent groups G1 and G2 in a portion of an alternative SRAM array 4000 for high-speed applications, in accordance with some embodiments of the present disclosure. FIG. 9B is a top view (or layouts) of four SRAM cells 100A' to 100D' in two adjacent groups G1' and G2' in a portion of an alternative SRAM array 4000' for high density usage, in accordance with some embodiments of the present disclosure. FIG. 9C is a cross-sectional view of the SRAM array 4000 along a line G-G' in FIG. 9A, in accordance with some embodiments of the present disclosure.

FIGS. 9A and 9B illustrates the features in the device region (including transistors) and vias vertically between the features and the first metal layer (M1, not shown). For the sake of simplicity, FIG. 9C shows the features in the device region, the metal conductors in the first metal layer (M1), and vias vertically between the features and the first metal layer (M1). The vias and the metal conductors in higher metal layers (higher than the first metal layer (M1)) are omitted.

The cell structure and interconnection structure shown in FIGS. 9A to 9C are similar to that shown in FIGS. 6A, 7A, and 6E discussed above, except that the SRAM arrays 4000 and 4000' further include dielectric structures serving as isolation structure for cutting the active areas and isolation, rather than isolation transistors.

Referring to FIGS. 9A and 9B, similar to FIGS. 6A and 7A, the active areas 402-2, 402-3, 402-6, 402-7, 402-1', 402-4', 402-5', and 402-8' are continuous to extend across the entirety of the SRAM arrays 4000 and 4000' in the Y-direction. The difference between the SRAM arrays 3000 and 3000' in FIGS. 6A and 7A and the SRAM arrays 4000 and 4000' in FIGS. 9A and 9B is that the SRAM arrays 4000 and 4000' further includes dielectric structures 602-1 to 602-4 (which may be collectively referred to as the dielectric structures 602) and 602-1' to 602-6' (which may be collectively referred to as the dielectric structures 602') to replace the gate structures 404-2, 404-4, 404-15, 404-17, 404-1', 404-4', 404-7', 404-16', 404-19', and 404-22'.

The dielectric structures 602 and 602' extend lengthwise in the X-direction. As shown in FIG. 9A, the dielectric structure 602-1, the pull-up transistor PU-11, the pull-up transistor PU-12, and dielectric structure 602-3 are arranged in the Y-direction; the dielectric structure 602-1, the pull-up transistor PU-21, the pull-up transistor PU-22, and dielectric structure 602-3 are arranged in the Y-direction; the dielectric structure 602-2, the pull-up transistor PU-31, the pull-up transistor PU-32, and dielectric structure 602-4 are arranged in the Y-direction; and the dielectric structure 602-2, the pull-up transistor PU-41, the pull-up transistor PU-42, and dielectric structure 602-4 are arranged in the Y-direction.

As shown in FIG. 9B, the dielectric structure 602-1', the pull-up transistor PU-11', the pull-up transistor PU-12', and dielectric structure 602-4' are arranged in the Y-direction; the dielectric structure 602-2', the pull-up transistor PU-21', the pull-up transistor PU-22', and dielectric structure 602-5' are arranged in the Y-direction; the dielectric structure 602-2', the pull-up transistor PU-31', the pull-up transistor PU-32', and dielectric structure 602-5' are arranged in the Y-direction; and the dielectric structure 602-3', the pull-up transistor PU-41', the pull-up transistor PU-42', and dielectric structure 602-6' are arranged in the Y-direction.

In some embodiments, the dielectric structure 602-1 is aligned and in contact with the gate structures 404-1 and 404-3 in the X-direction; the dielectric structure 602-2 is aligned and in contact with the gate structures 404-3 and 404-5 in the X-direction; dielectric structure 602-3 is aligned and in contact with the gate structures 404-14 and 404-16 in the X-direction; and dielectric structure 602-4 is aligned and in contact with the gate structures 404-16 and 404-18 in the X-direction, as shown in FIG. 9A.

In some embodiments, the dielectric structure 602-1' is aligned and in contact with the gate structure 404-2' in the X-direction; the dielectric structure 602-2' is aligned and in contact with the gate structures 404-3' and 404-5' in the X-direction; the dielectric structure 602-3' is aligned and in contact with the gate structure 404-6' in the X-direction; the dielectric structure 602-4' is aligned and in contact with the gate structure 404-17' in the X-direction; the dielectric structure 602-5' is aligned and in contact with the gate structures 404-18' and 404-20' in the X-direction; and dielectric structure 602-6' is aligned and in contact with the gate structure 404-21' in the X-direction, as shown in FIG. 9B.

The dielectric structures 602-1, 602-2, 602-3, and 602-4 are used for respectively replacing the gate structures 404-2, 404-4, 404-15, and 404-17 over the active areas 402-2, 402-3, 402-6, and 402-7 to cut the active areas 402-2, 402-3, 402-6, and 402-7. The dielectric structures 602-1', 602-2', 602-3', 602-4', 602-5', and 602-6' are used for respectively replacing the gate structures 404-1', 404-4', 404-7', 404-16', 404-19', and 404-22' over the active areas 402-1', 402-4', 402-5', and 402-8' to cut the active areas 402-1', 402-4', 402-5', and 402-8'. For example, as shown in FIG. 9C, the formation of the dielectric structures 602-1 and 602-3 remove the portions of the gate structures and the nanostructures 410 therein to form trenches cutting the active areas 402-3, and then a dielectric material are formed in the trenches to form the dielectric structures 602-1 and 602-3. In some embodiments, bottom surfaces of the dielectric structures 602 and 602' are lower than topmost surfaces of the substrate 401 in a range from about 15 nm to about 150 nm, as shown in FIG. 9C.

Processes for forming the dielectric structures 602 and 602' are lithography friendly and cost reduction (no EUV processes and extra mask). In some embodiments, the dielectric structures 602 and 602' include the dielectric material such as $SiO_2$, $Si_3N_4$, SION, SiOCN, SiOC, SiCN, a metal oxide such as $HrO_2$, $ZrO_2$, hafnium aluminum oxide, and hafnium silicate, or other suitable material, and may be formed by CVD, PVD, ALD, or other suitable methods.

The transistors of the SRAM cells discussed above each has a GAA structure or is GAA transistor with nanostructures. In some embodiments, the transistors of the SRAM cells discussed above may be FinFET with fin structures as channels. In these embodiments, the active areas of the SRAM cells with nanostructures in the channel regions are replaced with the active areas of the SRAM cells with fin structures in the channel regions. Further, the pass-gate transistors and the pull-down transistors in the SRAM array for high-speed applications are FinFETs with multiple fin structures; and the pull-up transistors in the SRAM array for high-speed applications and the pass-gate transistors, the pull-down transistors, and the pull-up transistors in the SRAM array for high density usage are FinFETs with single fin structure.

Figures 10A, 10B:
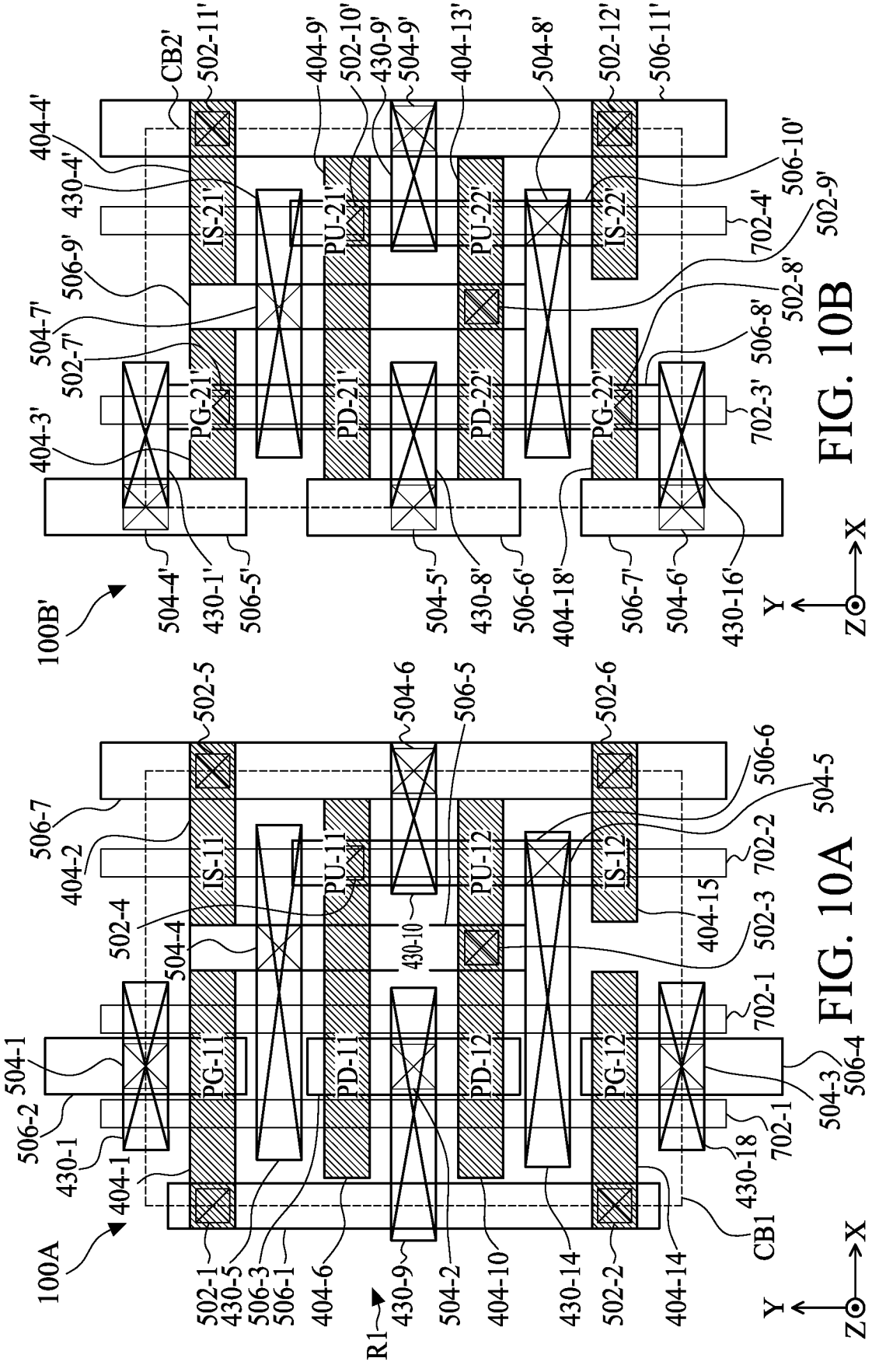
FIG. 10A is a top view (or layouts) of the SRAM cell constructed with FinFETs in a portion of the SRAM array for high-speed applications, in accordance with some embodiments of the present disclosure.
FIG. 10B is a top view (or layouts) of the SRAM cell constructed with FinFETs in a portion of the SRAM array for high density usage, in accordance with some embodiments of the present disclosure.

For example, as shown in FIGS. 10A and 10B, the active areas 402-1 and 402-2 of the SRAM cell 100A in FIG. 6A are replaced with the active areas 702-1 and 702-2 (which may be collectively referred to as the active areas 702) that extend lengthwise in the Y-direction; and the active areas 402-3' and 402-4' of the SRAM cell 100B' in FIG. 7A are replaced with the active areas 702-3' and 702-4' (which may be collectively referred to as the active areas 702') that extend lengthwise in the Y-direction. In these embodiments, one active area may represent one fin structure in its channel regions. Therefore, the SRAM cell 100A includes two active areas 702-1 represent the SRAM cell 100A includes two fin structures in the active areas 702-1 for the pass-gate transistors PG-11 and PG-12 and the pull-down transistors PD-11 and PD-12. As such, a number of the fin structures in the channel regions of the active areas 702-1 of the SRAM cell 100A (two fin structures) is greater than a number of the fin structures in the channel regions of the active area 702-2 of the SRAM cell 100A (one fin structure), a number of the fin structures in the channel regions of the active area 702-3' of the SRAM cell 100B' (one fin structure), or a number of the fin structures in the channel regions of the active area 702-4' of the SRAM cell 100B' (one fin structure).

Figure 11A:
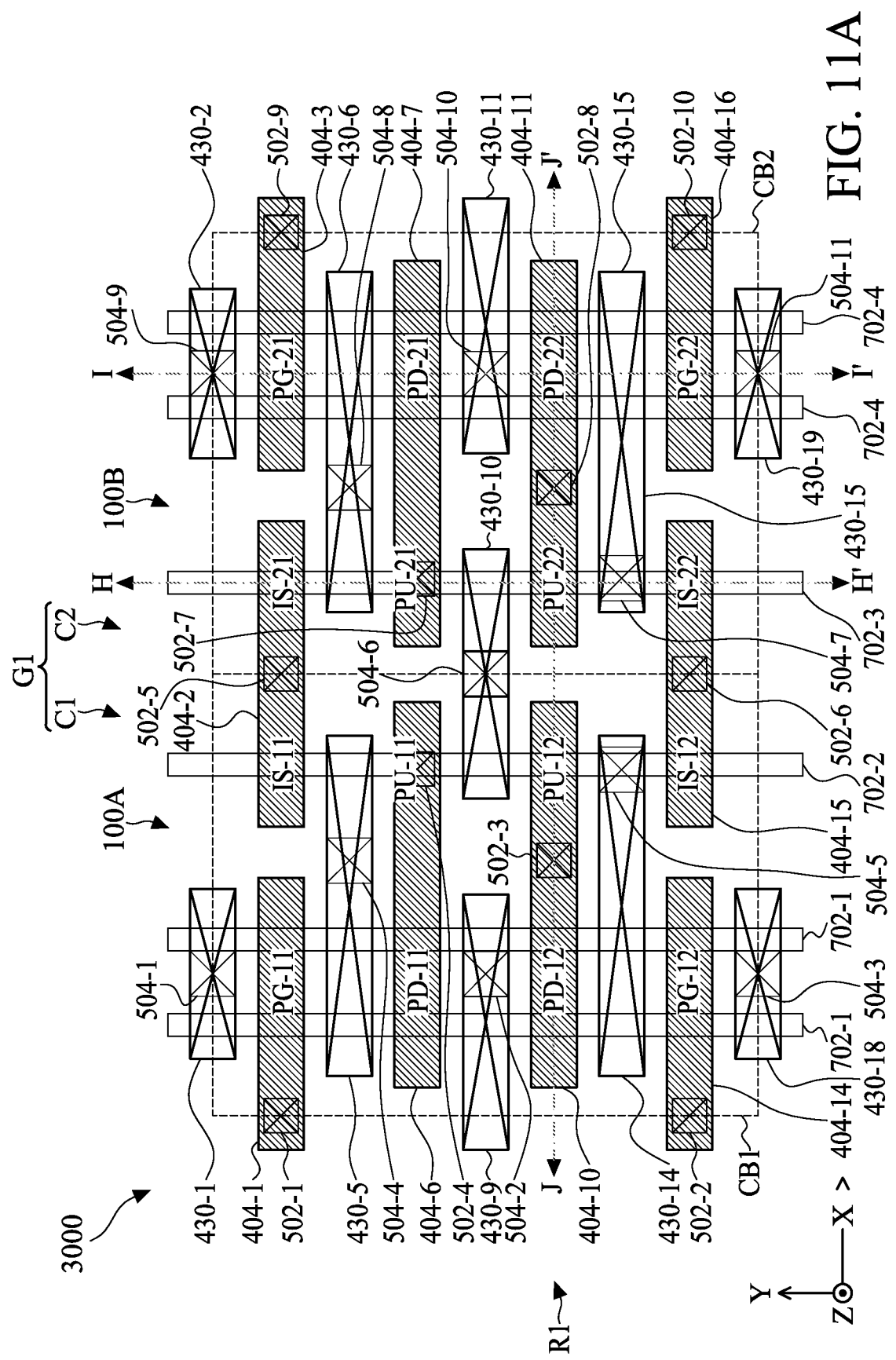
FIGS. 11A and 11B are top views (or layouts) of two SRAM cells constructed with FinFETs in a portion of the SRAM array for high-speed applications that can be one embodiment implemented in the memory region, in accordance with some embodiments of the present disclosure.
Figure 11B:
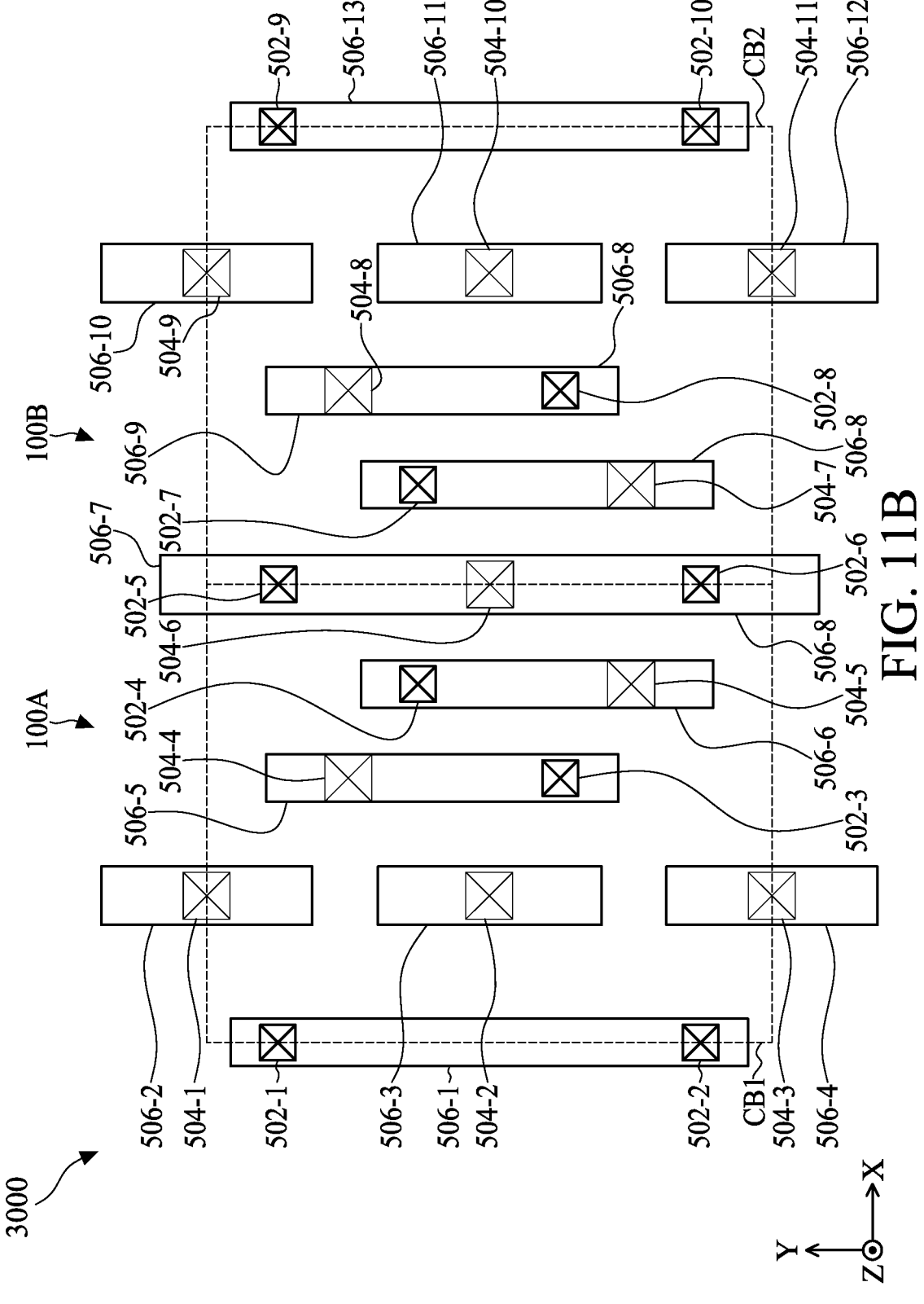
Figure 11C:
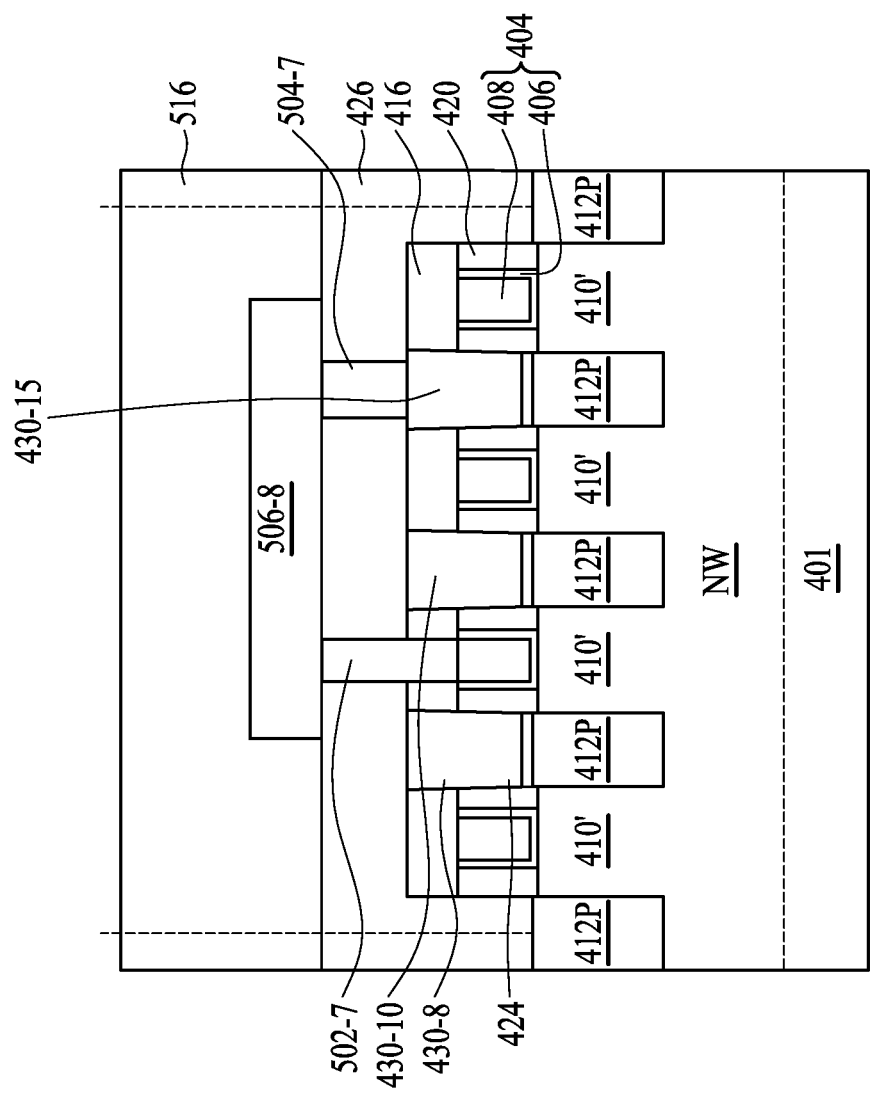
FIG. 11C is a cross-sectional view of the SRAM array along a line H-H' in FIG. 11A, in accordance with some embodiments of the present disclosure.
Figure 11D:
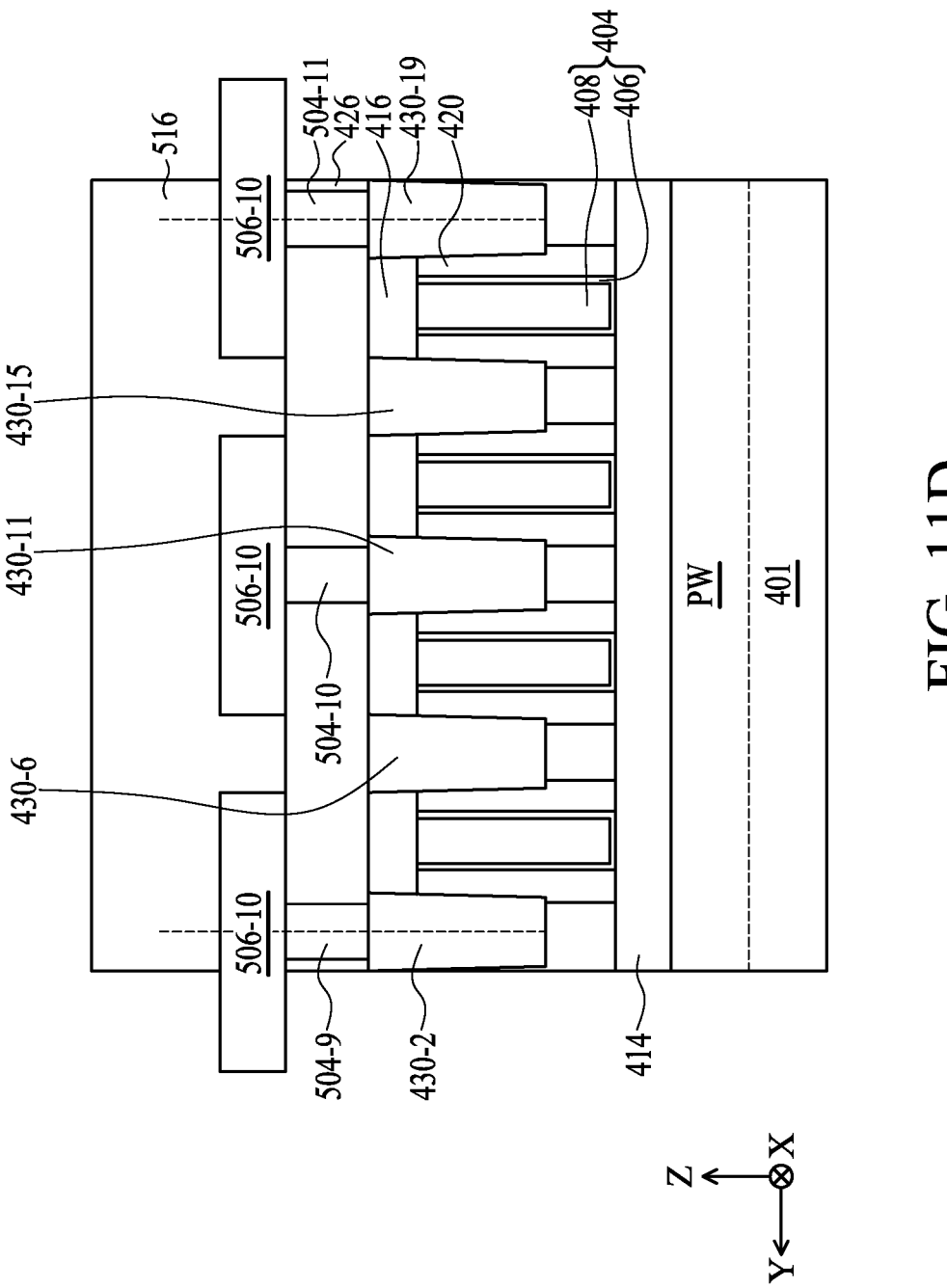
FIG. 11D is a cross-sectional view of the SRAM array along a line I-I' in FIG. 11A, in accordance with some embodiments of the present disclosure.
Figure 11E:
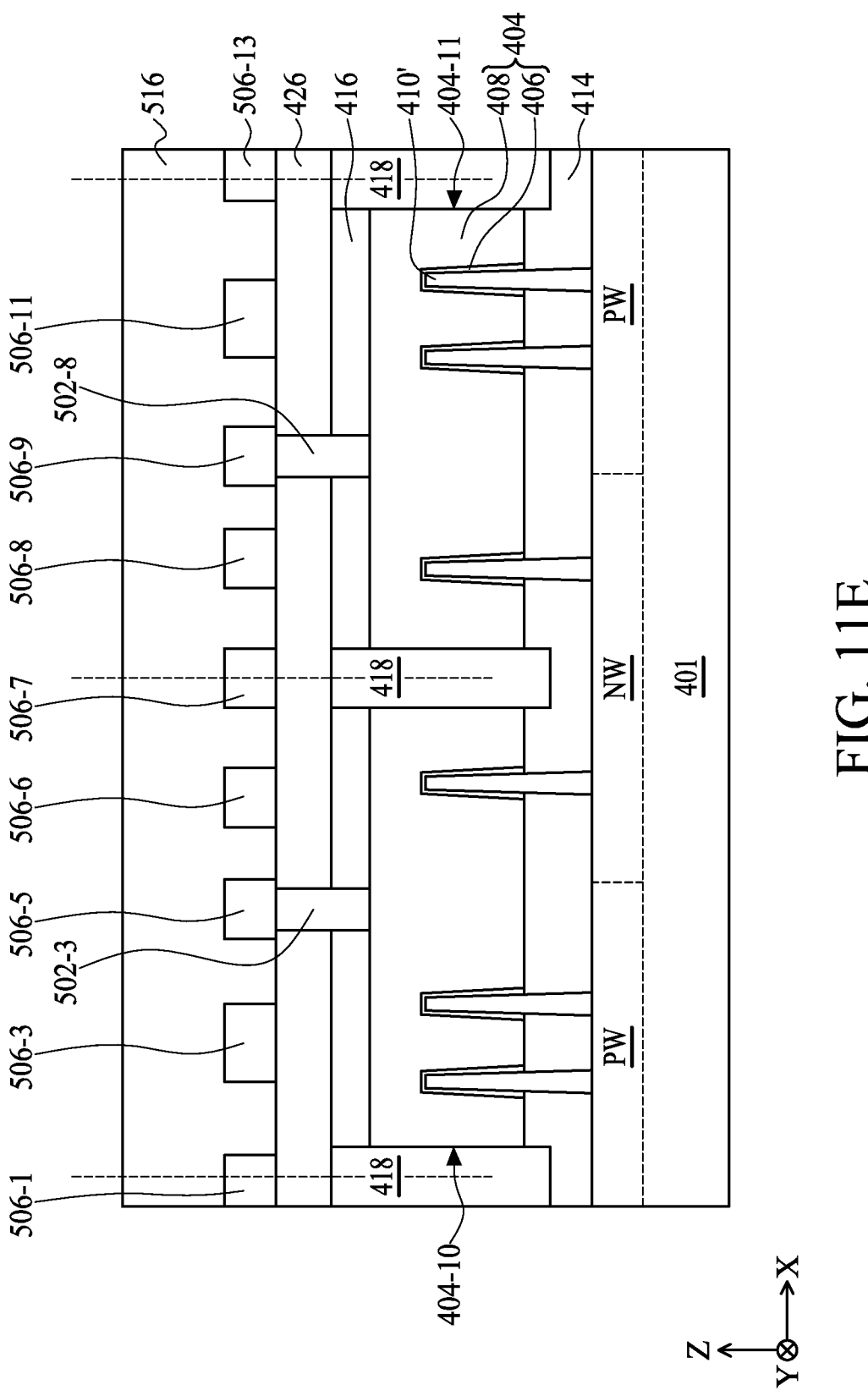
FIG. 11E is a cross-sectional view of the SRAM array along a line J-J' in FIG. 11A, in accordance with some embodiments of the present disclosure.

FIGS. 11A to 11E show an example of the structure of the SRAM cells constructed with FinFETs. FIGS. 11A and 11B are top views (or layouts) of two SRAM cells 100A and 100B constructed with FinFETs in a portion of the SRAM array 3000 for high-speed applications, in accordance with some embodiments of the present disclosure. FIG. 11C is a cross-sectional view of the SRAM array along a line H-H' in FIG. 11A, in accordance with some embodiments of the present disclosure. FIG. 11D is a cross-sectional view of the SRAM array along a line I-I' in FIG. 11A, in accordance with some embodiments of the present disclosure. FIG. 11E is a cross-sectional view of the SRAM array along a line J-J' in FIG. 11A, in accordance with some embodiments of the present disclosure.

As show in FIGS. 11A and 11B, the active areas 402-1 to 402-4 in FIG. 6A are replaced with the active areas 702-1 to 702-4, (which may be collectively referred to as the active areas 702) that extend lengthwise in the Y-direction and are arranged in the X-direction. Each of the transistors in the SRAM cell 100A (e.g., the pass-gate transistors PG-11 and PG-12, the pull-down transistors PD-11 and PD-12, the pull-up transistors PU-11 and PU-12, and the isolation transistors IS-11 and IS-12) and the transistors in the SRAM cell 100B (e.g., the pass-gate transistors PG-21 and PG-22, the pull-down transistors PD-21 and PD-22, the pull-up transistors PU-21 and PU-22, and the isolation transistors IS-21 and IS-22) includes one or more fin structures 410' in the channel regions of the respective active areas 702-1 to 702-4. More specifically, as discussed above, the pass-gate transistors PG-11, PG-12, PG-21, and PG-22 and the pull-down transistors PD-11, PD-12, PD-21, and PD-22 each includes two fin structures 410'; and the pull-up transistors PU-11, PU-12, PU-21, and PU-22 and the isolation transistors IS-11, IS-12, IS-21, and IS-22 each includes one fin structure 410'.

In some embodiments, the gate structures 404 wrap and/or surround the fin structures 410' (as shown in FIGS. 11C to 13E). The fin structures 410' are referred to and/or serve as channels, channel layers, and channel members of the transistors discussed above. As shown in FIGS. 13C and 13D, the fin structures 410' each extends in the Y-direction to connect one source/drain feature 412N/412P to the other source/drain feature 412N/412P. As shown in FIGS. 13C to 13E, the fin structures 410' are protruded from the substrate 401.

The embodiments disclosed herein relate to memory devices, and more particularly to memory devices including SRAM arrays with different size and interconnection design for different applications. Furthermore, the present embodiments provide one or more of the following advantages. The SRAM array with smaller size for high density usage has SRAM cell groups arranged in the X-direction. Each of the SRAM cell groups includes two adjacent columns of the SRAM cells share one bit-line and one bit-line-bar. Therefore, the SRAM array with smaller size for high density usage can be designed with bit-lines and bit-line-bars with a wider width, thereby having lower circuit resistance. Further, the word-lines, bit-lines, and the bit-line-bars of the SRAM arrays are designed to be located in different metal layer for having larger width, thereby decreasing circuit resistance, which improves the performance of the SRAM arrays, such as RC delay.

Thus, one of the embodiments of the present disclosure describes a memory device that includes a first static random-access memory (SRAM) array having first SRAM cell groups arranged in an X-direction and a second SRAM array having second SRAM cell groups arranged in the X-direction. Each of the first SRAM cell groups includes two adjacent first SRAM cells arranged in the X-direction. Each of the first SRAM cells includes a first bit-line conductor and a first bit-line-bar conductor extending in the Y-direction. Each of the second SRAM cell groups includes two adjacent second SRAM cells arranged in the X-direction and sharing a second bit-line conductor and a second bit-line-bar conductor extending in the Y-direction. A first cell size of the first SRAM cells is larger than a second cell size of the second SRAM cells.

In some embodiments, each of the first SRAM cells and the second SRAM cells includes a first active area extending in the Y-direction and a second active area extending in the Y-direction. The first active area includes channel regions of a first pull-down (PD) transistor, a second PD transistor, a first pass-gate (PG) transistor, and a second PG transistor. The second active area includes channel regions of a first pull-up (PU) transistor, a second PU transistor, a first isolation structure, and a second isolation structure.

In some embodiments, a ratio of a width of the first active areas of the first SRAM cells in the X-direction to a width of the first active areas of the second SRAM cells in the X-direction is in a range from about 1.3 to about 4. A ratio of a width of the second active areas of the first SRAM cells in the X-direction to a width of the second active areas of the second SRAM cells in the X-direction is in a range from about 1.05 to about 1.3.

In some embodiments, a ratio of a width of the first active areas of the first SRAM cells in the X-direction to a width of the second active areas of the first SRAM cells in the X-direction is in a range from about 1.3 to about 5. A ratio of a width of the first active areas of the second SRAM cells in the X-direction to a width of the second active areas of the second SRAM cells in the X-direction is in a range from about 1 to about 3.

In some embodiments, the channel regions include fin structures.

In some embodiments, a number of the fin structures in the channel regions of the first active areas of the first SRAM cells is greater than a number of the fin structures in the channel regions of the second active areas of the first SRAM cells, a number of the fin structures in the channel regions of the first active areas of the second SRAM cells, or a number of the fin structures in the channel regions of the second active areas of the second SRAM cells.

In some embodiments, the channel regions includes nano-structures vertically stacked.

In some embodiments, each of the first SRAM cells includes a first cell boundary defining the first cell size and each of the second SRAM cells includes a second cell boundary defining the second cell size. A first dimension of the first cell boundary in the Y-direction is the same as a second dimension of the second cell boundary in the Y-direction. A third dimension of the first cell boundary in the X-direction is larger than a fourth dimension of the second cell boundary in the X-direction.

In some embodiments, a ratio of the third dimension to the fourth dimension is in a range from about 1.05 to about 1.4.

In some embodiments, a ratio of the first dimension to the third dimension is in a range from about 0.45 to about 1. A ratio of the second dimension to the fourth dimension is in a range from about 0.4 to about 0.9.

In another of the embodiments, discussed is a memory device including a first static random-access memory (SRAM) array including two adjacent first SRAM cells arranged in an X-direction. Each of the first SRAM cells includes a first bit-line conductor and a first bit-line-bar conductor extending in a Y-direction. The memory device further includes a second SRAM array including two adjacent second SRAM cells arranged in the X-direction and sharing a second bit-line conductor and a second bit-line-bar conductor extending in the Y-direction. A first cell size of the first SRAM cells is larger than a second cell size of the second SRAM cells. Each of the first SRAM cells and the second SRAM cells includes a first pull-down (PD) transistor, a second PD transistor, a first pass-gate (PG) transistor, and a second PG transistor arranged in the Y-direction and sharing a first active area; and a first pull-up (PU) transistor, a second PU transistor, a first isolation structure, and a second isolation structure arranged in the Y-direction and sharing a second active area.

In some embodiments, a cell pitch of the first SRAM cells in the X-direction is greater than a cell pitch of the second SRAM cells in the X-direction.

In some embodiments, the first isolation structures and the second isolation structures are turned-off transistors.

In some embodiments, the first isolation structures and the second isolation structures are dielectric structures.

In some embodiments, the first PD transistors, the second PD transistor, the first PG transistors, the second PG transistors, the first PU transistors, and the second PU transistors are FinFET.

In some embodiments, the first PD transistors, the second PD transistor, the first PG transistors, the second PG transistors, the first PU transistors, and the second PU transistors are gate-all-around transistors.

In yet another of the embodiments, discussed is a memory device that includes a first static random-access memory (SRAM) array having first SRAM cell groups arranged in an X-direction and a second SRAM array having second SRAM cell groups arranged in the X-direction. Each of the first SRAM cell groups includes two adjacent first SRAM cells arranged in the X-direction. Each of the first SRAM cells includes a first bit-line conductor and a first bit-line-bar conductor extending in a Y-direction. Each of the second SRAM cell groups includes two adjacent second SRAM cells arranged in the X-direction and sharing a second bit-line conductor and a second bit-line-bar conductor extending in the Y-direction. A first cell size of the first SRAM cells is larger than a second cell size of the second SRAM cells. The memory device further includes a first metal layer over the first SRAM cell and the second SRAM cell, a second metal layer over the first metal layer, and a third metal layer over the second metal layer. The first metal layer includes VDD conductors extending in the Y-direction and electrically connected to source/drain features of pull-up transistors of the first SRAM cell and the second SRAM cell. The second metal layer includes word-line conductors extending in the X-direction and electrically connected to gate structures of pass-gate transistors of the first SRAM cell and the second SRAM cell. The third metal layer includes the first bit-line conductors, the first bit-line-bar conductors, the second bit-line conductors, and the second bit-line-bar conductors.

In some embodiments, the VDD conductors are further electrically connected to gate structures of isolation transistors of the first SRAM cell and the second SRAM cell, wherein the isolation transistors are p-type transistors and arranged with the pull-up transistors in the Y-direction.

In some embodiments, a width of the second bit-line conductors and the second bit-line-bar conductors in the X-direction is greater than a width of the first bit-line conductors and the first bit-line-bar conductors in the X-direction.

In some embodiments, a ratio of the width of the second bit-line conductors and the second bit-line-bar conductors to the width of the first bit-line conductors and the first bit-line-bar conductors is in a range from about 1.05 to about 2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a first static random-access memory (SRAM) array having first SRAM cell groups arranged in an X-direction, and each of the first SRAM cell groups comprises two adjacent first SRAM cells arranged in the X-direction, wherein each of the first SRAM cells comprises a first bit-line conductor and a first bit-line-bar conductor extending in a Y-direction; and
a second SRAM array having second SRAM cell groups arranged in the X-direction, wherein each of the second SRAM cell groups comprises two adjacent second SRAM cells arranged in the X-direction and sharing a second bit-line conductor and a second bit-line-bar conductor extending in the Y-direction,
wherein a first cell size of the first SRAM cells is larger than a second cell size of the second SRAM cells,
wherein a width of the second bit-line conductors in the X-direction is greater than a width of the first bit-line conductors in the X-direction.

2. The memory device of claim 1, wherein each of the first SRAM cells and the second SRAM cells comprises:
a first active area extending in the Y-direction, wherein the first active area comprises channel regions of a first pull-down (PD) transistor, a second PD transistor, a first pass-gate (PG) transistor, and a second PG transistor; and
a second active area extending in the Y-direction, wherein the second active area comprises channel regions of a first pull-up (PU) transistor, a second PU transistor, a first isolation structure, and a second isolation structure.

3. The memory device of claim 2, wherein a ratio of a width of the first active areas of the first SRAM cells in the X-direction to a width of the first active areas of the second SRAM cells in the X-direction is in a range from about 1.3 to about 4,
wherein a ratio of a width of the second active areas of the first SRAM cells in the X-direction to a width of the second active areas of the second SRAM cells in the X-direction is in a range from about 1.05 to about 1.3.

4. The memory device of claim 2, wherein a ratio of a width of the first active areas of the first SRAM cells in the X-direction to a width of the second active areas of the first SRAM cells in the X-direction is in a range from about 1.3 to about 5,
wherein a ratio of a width of the first active areas of the second SRAM cells in the X-direction to a width of the second active areas of the second SRAM cells in the X-direction is in a range from about 1 to about 3.

5. The memory device of claim 2, wherein the channel regions comprise fin structures.

6. The memory device of claim 5, wherein a number of the fin structures in the channel regions of the first active areas of the first SRAM cells is greater than a number of the fin structures in the channel regions of the second active areas of the first SRAM cells, a number of the fin structures in the channel regions of the first active areas of the second SRAM cells, or a number of the fin structures in the channel regions of the second active areas of the second SRAM cells.

7. The memory device of claim 2, wherein the channel regions comprise nanostructures vertically stacked.

8. The memory device of claim 1, wherein each of the first SRAM cells comprises a first cell boundary defining the first cell size and each of the second SRAM cells comprises a second cell boundary defining the second cell size,
wherein a first dimension of the first cell boundary in the Y-direction is the same as a second dimension of the second cell boundary in the Y-direction,
wherein a third dimension of the first cell boundary in the X-direction is larger than a fourth dimension of the second cell boundary in the X-direction.

9. The memory device of claim 8, wherein a ratio of the third dimension to the fourth dimension is in a range from about 1.05 to about 1.4.

10. The memory device of claim 8, wherein a ratio of the first dimension to the third dimension is in a range from about 0.45 to about 1,
wherein a ratio of the second dimension to the fourth dimension is in a range from about 0.4 to about 0.9.

11. A memory device, comprising:
a first static random-access memory (SRAM) array comprising two adjacent first SRAM cells arranged in an X-direction, wherein each of the first SRAM cells comprises a first bit-line conductor and a first bit-line-bar conductor extending in a Y-direction; and
a second SRAM array comprising two adjacent second SRAM cells arranged in the X-direction and sharing a second bit-line conductor and a second bit-line-bar conductor extending in the Y-direction,
wherein a first cell size of the first SRAM cells is larger than a second cell size of the second SRAM cells,
wherein each of the first SRAM cells and the second SRAM cells comprises:
a first pull-down (PD) transistor, a second PD transistor, a first pass-gate (PG) transistor, and a second PG transistor arranged in the Y-direction and sharing a first active area; and
a first pull-up (PU) transistor, a second PU transistor, a first isolation structure, and a second isolation structure arranged in the Y-direction and sharing a second active area.

12. The memory device of claim 11, wherein a cell pitch of the first SRAM cells in the X-direction is greater than a cell pitch of the second SRAM cells in the X-direction.

13. The memory device of claim 11, wherein the first isolation structures and the second isolation structures are turned-off transistors.

14. The memory device of claim 11, wherein the first isolation structures and the second isolation structures are dielectric structures.

15. The memory device of claim 11, wherein the first PD transistors, the second PD transistors, the first PG transistors, the second PG transistors, the first PU transistors, and the second PU transistors are FinFET.

16. The memory device of claim 11, wherein the first PD transistors, the second PD transistors, the first PG transistors, the second PG transistors, the first PU transistors, and the second PU transistors are gate-all-around transistors.

17. A memory device, comprising:

a first static random-access memory (SRAM) array having first SRAM cell groups arranged in an X-direction, wherein each of the first SRAM cell groups comprises two adjacent first SRAM cells arranged in the X-direction, and each of the first SRAM cells comprises a first bit-line conductor and a first bit-line-bar conductor extending in a Y-direction;

a second SRAM array having second SRAM cell groups arranged in the X-direction, wherein each of the second SRAM cell groups comprises two adjacent second SRAM cells arranged in the X-direction and sharing a second bit-line conductor and a second bit-line-bar conductor extending in the Y-direction;

a first metal layer over the first SRAM cells and the second SRAM cells, wherein the first metal layer comprises VDD conductors extending in the Y-direction and electrically connected to source/drain features of pull-up transistors of the first SRAM cells and the second SRAM cells;

a second metal layer over the first metal layer, wherein the second metal layer comprises word-line conductors extending in the X-direction and electrically connected to gate structures of pass-gate transistors of the first SRAM cells and the second SRAM cells; and a third metal layer over the second metal layer, wherein the third metal layer comprises the first bit-line conductors, the first bit-line-bar conductors, the second bit-line conductors, and the second bit-line-bar conductors, wherein a first cell size of the first SRAM cells is larger than a second cell size of the second SRAM cells, wherein the VDD conductors are further electrically connected to gate structures of isolation transistors of the first SRAM cells and the second SRAM cells, wherein the isolation transistors are p-type transistors and arranged with the pull-up transistors in the Y-direction.

18. The memory device of claim 17, wherein a width of the second bit-line conductors and the second bit-line-bar conductors in the X-direction is greater than a width of the first bit-line conductors and the first bit-line-bar conductors in the X-direction.

19. The memory device of claim 18, wherein a ratio of the width of the second bit-line conductors and the second bit-line-bar conductors to the width of the first bit-line conductors and the first bit-line-bar conductors is in a range from about 1.05 to about 2.

20. The memory device of claim 17, wherein each of the first SRAM cells comprises a first cell boundary defining the first cell size and each of the second SRAM cells comprises a second cell boundary defining the second cell size, wherein a first dimension of the first cell boundary in the Y-direction is larger than a second dimension of the first cell boundary in the X-direction, wherein a third dimension of the second cell boundary in the Y-direction is larger than a fourth dimension of the second cell boundary in the X-direction.

* * * * *